(12) United States Patent
Bergmann et al.

(10) Patent No.: US 10,991,861 B2
(45) Date of Patent: Apr. 27, 2021

(54) LOW OPTICAL LOSS FLIP CHIP SOLID STATE LIGHTING DEVICE

(71) Applicant: Cree, Inc., Durham, NC (US)

(72) Inventors: Michael John Bergmann, Raleigh, NC (US); Matthew Donofrio, Raleigh, NC (US); Peter Scott Andrews, Durham, NC (US); Colin Blakely, Franklinton, NC (US); Troy Gould, Raleigh, NC (US); Jack Vu, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/280,438

(22) Filed: Sep. 29, 2016

(65) Prior Publication Data

US 2017/0098746 A1 Apr. 6, 2017

Related U.S. Application Data

(60) Provisional application No. 62/235,908, filed on Oct. 1, 2015.

(51) Int. Cl.
*H01L 25/16* (2006.01)
*H01L 33/06* (2010.01)
(Continued)

(52) U.S. Cl.
CPC .............. *H01L 33/60* (2013.01); *H01L 33/06* (2013.01); *H01L 33/10* (2013.01); *H01L 33/20* (2013.01);
(Continued)

(58) Field of Classification Search
CPC ....... H01L 33/60; H01L 33/405; H01L 33/44; H01L 33/382; H01L 33/505;
(Continued)

(56) References Cited

U.S. PATENT DOCUMENTS

| 5,739,554 A | 4/1998 | Edmond et al. |
| 6,657,236 B1 | 12/2003 | Thibeault et al. |

(Continued)

FOREIGN PATENT DOCUMENTS

| CN | 104037277 A | 9/2014 |
| CN | 107452846 A | 12/2017 |

(Continued)

OTHER PUBLICATIONS

International Search Report and Written Opinion for International Patent Application No. PCT/US2016/054372, dated Dec. 19, 2016, 16 pages.

(Continued)

*Primary Examiner* — Steven H Loke
*Assistant Examiner* — Juanita B Rhodes
(74) *Attorney, Agent, or Firm* — Withrow & Terranova, P.L.L.C.; Vincent K. Gustafson

(57) ABSTRACT

Flip chip LEDs incorporate multi-layer reflectors and light transmissive substrates patterned along an internal surface adjacent to semiconductor layers. A multi-layer reflector may include a metal layer and a dielectric layer containing conductive vias. Portions of a multi-layer reflector may wrap around a LED mesa including an active region, while being covered with passivation material. A substrate patterned along an internal surface together with a multi-layer reflector enables reduction of optical losses. A light transmissive fillet material proximate to edge emitting surfaces of an emitter chip may enable adequate coverage with lumiphoric material. An emitter chip may be elevated with increased thickness of solder material and/or contacts, and may reduce luminous flux loss when reflective materials are present on a submount. Methods for coating emitter chips with lumiphoric material include one or more of angled spray coating, (Continued)

fillet formation prior to spray coating, stencil island coating, and releasable tape coating.

33 Claims, 21 Drawing Sheets

(51) Int. Cl.

| | |
|---|---|
| *H01L 33/10* | (2010.01) |
| *H01L 33/20* | (2010.01) |
| *H01L 33/22* | (2010.01) |
| *H01L 33/38* | (2010.01) |
| *H01L 33/40* | (2010.01) |
| *H01L 33/44* | (2010.01) |
| *H01L 33/48* | (2010.01) |
| *H01L 33/50* | (2010.01) |
| *H01L 33/54* | (2010.01) |
| *H01L 33/60* | (2010.01) |
| *H01L 33/62* | (2010.01) |
| *H01L 25/075* | (2006.01) |
| *H01L 33/32* | (2010.01) |

(52) U.S. Cl.
CPC .............. *H01L 33/22* (2013.01); *H01L 33/32* (2013.01); *H01L 33/382* (2013.01); *H01L 33/387* (2013.01); *H01L 33/405* (2013.01); *H01L 33/44* (2013.01); *H01L 33/486* (2013.01); *H01L 33/505* (2013.01); *H01L 33/62* (2013.01); *H01L 25/0753* (2013.01); *H01L 25/167* (2013.01); *H01L 33/54* (2013.01); *H01L 2224/14* (2013.01); *H01L 2224/16225* (2013.01); *H01L 2933/0041* (2013.01)

(58) Field of Classification Search
CPC ....... H01L 33/387; H01L 33/22; H01L 33/06; H01L 33/10; H01L 33/32; H01L 33/486; H01L 33/20; H01L 33/62; H01L 2933/0041; H01L 25/0753; H01L 25/167; H01L 33/54; H01L 2224/14; H01L 2224/16225

See application file for complete search history.

(56) References Cited

U.S. PATENT DOCUMENTS

| | | | |
|---|---|---|---|
| 6,747,298 B2 | 6/2004 | Slater, Jr. et al. | |
| 6,784,462 B2 | 8/2004 | Schubert | |
| 6,791,119 B2 | 9/2004 | Slater, Jr. et al. | |
| 6,821,804 B2 | 11/2004 | Thibeault et al. | |
| 6,888,167 B2 | 5/2005 | Slater, Jr. et al. | |
| 7,211,803 B1 | 5/2007 | Dhurjaty et al. | |
| 7,326,967 B2 | 2/2008 | Hsieh et al. | |
| 7,622,746 B1 | 11/2009 | Lester et al. | |
| 7,829,906 B2 | 11/2010 | Donofrio | |
| 7,880,181 B2 | 2/2011 | Yoon et al. | |
| 7,915,629 B2 | 3/2011 | Li et al. | |
| 8,017,963 B2 | 9/2011 | Donofrio et al. | |
| 8,212,273 B2 | 7/2012 | McKenzie et al. | |
| 8,368,100 B2 | 2/2013 | Donofrio et al. | |
| 8,471,280 B2 | 6/2013 | Aldaz et al. | |
| D691,973 S | 10/2013 | Donofrio et al. | |
| 8,575,633 B2 | 11/2013 | Donofrio et al. | |
| 8,643,039 B2 | 2/2014 | Donofrio et al. | |
| 8,680,556 B2 | 3/2014 | Ibbetson et al. | |
| 8,710,536 B2 | 4/2014 | Ibbetson et al. | |
| 8,866,169 B2 | 10/2014 | Emerson et al. | |
| 8,940,561 B2 | 1/2015 | Donofrio et al. | |
| 9,000,470 B2 | 4/2015 | Tudorica et al. | |
| 9,070,850 B2 | 6/2015 | Keller et al. | |
| 9,362,459 B2 | 6/2016 | Heikman et al. | |
| 9,412,907 B1 | 8/2016 | Place et al. | |
| 9,461,201 B2 | 10/2016 | Heikman et al. | |
| 9,887,327 B2 | 2/2018 | Reiherzer et al. | |
| 10,236,414 B2 | 3/2019 | Lee et al. | |
| 2003/0025212 A1* | 2/2003 | Bhat | H01L 33/20 257/780 |
| 2003/0230754 A1 | 12/2003 | Steigerwald et al. | |
| 2005/0255619 A1 | 11/2005 | Negro et al. | |
| 2005/0274956 A1 | 12/2005 | Bhat | |
| 2008/0179611 A1 | 7/2008 | Chitnis et al. | |
| 2008/0246047 A1 | 10/2008 | Hsu et al. | |
| 2009/0146165 A1 | 6/2009 | Hasnain et al. | |
| 2009/0283787 A1* | 11/2009 | Donofrio | H01L 33/62 257/98 |
| 2010/0140635 A1 | 6/2010 | Ibbetson et al. | |
| 2011/0305021 A1 | 12/2011 | Xin | |
| 2012/0049219 A1* | 3/2012 | Kamiya | H01L 33/46 257/98 |
| 2012/0049756 A1 | 3/2012 | Schubert | |
| 2012/0074441 A1* | 3/2012 | Seo | H01L 33/46 257/91 |
| 2012/0193660 A1 | 8/2012 | Donofrio et al. | |
| 2012/0193662 A1 | 8/2012 | Donofrio et al. | |
| 2012/0326159 A1* | 12/2012 | Bergmann | H01L 33/32 257/76 |
| 2013/0058102 A1 | 3/2013 | Lin | |
| 2013/0141920 A1 | 6/2013 | Emerson et al. | |
| 2013/0264592 A1 | 10/2013 | Bergmann et al. | |
| 2013/0328096 A1 | 12/2013 | Donofrio et al. | |
| 2013/0341634 A1* | 12/2013 | Heikman | H01L 33/46 257/76 |
| 2014/0070245 A1* | 3/2014 | Haberern | H01L 33/08 257/93 |
| 2014/0203320 A1 | 7/2014 | Ibbetson et al. | |
| 2015/0140710 A1 | 5/2015 | McLaurin et al. | |
| 2015/0179879 A1 | 6/2015 | Yang et al. | |
| 2015/0179903 A1 | 6/2015 | Pun et al. | |
| 2015/0295138 A1* | 10/2015 | Chae | H01L 33/46 257/98 |
| 2015/0380621 A1* | 12/2015 | Chae | H01L 33/46 257/93 |
| 2016/0155901 A1 | 6/2016 | Lopez et al. | |
| 2016/0211420 A1 | 7/2016 | Donofrio et al. | |
| 2016/0260869 A1 | 9/2016 | Jeon et al. | |
| 2017/0012175 A1* | 1/2017 | Wang | H01L 33/32 |
| 2017/0084787 A1* | 3/2017 | Emura | H01L 33/387 |
| 2017/0108173 A1 | 4/2017 | Kim et al. | |
| 2017/0149211 A1 | 5/2017 | Jeong et al. | |
| 2017/0210277 A1 | 7/2017 | Harada et al. | |
| 2017/0294417 A1 | 10/2017 | Edmond et al. | |
| 2017/0294418 A1 | 10/2017 | Edmond et al. | |
| 2017/0331009 A1 | 11/2017 | Shioji | |
| 2018/0114878 A1 | 4/2018 | Danesh et al. | |
| 2018/0254386 A1 | 9/2018 | Perzlmaier et al. | |
| 2019/0051805 A1 | 2/2019 | Oh et al. | |
| 2019/0237630 A1 | 8/2019 | Check | |

FOREIGN PATENT DOCUMENTS

| | | |
|---|---|---|
| CN | 107546303 A | 1/2018 |
| WO | 2012086483 A1 | 6/2012 |

OTHER PUBLICATIONS

Palik, E. D., ed., "Handbook of Optical Constants of Solids: Volume One," Academic Press, 1985, 785 pages.

International Preliminary Report on Patentability for International Patent Application No. PCT/US2016/054372, dated Apr. 3, 2018, 9 pages.

Zhao, S. et al., "Enhanced luminous efficiency of phosphor-converted LEDs by using back reflector to increase reflectivity for yellow light," Applied Optics, vol. 53, No. 34, Dec. 1, 2014, Optical Society of America, pp. 8104-8110.

Zhao, Y.S. et al., "Efficiency Enhancement of InGaN/GaN Light-Emitting Diodes with a Back-Surface Distributed Bragg Reflector," Journal of Electronic Materials, vol. 32, No. 12, 2003, Springer-Verlag, pp. 1523-1526.

(56) References Cited

OTHER PUBLICATIONS

Examination Report for European Patent Application No. 16778642.5, dated Apr. 26, 2019, 5 pages.
International Search Report and Written Opinion for International Patent Application No. PCT/US2019/015418, dated May 14, 2019, 19 pages.
Non-Final Office Action for U.S. Appl. No. 15/882,103, dated Aug. 20, 2019, 16 pages.
Notification of First Office Action for Chinese Patent Application No. 201680070374.8, dated Feb. 6, 2020, 13 pages.
Intention to Grant for European Patent Application No. 16778642.5, dated Feb. 27, 2020, 93 pages.
Final Office Action for U.S. Appl. No. 15/882,103, dated Feb. 6, 2020, 23 pages.
Advisory Action, Examiner-Initiated Interview Summary, and AFCP 2.0 Decision for U.S. Appl. No. 15/882,103, dated Mar. 16, 2020, 7 pages.
Non-Final Office Action for U.S. Appl. No. 16/222,173, dated Feb. 14, 2020, 13 pages.
International Search Report and Written Opinion for International Patent Application No. PCT/US2019/059331, dated Jan. 27, 2020, 19 pages.
Final Office Action for U.S. Appl. No. 16/357,949, dated Sep. 30, 2020, 9 pages.
Notification of the Second Office Action for Chinese Patent Application No. 201680070374.8, dated Sep. 25, 2020, 15 pages.
Non-Final Office Action for U.S. Appl. No. 15/882,103, dated Jun. 15, 2020, 14 pages.
Non-Final Office Action for U.S. Appl. No. 15/882,103, dated Jun. 17, 2020, 14 pages.
Notice of Allowance for U.S. Appl. No. 16/222,173, dated May 29, 2020, 10 pages.
Non-Final Office Action for U.S. Appl. No. 16/357,949, dated Jun. 10, 2020, 10 pages.
International Preliminary Report on Patentability for International Patent Application No. PCT/US2019/015418, dated Aug. 13, 2020, 12 pages.
Author Unknown, "Cree® XLamp® XB-D and XT-E LED Optical Design Considerations," Application Note, CLD-AP104 Rev 0B, www.cree.com/Xlamp, 2014, Cree, Inc., pp. 1-15.
Carey, Julian, "New LED architectures and phosphor technologies lower costs and boost quality," (Magazine), LED Design & Manufacturing, vol. 11, Issue 7, Sep. 4, 2014, Tulsa, OK, PennWell Corporation, pp. 1-16.
Kim, Jong Kyu et al., "GaInN light-emitting diodes with $RuO_2$/$SiO_2$/Ag omni-directional reflector," Applied Physics Letters, vol. 84, Issue 22, May 31, 2004, American Institute of Physics, pp. 4508-4510.
Wright, Maury, "Strategies in Light to span SSL technology and business domains," (Magazine), SSL Design, vol. 12, Issue 2, Feb. 16, 2015, Tulsa, OK, PennWell Corporation, pp. 1-22.
Ex-Parte Quayle Action for U.S. Appl. No. 15/882,103, dated Dec. 11, 2020, 6 pages.
Non-Final Office Action for U.S. Appl. No. 16/542,458, dated Nov. 23, 2020, 9 pages.
Notice of Allowance for U.S. Appl. No. 15/882,103, dated Feb. 18, 2021, 9 pages.
Notice of Allowance for U.S. Appl. No. 16/357,949, dated Dec. 24, 2020, 8 pages.

\* cited by examiner

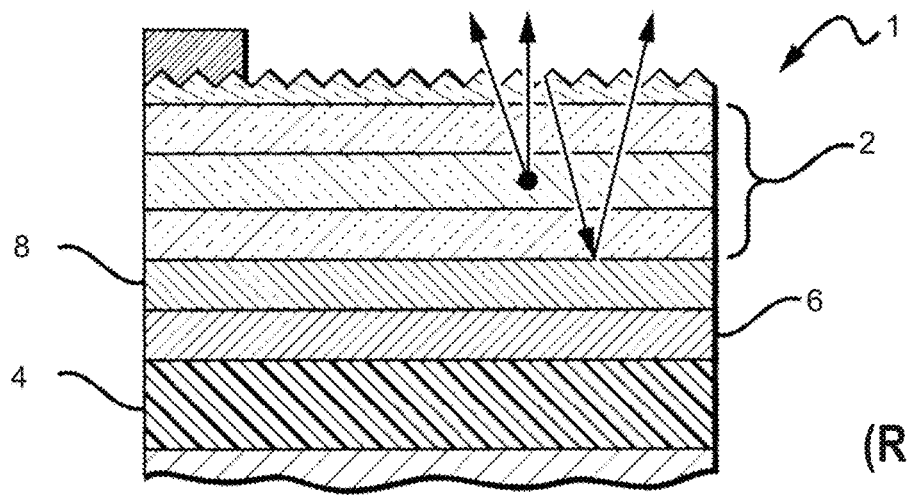
FIG._1
(RELATED ART)
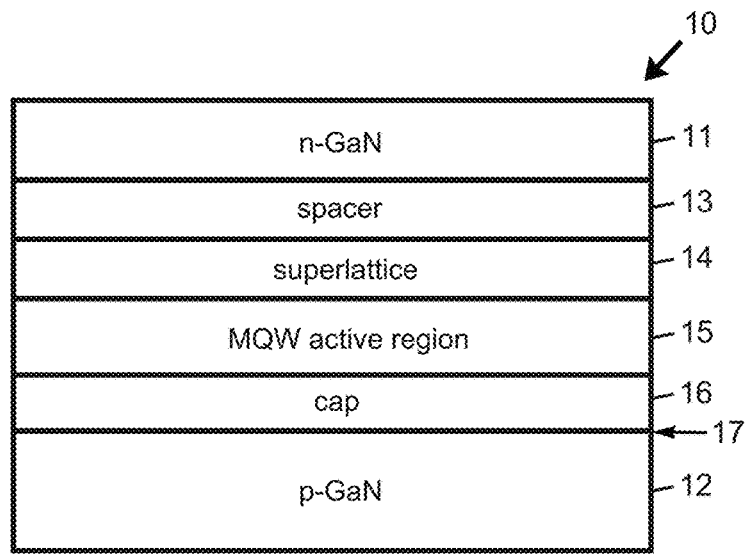
FIG._2A
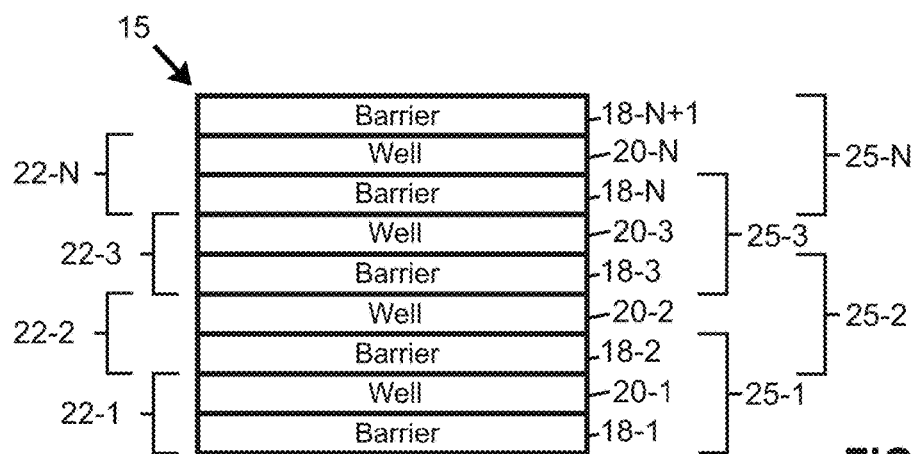
FIG._2B

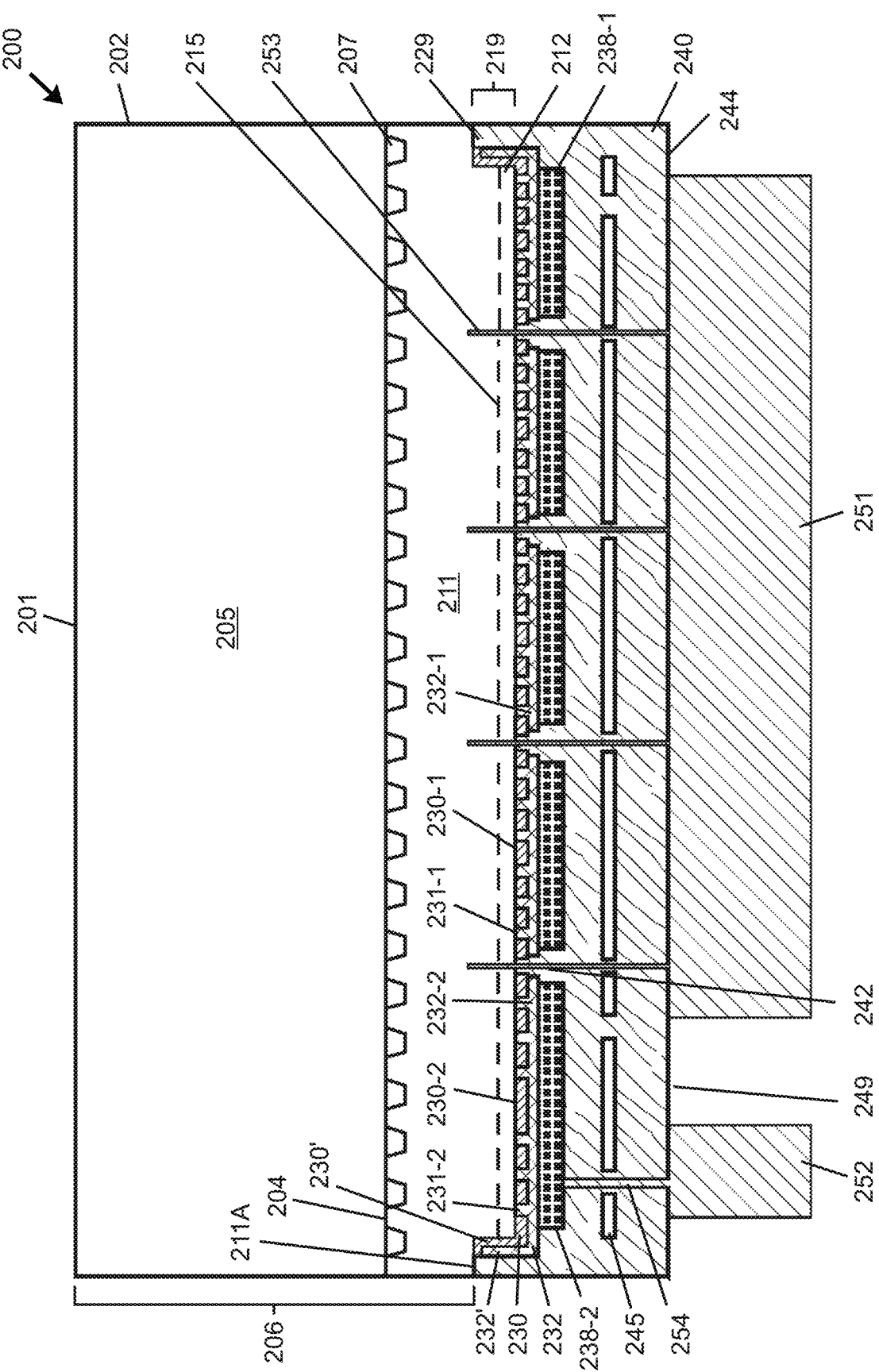
FIG._4A

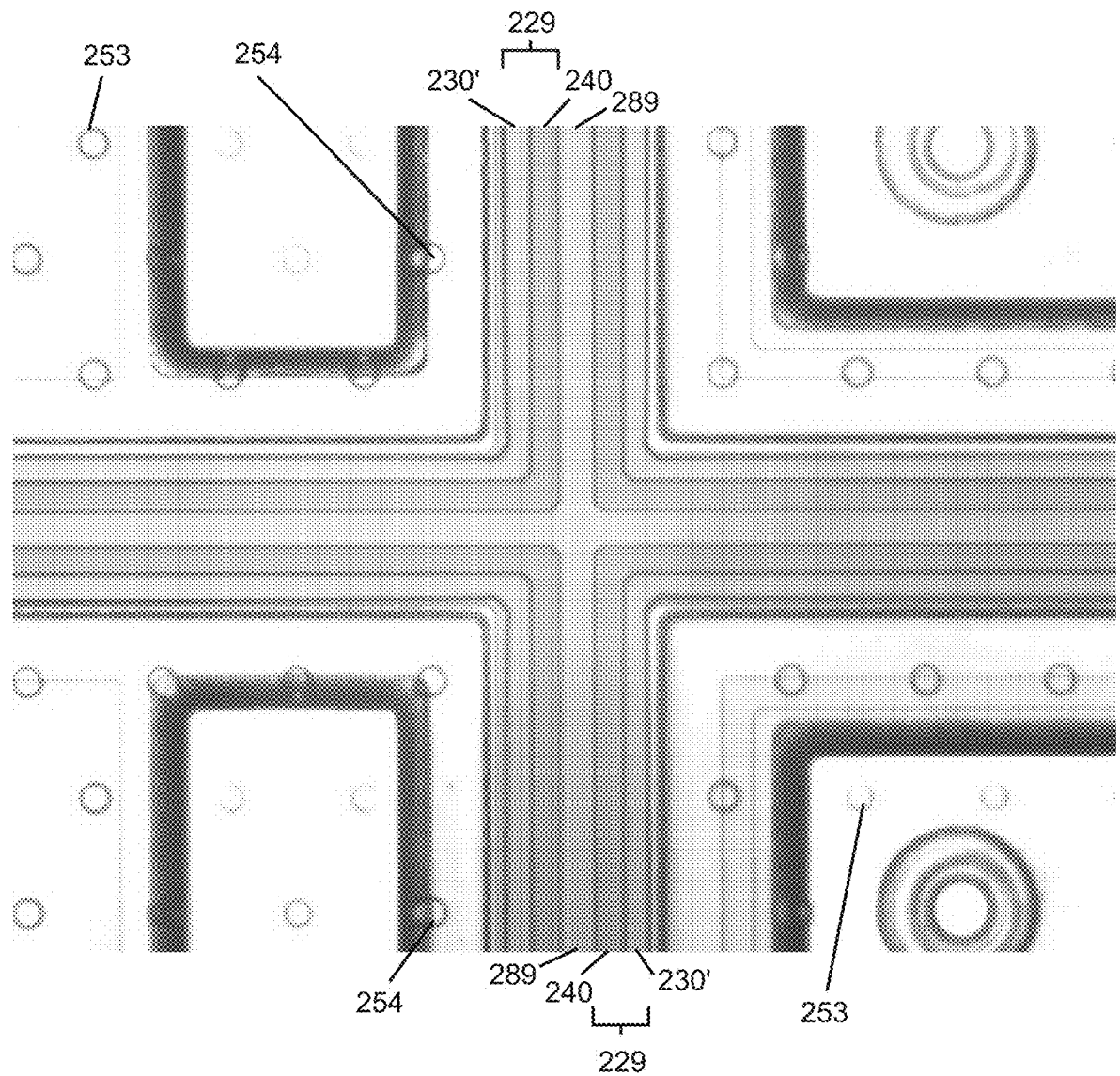
FIG._5

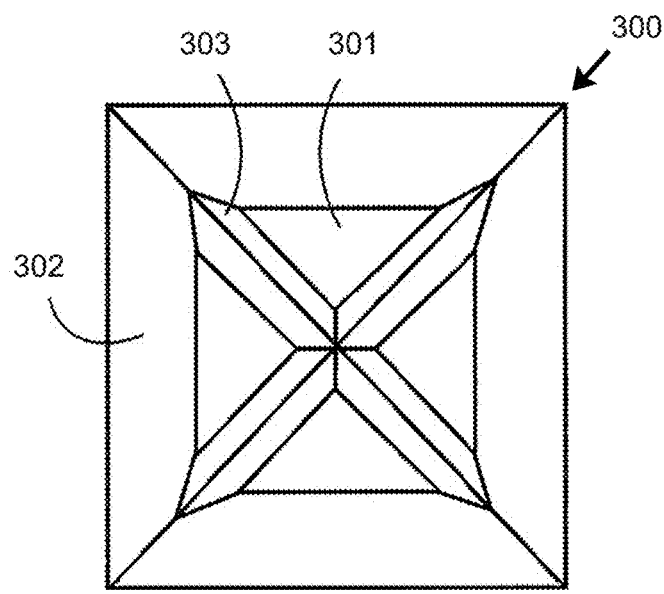
FIG._6A
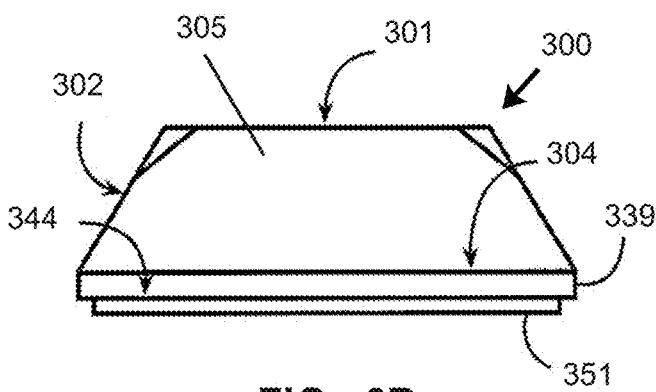
FIG._6B
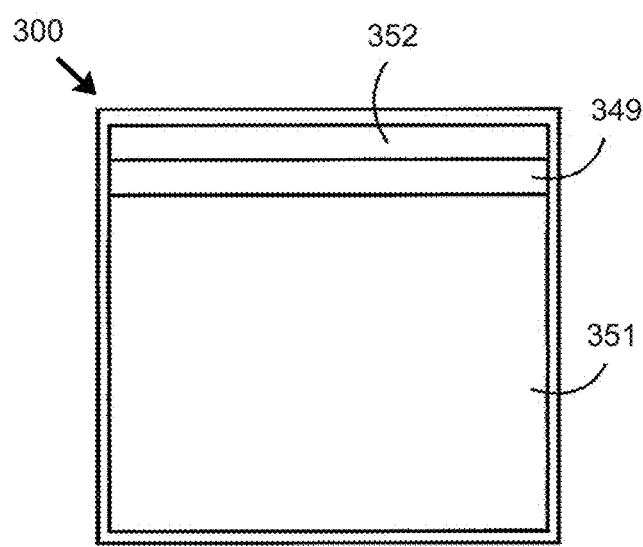
FIG._6C

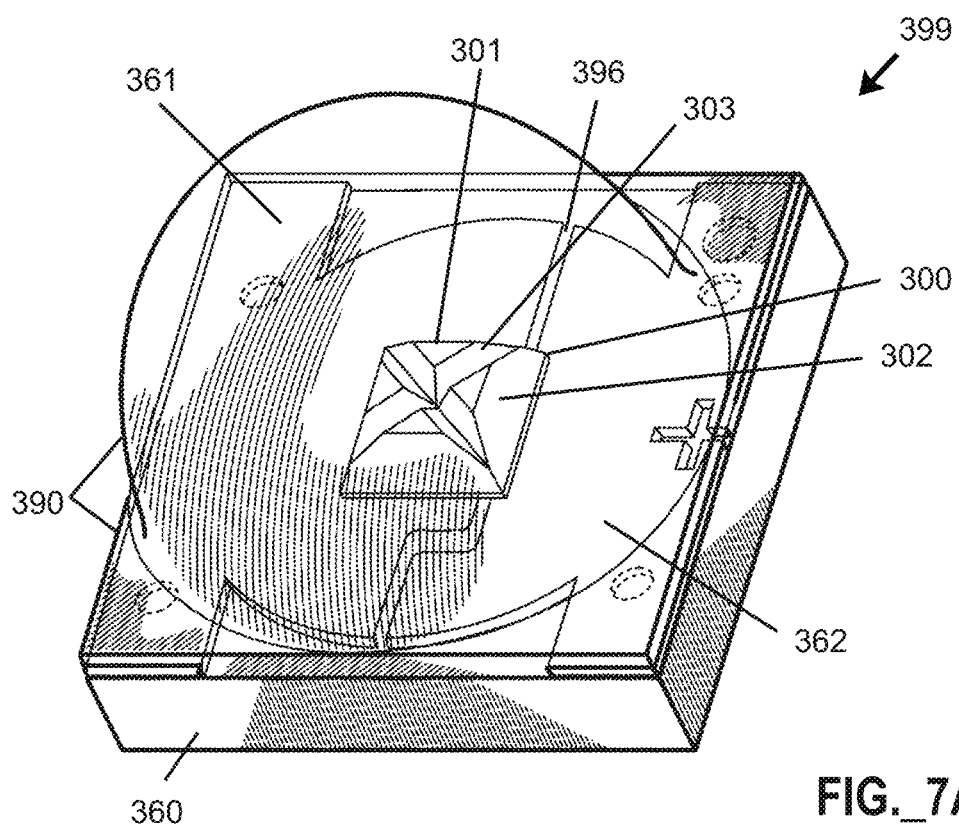
FIG._7A
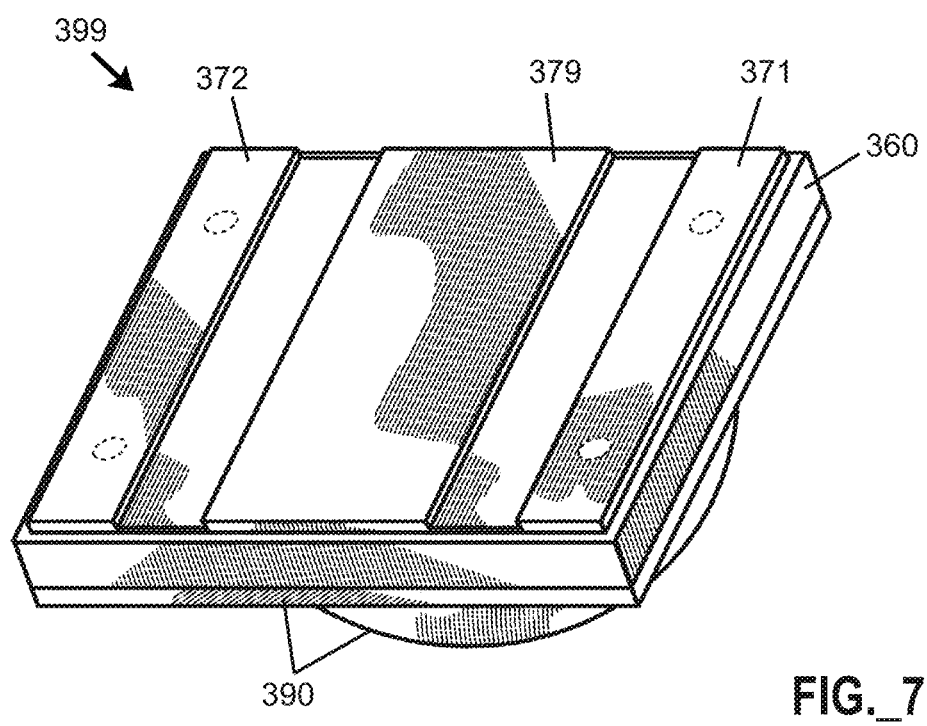
FIG._7B

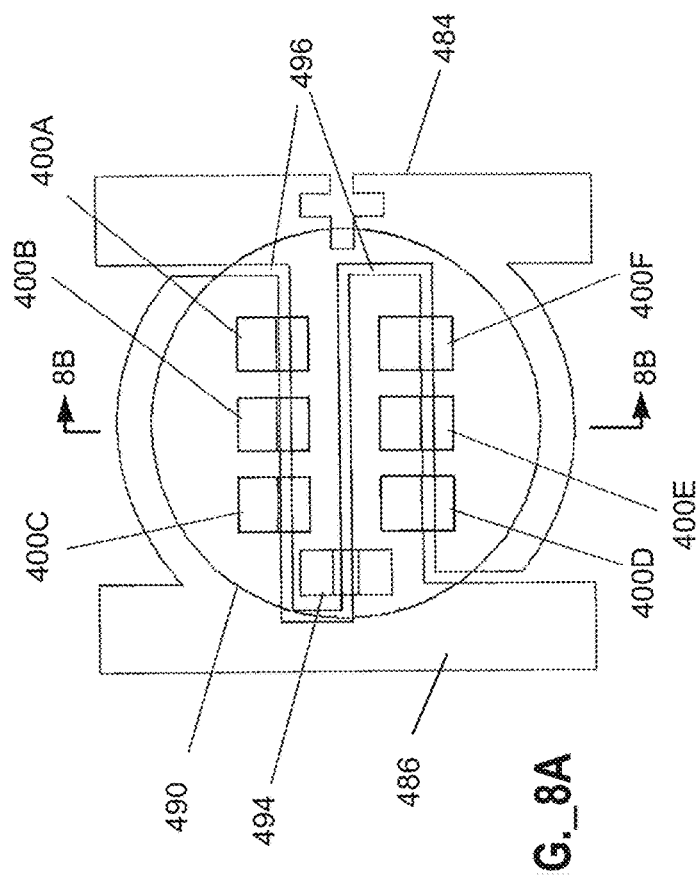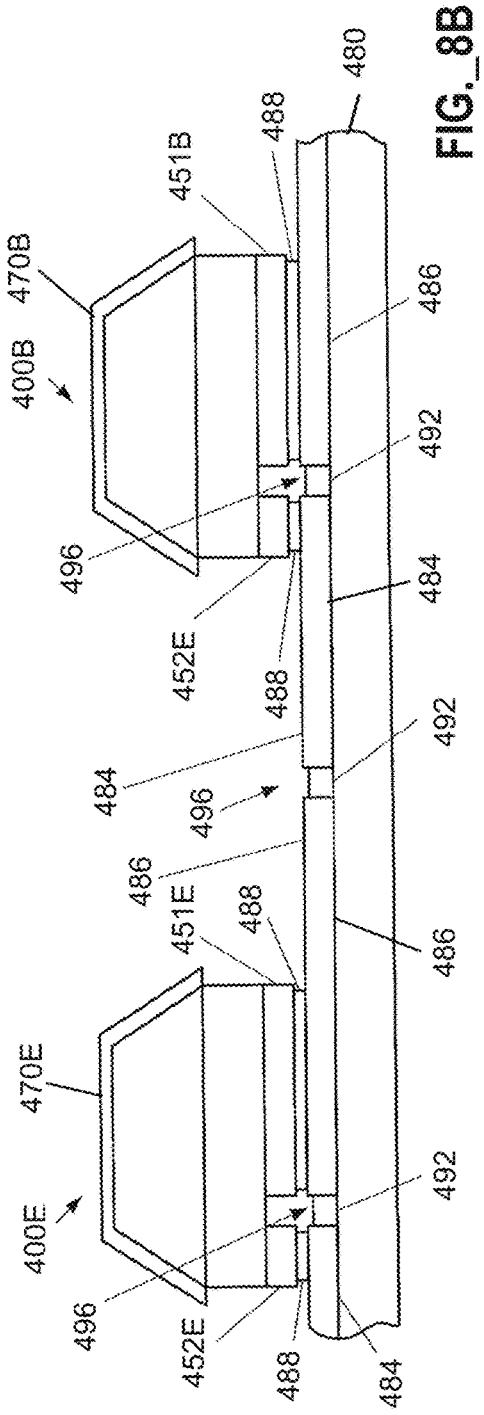
FIG._8A
FIG._8B

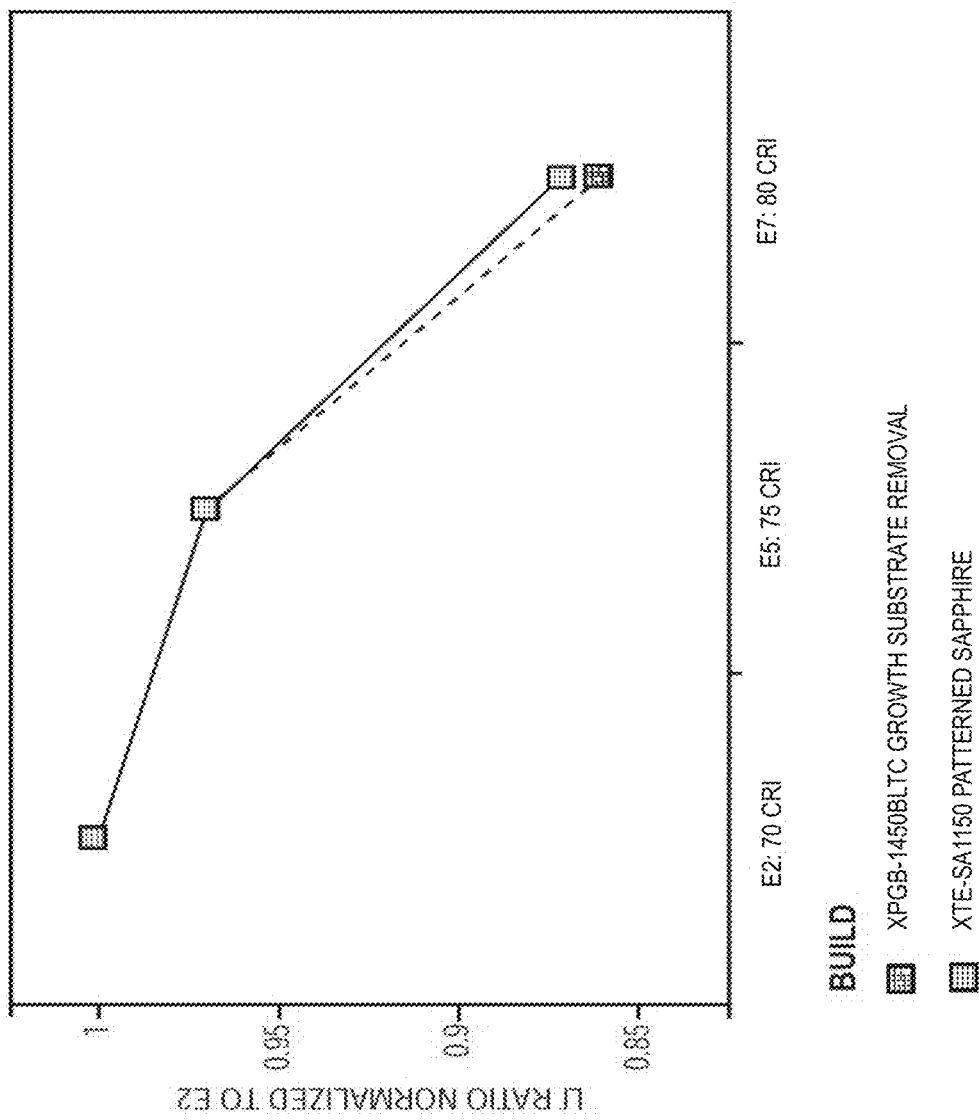
FIG._10
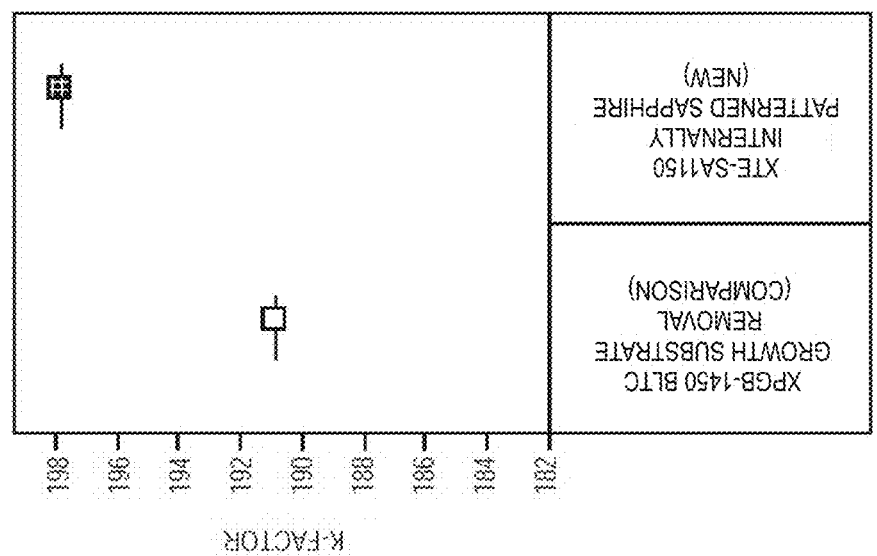
FIG._9

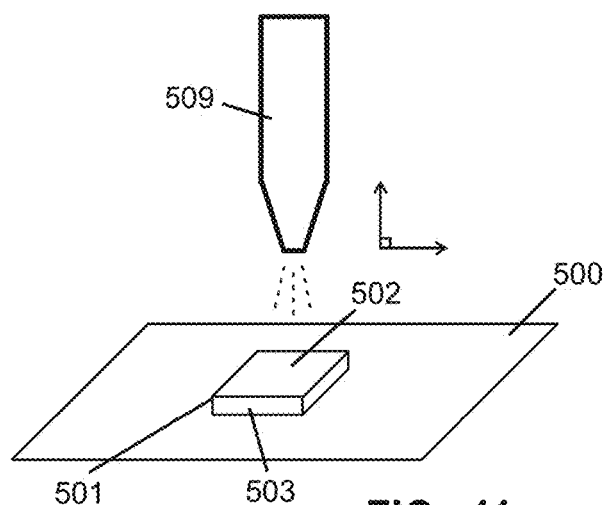
FIG._11
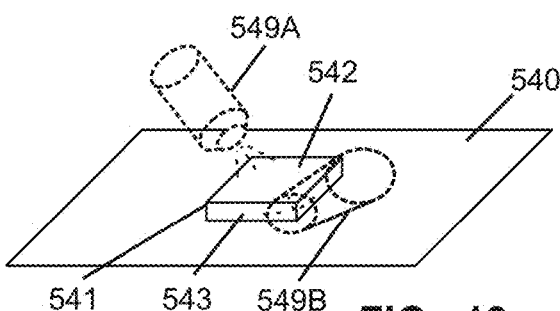
FIG._13
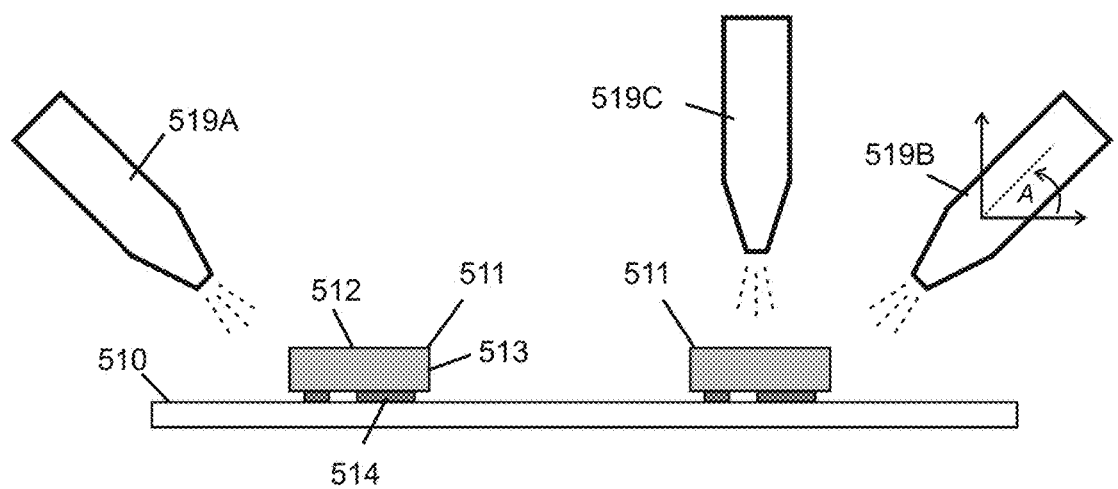
FIG._12A
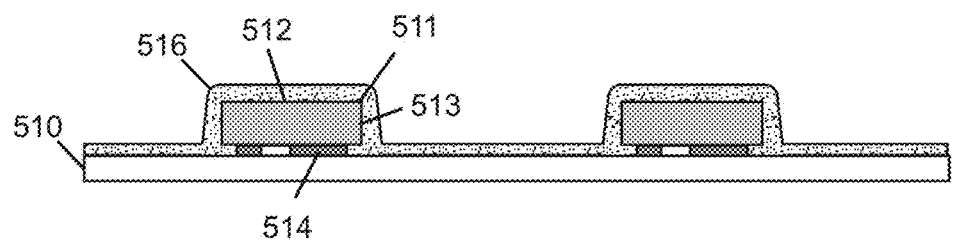
FIG._12B

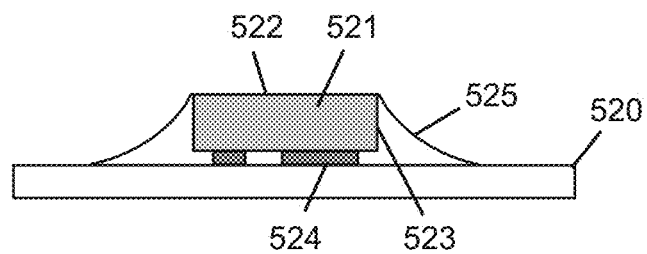
FIG._14A
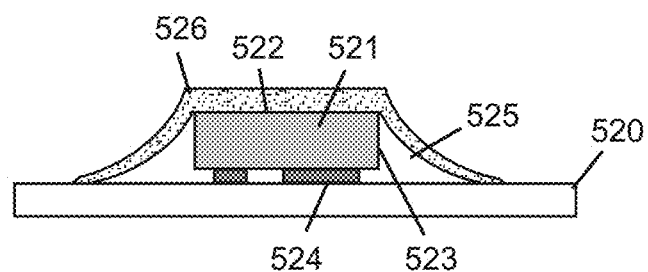
FIG._14B
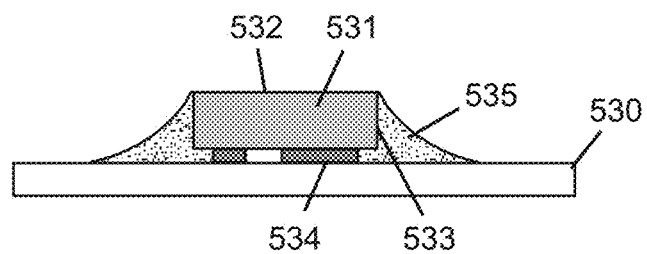
FIG._15A
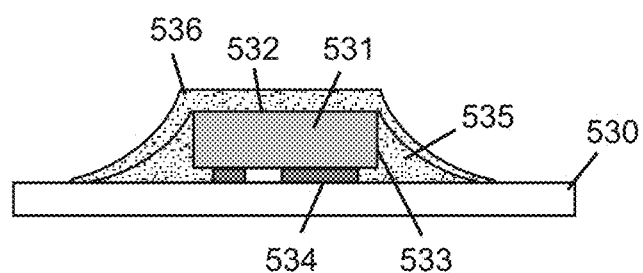
FIG._15B

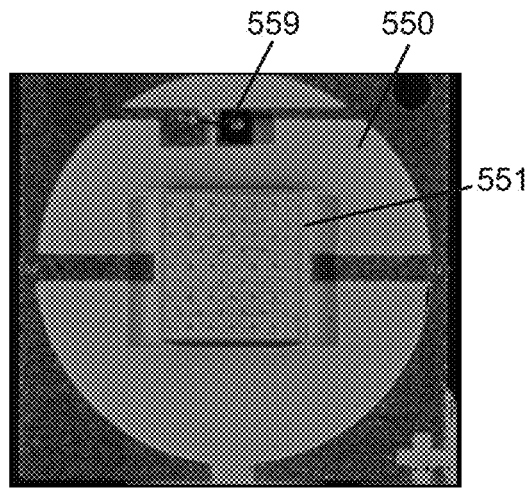
FIG._16A
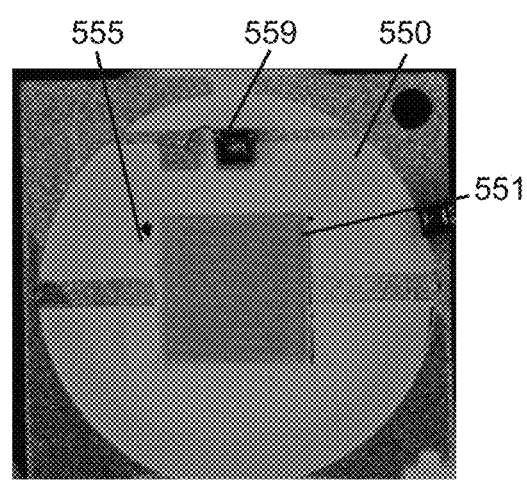
FIG._16B
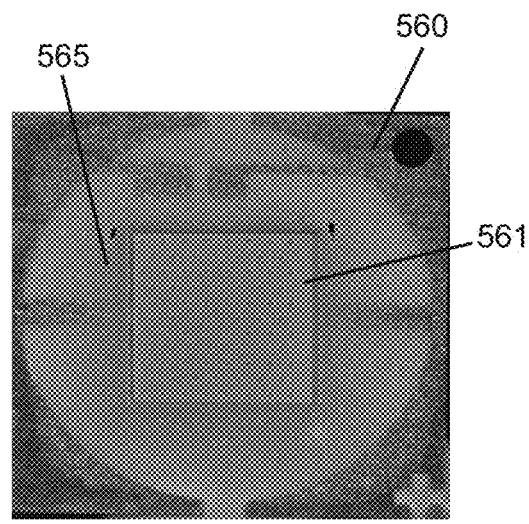
FIG._17A
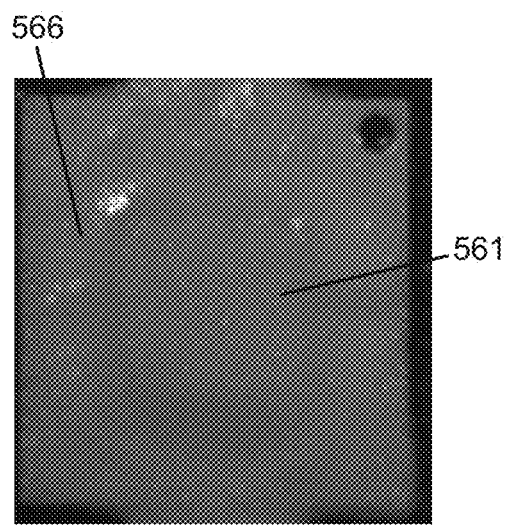
FIG._17B

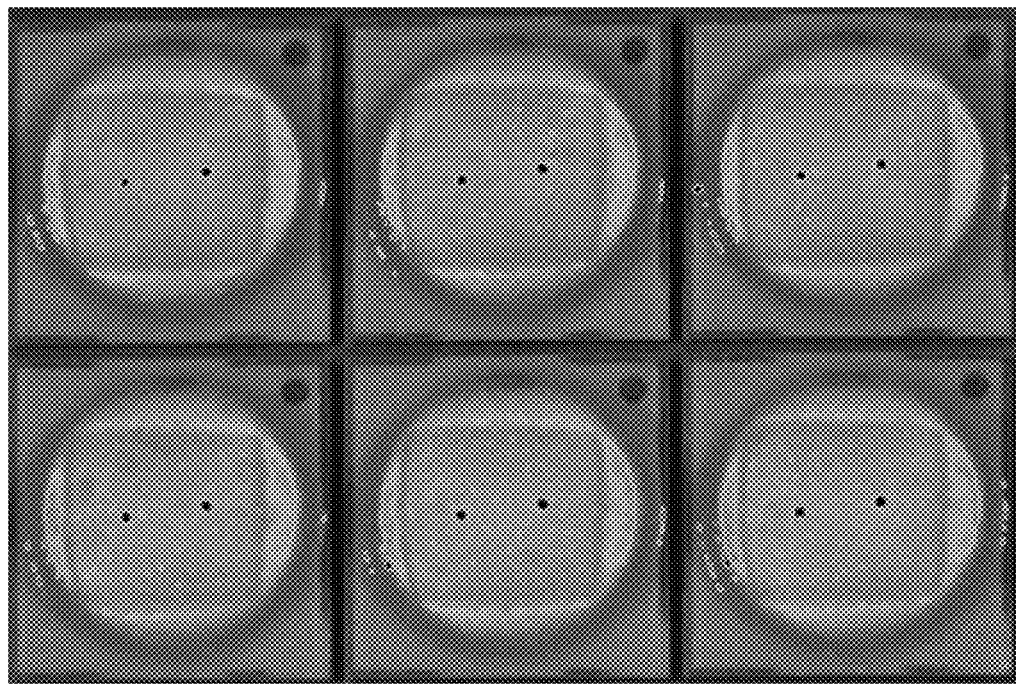
FIG._18
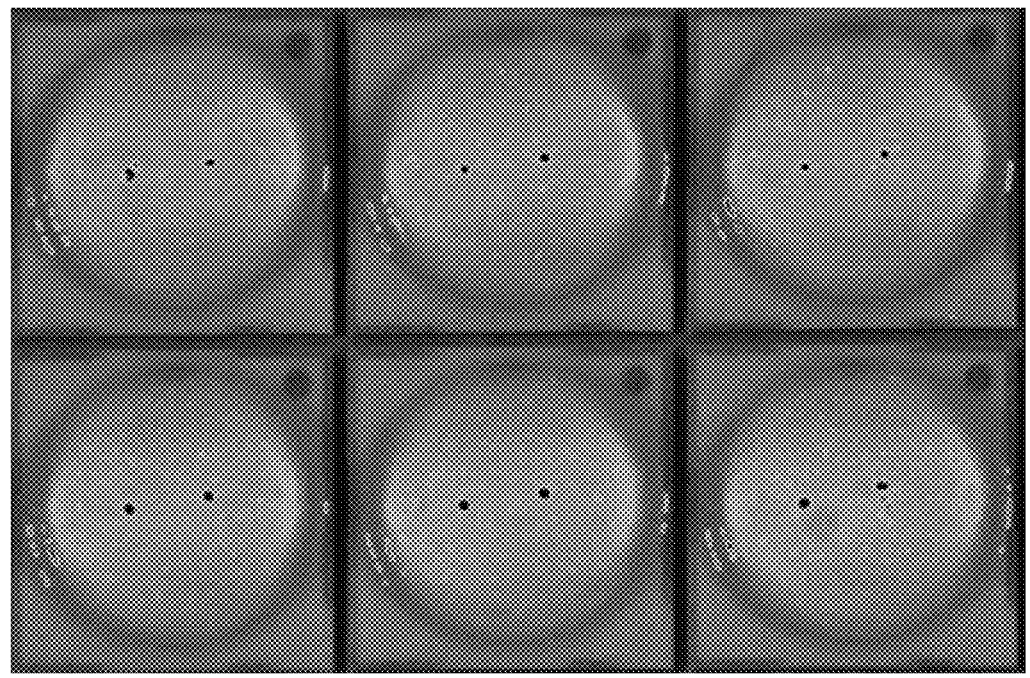
FIG._19

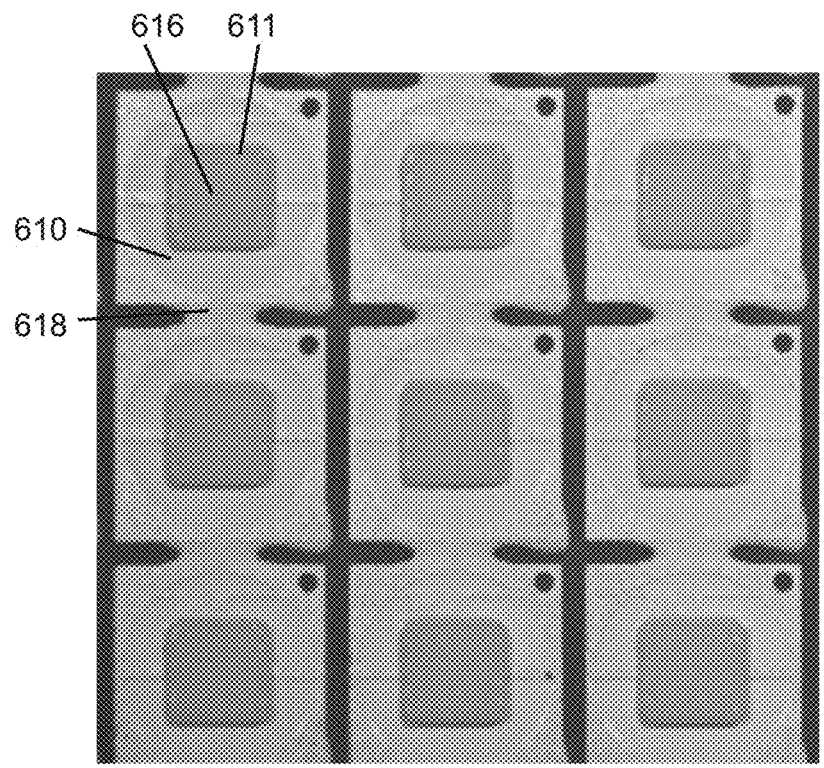
FIG._21A
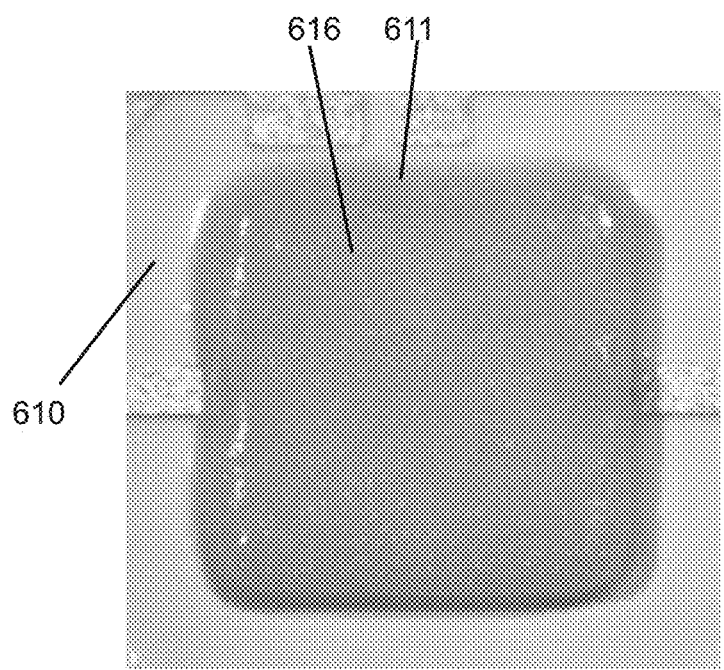
FIG._21B

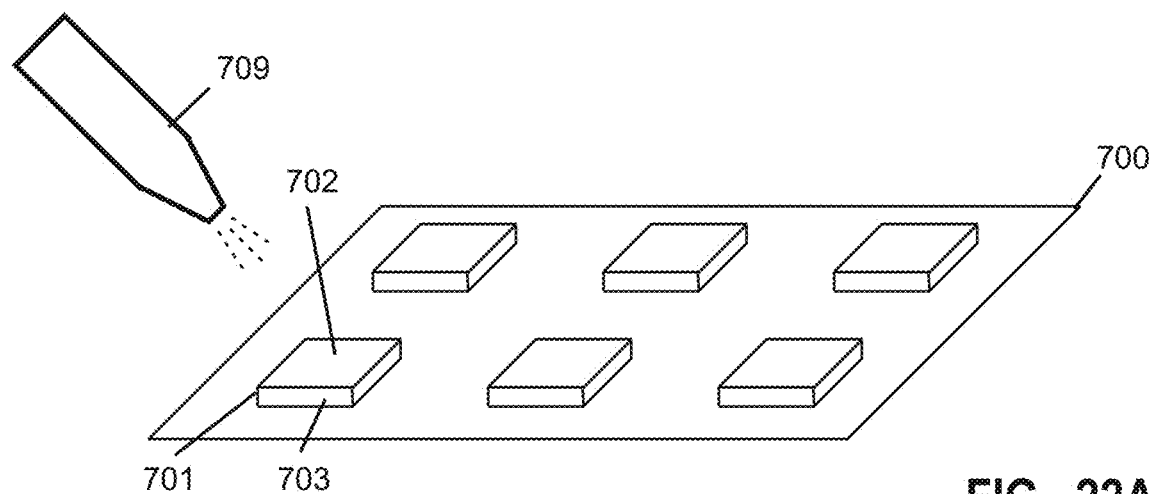
FIG._22A
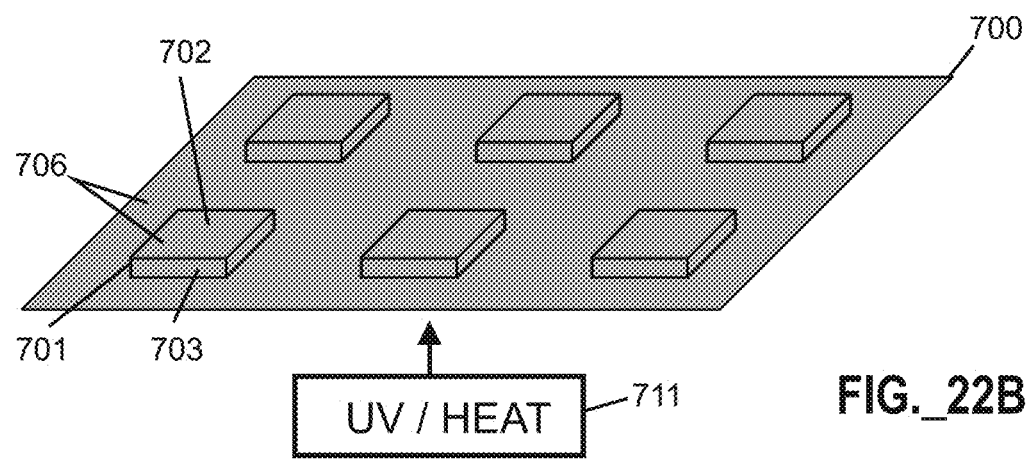
FIG._22B
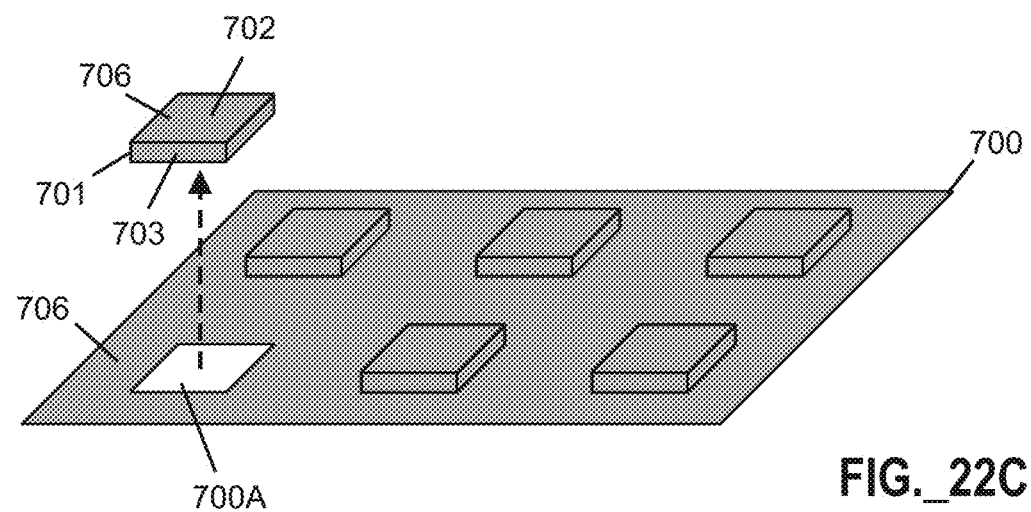
FIG._22C

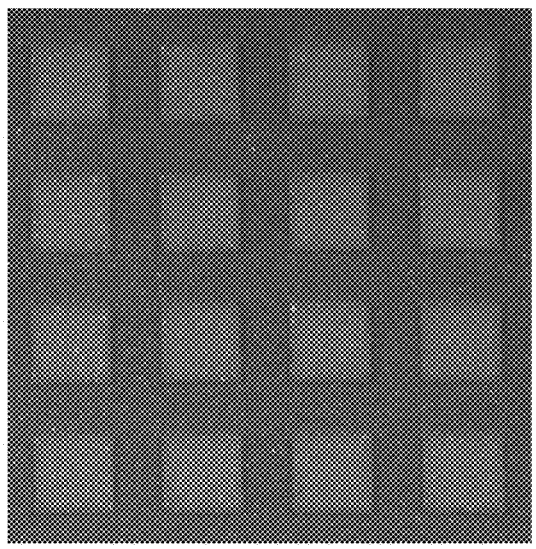
FIG._23A
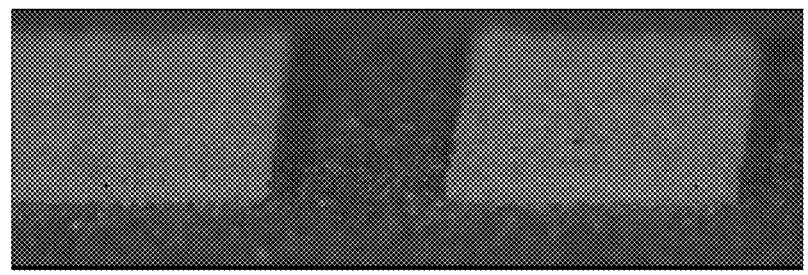
FIG._23B
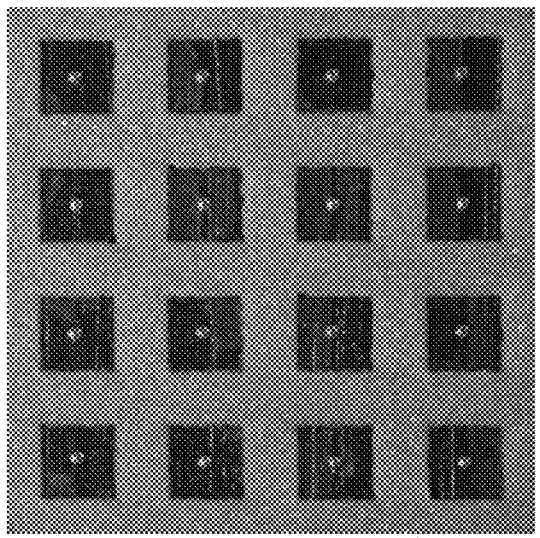
FIG._23C
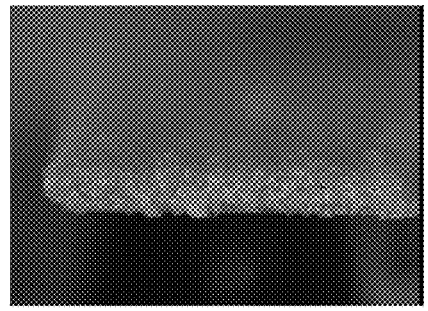
FIG._23D

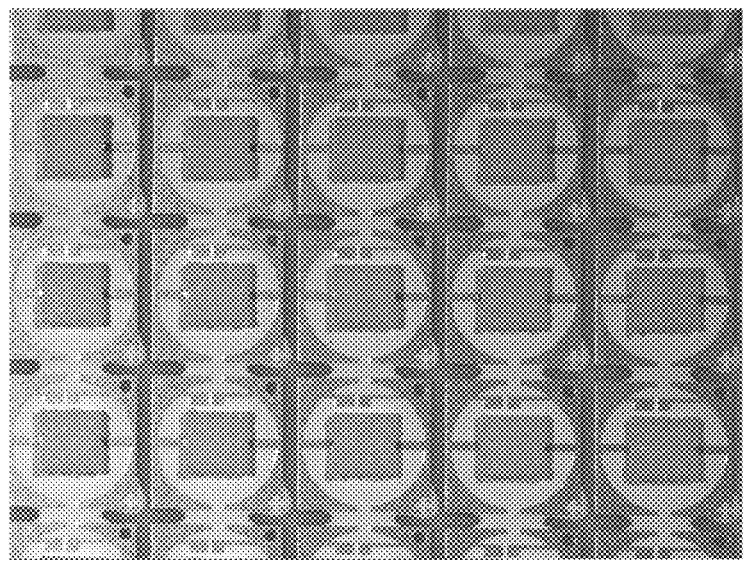
FIG._24A
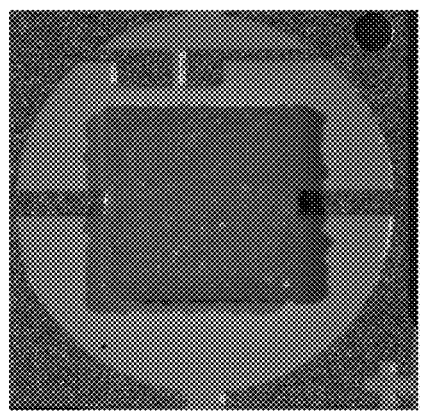
FIG._24B
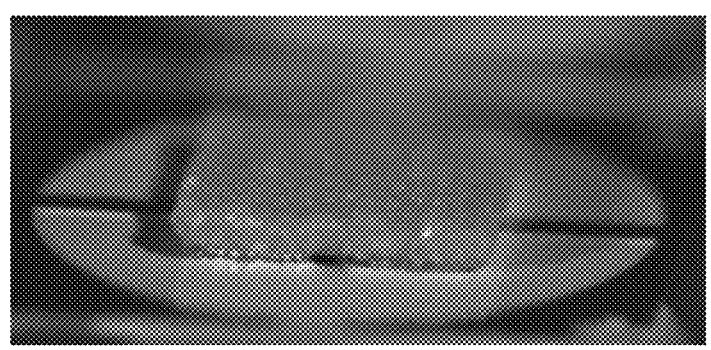
FIG._24C
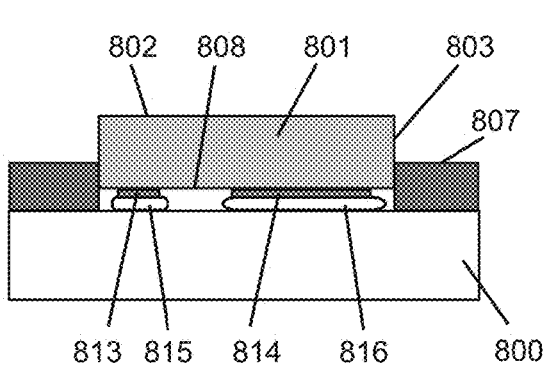
FIG._25A
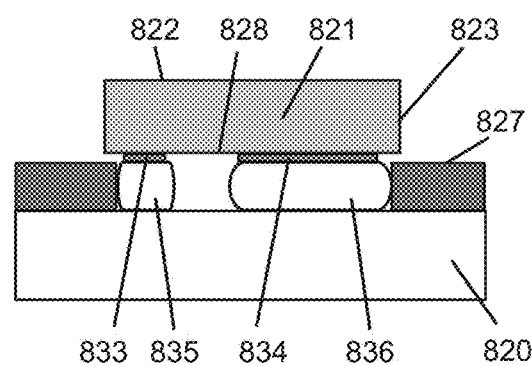
FIG._25B

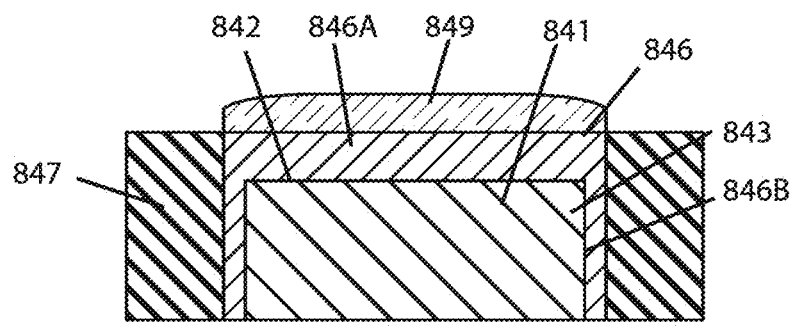
FIG._26
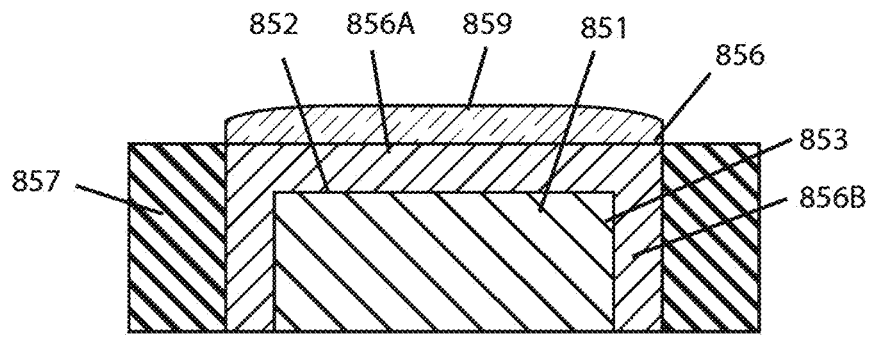
FIG._27
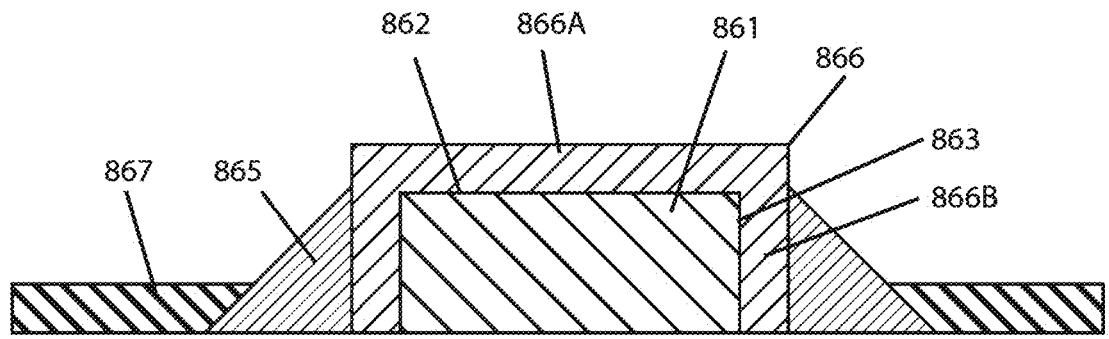
FIG._28
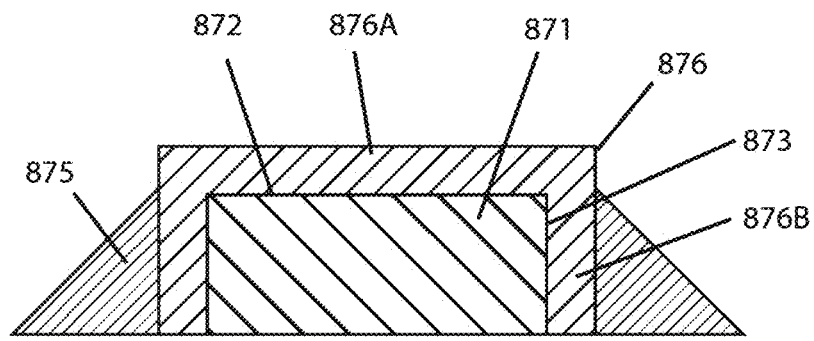
FIG._29

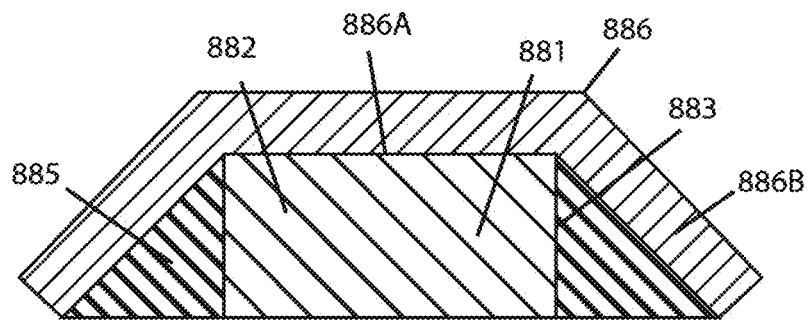
FIG._30
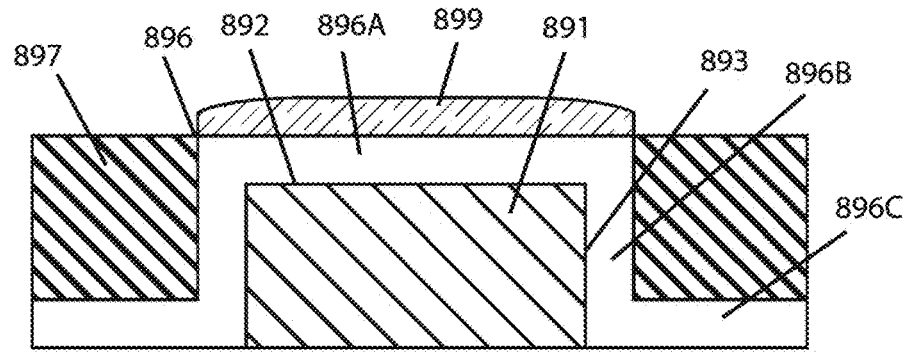
FIG._31
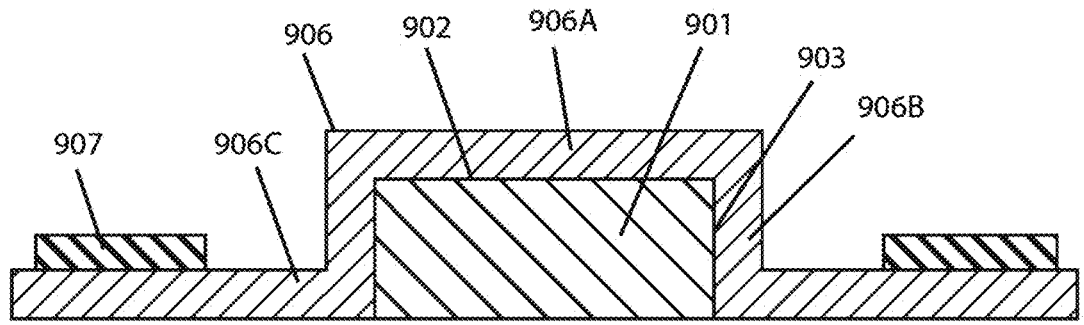
FIG._32
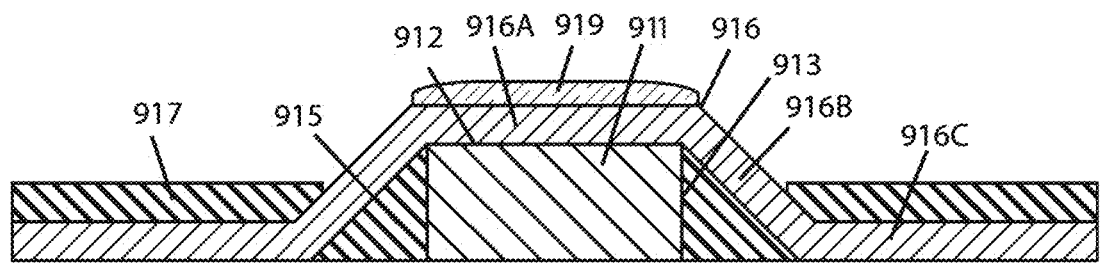
FIG._33

LOW OPTICAL LOSS FLIP CHIP SOLID STATE LIGHTING DEVICE

CROSS-REFERENCE TO RELATED APPLICATION(S)

This application claims priority to U.S. Provisional Patent Application No. 62/235,908 filed on Oct. 1, 2015, with the entire content of the foregoing provisional patent application being hereby incorporated by reference as if fully set forth herein.

TECHNICAL FIELD

The present disclosure is related to solid state lighting devices including light emitting diodes, including embodiments directed to solid state light emitting devices having high reflectivity mirrors, as well as embodiments incorporating lumiphoric materials.

BACKGROUND

Solid state emitters such as light emitting diodes (LEDs) are increasingly used in both consumer and commercial applications. Advancements in LED technology have resulted in highly efficient and mechanically robust light sources with a long service life. Accordingly, modern LEDs have enabled a variety of new display applications, and are being increasingly utilized for general illumination applications, often replacing incandescent and fluorescent light sources.

LEDs are solid state devices that convert electrical energy to light, and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of a LED can be limited by a number of factors, including internal reflection. According to the well-understood implications of Snell's law, photons reaching the surface (interface) between a LED surface and the surrounding environment will be either refracted or internally reflected. If photons are internally reflected in a repeated manner, then such photons will eventually be absorbed and never provide visible light that exits a LED.

In order to increase the opportunity for photons to exit a LED—particularly flip chip devices in which a transparent substrate represents the exposed light emitting surface—it has been found useful to pattern, roughen, or otherwise texture the transparent substrate to provide a varying surface that increases the probability of refraction over internal reflection, and thus enhances light extraction. Exemplary (but not limiting) techniques and structures for providing surface features on external surfaces of LEDs are set forth in the following commonly assigned U.S. patents, which are hereby incorporated by reference herein: U.S. Pat. Nos. 7,829,906; 7,211,803; 6,888,167; 6,821,804; 6,791,119; 6,747,298; and 6,657,236. Despite the availability of such methods, their practical employment has been limited in at least certain contexts. For example, mechanical methods may introduce stress in or cause breakage of wafer material, and may also be limited in terms of the position in a fabrication sequence in which they can be employed. Chemical (e.g., photolithographic etching) methods may also be limited in terms of their position in a fabrication sequence to avoid misalignment or microfeature damage during subsequent LED chip fabrication and/or to avoid chemical incompatibility with LED chip layers if etching is performed after chip fabrication.

Another way to increase light extraction efficiency is to provide reflective surfaces that reflect generated light so that such light may contribute to useful emission from a LED chip. LEDs have been developed with internal reflective surfaces or layers to reflect generated light. FIG. 1 is a cross-sectional schematic view of a LED chip 1 with a LED 2 mounted on a submount 4 by a metal bond layer 6. The LED 2 further comprises a p-contact/reflector 8 between the LED 2 and the metal bond layer 6, with the reflector 8 typically including a metal such as silver (Ag). This arrangement is utilized in commercially available LEDs such Cree® LEDs available from Cree. Inc., according to the EZBright® family of LEDs. The reflector 8 is integral to the LED chip 1 and can cause light emitted from the LED chip's active region toward the submount 4 to be reflected back toward a primary emitting surface. The reflector 8 also reflects TIR light toward the primary emitting surface, which is externally textured. Some light may be absorbed by the reflector 8 due to reflectivity values of less than 100% for various reflector surfaces. Some metals can have less than 95% reflectivity in wavelength ranges of interest.

Additional LED chips have been developed with internal reflectors that include structures permitting electrical signals to be passed through such reflectors. Such structures can include various combinations of conductive features (e.g., layers and/or vias) and insulating features (e.g., dielectric and/or passivation layers).

In certain applications requiring phosphors or other lumiphoric materials to be added to solid state lighting devices (e.g., including flip chips), it can be challenging to achieve one or more of the following goals: ensuring adequate coverage of edge emitting chip surfaces and edge boundaries (thereby avoiding leakage of unconverted emissions); avoiding undesirable far field light characteristics; and reducing luminous flux loss when diffusely reflective materials are coated on submounts around emitter chips.

The art continues to seek improved light emitting diodes and solid state lighting devices (including flip chips) having reduced optical losses and providing desirable illumination characteristics capable of overcoming challenges associated with conventional lighting devices. The art also continues to seek improved light emitting devices and methods capable of overcoming challenges associated with adding phosphors or lumiphoric materials to solid state lighting devices, including devices comprising one or more flip chips.

SUMMARY

The present disclosure is related to solid state lighting devices including light emitting diodes, and in certain aspects to devices including low optical loss flip chip LEDs incorporating multi-layer reflectors and incorporating light transmissive substrates patterned along an internal surface adjacent to semiconductor layers. Presence of a light-transmissive substrate patterned along an internal surface and a multi-layer reflector permits reduction of optical losses in flip chip LEDs, in combination with reduced fabrication cost and fabrication steps. In additional aspects, the present disclosure relates to methods for producing lumiphor-converted solid state light emitting devices in which surfaces of one or more emitter chips are coated with lumiphoric material. In still further aspects, the present disclosure relates to a solid state light emitting device including an elevated emitter chip and/or a light transmissive fillet material proximate to edge emitting surfaces of an emitter chip, such as may be useful for ensuring adequate lumiphoric material coverage of edge emitting surfaces and/or for reducing luminous flux loss when diffusively reflective materials are present proximate to the emitter chip.

In one aspect, a light emitting device comprises a flip chip light emitting diode (LED) that includes a light-transmissive substrate, a plurality of semiconductor layers, a multi-layer reflector, and a passivation layer. The light-transmissive substrate comprises a patterned surface including at least one of (a) a plurality of recessed features and (b) a plurality of raised features. The plurality of semiconductor layers is adjacent to the patterned surface, and includes a first semiconductor layer comprising doping of a first type and a second semiconductor layer comprising doping of a second type, wherein a light emitting active region is arranged between the first semiconductor layer and the second semiconductor layer. The multi-layer reflector is arranged proximate to the plurality of semiconductor layers, and includes a metal reflector layer and a dielectric reflector layer, wherein the dielectric reflector layer is arranged between the metal reflector layer and the plurality of semiconductor layers. The passivation layer is arranged between the metal reflector layer and (i) a first electrical contact and (ii) a second electrical contact, wherein the first electrical contact is arranged in conductive electrical communication with the first semiconductor layer, and the second electrical contact is arranged in conductive electrical communication with the second semiconductor layer.

The preceding LED may include additional features in various embodiments. In certain embodiments, the light emitting device further includes a first array of conductive microcontacts extending through the passivation layer and providing electrical communication between the first electrical contact and the first semiconductor layer; and at least one conductive path providing electrical communication between the second electrical contact and the second semiconductor layer. In certain embodiments, the at least one conductive path providing electrical communication between the second electrical contact and the second semiconductor layer comprises a second array of conductive microcontacts extending through the passivation layer. In certain embodiments, the dielectric reflector layer may include at least one plurality of conductive vias extending through the dielectric reflector layer and arranged in contact with at least one of the first semiconductor layer and the second semiconductor layer. In certain embodiments, the substrate may include sapphire; alternatively, the substrate may include silicon, silicon carbide, a Group III-nitride material (e.g., GaN), or any combination of the foregoing materials (e.g., silicon on sapphire, etc.). Other substrate materials may be used. In certain embodiments, the first semiconductor layer is deposited on the patterned surface. In certain embodiments, the dielectric reflector layer is arranged on the second semiconductor layer. In certain embodiments, a central portion of the plurality of semiconductor layers forms a mesa extending in a direction away from the substrate, a peripheral portion of the plurality of semiconductor layers forms at least one recess laterally bounding the mesa, and portions of each of the dielectric reflector layer, the metal reflector layer, and the passivation layer extend into the at least one recess. In certain embodiments, at least one portion of the passivation layer peripherally surrounds and prevents exposure of the multi-layer reflector. In certain embodiments, the light emitting device further includes a barrier layer arranged between the metal reflector layer and the passivation layer, wherein at least one of (or both of) the first array and the second array of conductive microcontacts extends through the barrier layer. In certain embodiments, the light emitting device further includes a metal-containing interlayer (which may comprise aluminum) arranged within the passivation layer between the barrier layer and the first and second electrical contacts. In certain embodiments, the light emitting device comprises at least one of the following features (a) to (c): (a) dielectric reflector layer comprises silicon dioxide, (b) the metal reflector layer comprises silver, and (c) the passivation layer comprises silicon nitride. In certain embodiments, the first semiconductor layer comprises an n-type material and the second semiconductor layer comprises a p-type material. In certain embodiments, the light emitting active region includes at least one Group III-nitride material or at least one Group III-phosphide material. In certain embodiments, the light emitting active region comprises a multiple quantum well region. In certain embodiments, the light emitting device further includes a lumiphoric material arranged over a light-transmitting surface of the substrate. In certain embodiments, the substrate comprises a thickness of at least 120 microns, at least 150 microns, at least 170 microns, or another thickness threshold specified herein.

In another aspect, a light emitting device comprises a flip chip light emitting diode (LED) that includes a light-transmissive substrate, a plurality of semiconductor layers, a dielectric reflector layer, a metal reflector layer, a passivation layer, a first array of conductive microcontacts, and at least one conductive path. The light-transmissive substrate comprises a patterned surface including at least one of (a) a plurality of recessed features and (b) a plurality of raised features. The plurality of semiconductor layers is arranged adjacent to the patterned surface and includes a first semiconductor layer comprising doping of a first type as well as a second semiconductor layer comprising doping of a second type, wherein a light emitting active region is arranged between the first semiconductor layer and the second semiconductor layer. The dielectric reflector layer is adjacent to the second semiconductor layer, and includes at least one plurality of conductive vias extending through the dielectric reflector layer and arranged in contact with at least one of the first semiconductor layer and the second semiconductor layer. The metal reflector layer is arranged on the dielectric reflector layer and arranged in contact with the at least one plurality of conductive vias. The passivation layer is arranged between the metal reflector layer and (i) a first electrical contact and (ii) a second electrical contact. The first array of conductive microcontacts extends through the passivation layer and provides electrical communication between the first electrical contact and the first semiconductor layer. The at least one conductive path provides electrical communication between the second electrical contact and the second semiconductor layer.

The preceding LED may include additional features in various embodiments. In certain embodiments, the at least one conductive path providing electrical communication between the second electrical contact and the second semiconductor layer comprises a second array of conductive microcontacts extending through the passivation layer. In certain embodiments, the substrate includes sapphire; alternatively the substrate may include silicon carbide, or a Group III-nitride material (e.g., GaN). In certain embodiments, the first semiconductor layer is deposited on the patterned surface. In certain embodiments, the dielectric reflector layer is arranged on the second semiconductor layer. In certain embodiments, a central portion of the plurality of semiconductor layers forms a mesa extending in a direction away from the substrate, a peripheral portion of the plurality of semiconductor layers forms at least one recess laterally bounding the mesa, and portions of each of the dielectric reflector layer, the metal reflector layer, and the passivation layer extend into the at least one recess. In certain embodiments, at least one portion of the passivation layer peripherally surrounds and prevents exposure of each of the dielectric reflector layer and the metal reflector layer. In certain embodiments, the light emitting device further comprises a barrier layer arranged between the metal reflector layer and the passivation layer, wherein at least one of the first array of microcontacts and the second array of microcontacts extends through the barrier layer. In certain embodiments, the light emitting device further includes a metal-containing interlayer (e.g., comprising aluminum) arranged within the passivation layer between the barrier layer and (i) the first electrical contact and (ii) the second electrical contact. In certain embodiments, the light emitting device comprises one of the following feature (a) to (c): (a) the dielectric reflector layer comprises silicon dioxide, (b) the metal reflector layer comprises silver, and (c) the passivation layer comprises silicon nitride. In certain embodiments, the first semiconductor layer comprises an n-type material and the second semiconductor layer comprises a p-type material. In certain embodiments, the light emitting active region includes at least one Group III-nitride material or at least one Group III-phosphide material. In certain embodiments, the light emitting active region comprises a multiple quantum well region. In certain embodiments, a lumiphoric material is arranged over a light-transmitting surface of the substrate. In certain embodiments, the substrate may comprise a thickness of at least 120 microns, at least 150 microns, at least 170 microns, or another thickness threshold specified herein.

In another aspect, a solid state lighting device comprises a submount; a solid state emitter chip supported by the submount, the solid state emitter chip comprising multiple emitting surfaces including a top emitting surface and including at least one edge emitting surface arranged along a perimeter of the top emitting surface; and a light-transmissive fillet material arranged on or above the submount around a perimeter of the solid state emitter chip, and arranged in contact with the at least one edge emitting surface. Presence of a fillet material along the at least one edge emitting surface may facilitate coating (e.g., spray coating) of a lumiphoric material (e.g., phosphor) over the at least one edge emitting surface. In certain embodiments, the solid state lighting device further comprises at least one lumiphoric material arranged over the top emitting surface and over at least a portion of the fillet material. In certain embodiments, the fillet material comprises a maximum height proximate to the at least one edge emitting surface, the fillet material comprises a minimum height distal from the at least one edge emitting surface, and the maximum height is no higher than a level of the top emitting surface. In certain embodiments, the fillet material comprises silicone and/or at least one lumiphoric material. In certain embodiments, the solid state emitter chip comprises a flip chip, as disclosed herein.

In another aspect, a solid state light emitting device comprises a submount comprising a floor and multiple electrical contact regions; a diffusely reflective material arranged over at least a portion of the submount; at least one flip chip light emitting diode including a p-electrode, an n-electrode, a top emitting surface, and at least one edge emitting surface arranged along a perimeter of the top emitting surface; and solder material arranged to establish contact between the p-electrode and at least one first contact region of the multiple electrical contact regions, and arranged to establish contact between the n-electrode and at least one second contact region of the multiple electrical contact regions; wherein the at least one edge emitting surface is elevated above the floor of the submount by a height of at least about 15 microns, at least about 20 microns, at least about 25 microns, or at least about 30 microns. In certain embodiments, any one or more of the preceding minimum heights may be bounded by an upper limit of no greater than about 70 microns, no greater than about 60 microns, or no greater than about 50 microns, no greater than about 40 microns, or no greater than about 30 microns. Presence of a flip chip that is significantly elevated relative to a submount that includes a reflective material coating may reduce or minimize the possibility that the reflective material coating may otherwise be arranged over (and reflect emissions of) the at least one edge emitting surface of the flip chip. In certain embodiments, the solid state light emitting device further includes at least one lumiphoric material arranged on the top emitting surface and the at least one edge emitting surface. In certain embodiments, the solder material comprises solder flux or solder paste (e.g., gold tin solder paste). In certain embodiments, the solid state light emitting device further includes a light-transmissive fillet material arranged to form a fillet contacting the at least one edge emitting surface and contacting either the floor or the diffusely reflective material. In certain embodiments, the fillet comprises a maximum height proximate to the at least one edge emitting surface, the fillet comprises a minimum height distal from the at least one edge emitting surface, and the maximum height is no higher than a level of the top emitting surface. In certain embodiments, the fillet material comprises silicone and/or at least one lumiphoric material. In certain embodiments, the diffusely reflective material comprises titanium dioxide.

In another aspect, a method is provided for producing a lumiphor-converted solid state light emitting device including a solid state emitter chip comprising multiple emitting surfaces including a top emitting surface and including at least one edge emitting surface arranged along a perimeter of the top emitting surface. The method comprises utilizing at least one spray nozzle to spray a coating composition comprising at least one lumiphoric material in a first direction over at least some surfaces of the multiple emitting surfaces; and utilizing the at least one spray nozzle to spray a coating composition comprising at least one lumiphoric material in a second direction over at least some surfaces of the multiple emitting surfaces; wherein the first direction differs from the second direction, and at least one of the first direction and the second direction is non-perpendicular to the top emitting surface. In certain embodiments, the first direction is angled in a range of from 10 degrees to 80 degrees from the top emitting surface. In certain embodiments, the method further includes dispensing a light-transmissive fillet-forming material to contact the at least one edge emitting surface and to contact a substrate underlying the solid state emitter chip, thereby producing a fillet along the at least one edge emitting surface, wherein said utilizing of at least one spray nozzle to spray a coating composition comprising at least one lumiphoric material in a first direction and in a second direction includes spraying the coating composition over the fillet. In certain embodiments, the fillet comprises a maximum height proximate to the at least one edge emitting surface, the fillet comprises a minimum height distal from the at least one edge emitting surface, and the maximum height is no higher than a level of the top emitting surface. In certain embodiments, the fillet-forming material comprises silicone and/or at least one lumiphoric material. In certain embodiments, the method further includes effecting relative movement between the at least one spray nozzle and the solid state emitter chip during said utilizing of the at least one spray nozzle to spray a coating composition comprising at least one lumiphoric material in a first direction and in a second direction. In certain embodiments, the solid state emitter chip comprises a flip chip, as disclosed herein.

In another aspect, a method is provided for producing a lumiphor-converted solid state light emitting device including a solid state emitter chip comprising multiple emitting surfaces including a top emitting surface and including at least one edge emitting surface arranged along a perimeter of the top emitting surface. The method comprises dispensing a fillet-forming material to contact the at least one edge emitting surface and to contact a substrate underlying the solid state emitter chip, and thereby producing a fillet along the at least one edge emitting surface; and utilizing at least one spray nozzle to spray a coating composition comprising at least one lumiphoric material over the top emitting surface and the fillet. In certain embodiments, the fillet comprises a maximum height proximate to the at least one edge emitting surface, the fillet comprises a minimum height distal from the at least one edge emitting surface, and the maximum height is below the top emitting surface. In certain embodiments, the utilizing of the at least one spray nozzle includes spraying the coating composition in a first direction over the top emitting surface and the fillet, and includes spraying the coating composition in a second direction over the top emitting surface and the fillet, wherein the first direction differs from the second direction, and each of the first direction and the second direction is non-perpendicular to the top emitting surface. In certain embodiments, the fillet-forming material comprises silicone and/or at least one lumiphoric material. In certain embodiments, the solid state emitter chip comprises a flip chip, as disclosed herein.

In another aspect, a method for producing at least one lumiphor-converted solid state emitter chip comprises: positioning a stencil over a substrate supporting at least one solid state emitter chip that comprises at least one light emitting surface, the stencil comprising at least one window registered with the at least one solid state emitter chip to expose the at least one light emitting surface; and applying at least one lumiphoric material over the exposed at least one light emitting surface of the at least one solid state emitter chip, while presence of the stencil prevents at least a portion of the substrate from receiving the at least one lumiphoric material. In certain embodiments, the at least one light emitting surface comprises a top emitting surface and at least one edge emitting surface arranged along a perimeter of the top emitting surface, and wherein the exposed at least one light emitting surface comprises the top emitting surface and at least a portion of the at least one edge emitting surface. In certain embodiments, the method further includes removing the stencil from the substrate. In certain embodiments, the at least one solid state emitter chip comprises a plurality of solid state emitter chips, and the method further comprises dividing the substrate into a plurality of sections each including at least one solid state emitter chip of the plurality of solid state emitter chips. In certain embodiments, the at least one solid state emitter chip comprises a plurality of solid state emitter chips, and the at least one window comprises a plurality of windows. In certain embodiments, the at least one solid state emitter chip comprises at least one flip chip, as disclosed herein.

In another aspect, a method for producing at least one lumiphor-converted solid state light emitting device comprises: arranging a plurality of solid state emitter chips on a releasable adhesive material; coating the plurality of solid state emitter chips with at least one lumiphoric material; applying energy to the releasable adhesive material to reduce adhesion of the releasable adhesive material; and removing the coated plurality of solid state emitter chips from the releasable adhesive material. In certain embodiments, each solid state emitter chip of the plurality of solid state emitter chips comprises a flip chip. In certain embodiments, said coating comprises use of at least one spray nozzle for spraying a coating composition including the at least one lumiphoric material over the plurality of solid state emitter chips. In certain embodiments, the spraying of the coating composition comprises spraying the coating composition in at least one direction non-perpendicular to a top emitting surface of each solid state emitter chip of the plurality of solid state emitter chips. In certain embodiments, said removing comprises individually picking each coated solid state emitter chip of the plurality of solid state emitter chips from the releasable adhesive material, and placing each coated solid state emitter chip on at least one substrate or submount. In certain embodiments, the plurality of solid state emitter chips include a plurality of flip chips, as disclosed herein.

In certain embodiments, one or more flip chip LEDs as disclosed herein may be embodied in a solid state emitter (or LED) package. In certain embodiments, a lighting fixture or a light bulb may include one or more flip chip LEDs as disclosed herein.

In another aspect, the disclosure relates to a method comprising illuminating an object, a space, or an environment, utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 1 is a schematic cross-sectional representation of a portion of a conventional LED chip including an internal reflector and a textured light-emitting surface.

FIG. 2A is a schematic cross-sectional representation of selected (semiconductor) layers embodying a subassembly of a flip chip LED according to certain embodiments of the present disclosure.

FIG. 2B is a schematic cross-sectional representation of selected layers of a multiple quantum well of a flip chip LED according to certain embodiments of the present disclosure.

FIG. 4A is a side cross-sectional illustration of a flip chip LED including a light-transmissive surface that is patterned proximate to semiconductor layers of the LED, including a multi-layer reflector proximate to major and side surfaces of a mesa formed by the semiconductor layers, and including a passivation layer between the multi-layer reflector and electrical contacts of the LED according to one embodiment of the present disclosure.

FIG. 5 is a photograph of a magnified portion of an assembly including four flip chip LEDs during manufacture thereof, prior to dicing to separate the LED chips from one another.

FIG. 6A is a top plan view of a flip chip LED including a substrate with an outer surface including sloped sidewalls and a grooved top surface according to one embodiment of the present disclosure.

FIG. 6B is a side elevation view of the flip chip LED of FIG. 6A.

FIG. 6C is a bottom plan view of the flip chip LED of FIGS. 6A-6B.

FIG. 7A is an upper perspective view of a LED package including a single flip chip LED according to FIGS. 6A-6C according to one embodiment of the present disclosure.

FIG. 7B is a lower perspective view of the LED package of FIG. 7A.

FIG. 8A is schematic top plan view of a portion of a LED package including multiple flip chip LEDs according to one embodiment of the present disclosure.

FIG. 8B is a cross-sectional view of a portion of the LED package of FIG. 8A.

FIG. 9 is a plot of K-factor values (representing a ratio of white brightness to blue brightness, with a higher value representing greater white conversion efficiency) for (i) a phosphor converted flip chip (comparison) LED produced by a process including bonding an assembly including a growth substrate and epitaxial layers to a carrier substrate with a reflective layer between the carrier substrate and the epitaxial layers, followed by removal of the growth substrate and top surface patterning or texturing of an exposed epitaxial layer surface, and (ii) a phosphor converted low optical loss flip chip LED constructed on an internally patterned sapphire substrate according to one embodiment of the present disclosure.

FIG. 10 is a plot of normalized luminous flux at three different target color rendering values (E2: 70 CRI, E3: 75 CRI, E5: 80 CRI) for (i) a comparison LED produced by a process including bonding an assembly including a growth substrate and epitaxial layers to a carrier substrate with a reflective layer between the carrier substrate and the epitaxial layers, followed by removal of the growth substrate and top surface patterning or texturing of an exposed epitaxial layer surface, and (ii) a flip chip LED incorporating an internally patterned sapphire substrate according to one embodiment, to compare color rolloff characteristics.

FIG. 11 is a schematic illustration of an apparatus for perpendicular spray coating of a solid state light emitter chip supported by a substrate.

FIG. 12A is a schematic illustration of an apparatus for angled spray coating of multiple solid state light emitter flip chips supported by a substrate.

FIG. 12B is a side cross-sectional schematic view of multiple solid state light emitter flip chips supported by a substrate and overlaid by a coating of a lumiphoric material.

FIG. 13 is a schematic illustration of an apparatus for angled spray coating of a solid state light emitter flip chip supported by a substrate with angled spray nozzles directed toward upper corners of the flip chip.

FIG. 14A is a side cross-sectional schematic view of a solid state light emitter flip chip supported by a substrate with a light-transmissive fillet material arranged around a perimeter of the chip and in contact with edge emitting surfaces of the chip.

FIG. 14B is a side cross-sectional schematic view of the chip of FIG. 14A overlaid with a coating of a lumiphoric material.

FIG. 15A is a side cross-sectional schematic view of a solid state light emitter flip chip supported by a substrate with a light-transmissive fillet material that includes a lumiphoric material arranged around a perimeter of the chip and in contact with edge emitting surfaces of the chip.

FIG. 15B is a side cross-sectional schematic view of the chip of FIG. 15A overlaid with a coating of a lumiphoric material.

FIG. 16A is a top view photograph of a light emitting device including a solid state light emitter flip chip and an electrostatic discharge chip mounted to a submount.

FIG. 16B is a top view photograph of a light emitting device according to FIG. 16A following addition of a light-transmissive clear fillet material arranged on the submount around a perimeter of the flip chip and arranged in contact with edge emitting surfaces of the flip chip.

FIG. 17A is a top view photograph of a light emitting device including a solid state light emitter flip chip following addition of a light-transmissive fillet material that includes a lumiphoric material arranged on the submount around a perimeter of the flip chip and arranged in contact with edge emitting surfaces of the flip chip.

FIG. 17B is a top view photograph of the light emitting device of FIG. 17A following addition of an additional coating of a lumiphoric material.

FIG. 18 is a top view photograph of six interconnected light emitting devices each including a hemispherical lens overlying a coating of lumiphoric material and a solid state light emitter flip chip supported by a submount, with each device being devoid of a fillet material between the flip chip and the submount.

FIG. 19 is a top view photograph of six interconnected light emitting devices each including a hemispherical lens overlying a coating of lumiphoric material and a solid state light emitter flip chip supported by a submount, with each device including a fillet material between the flip chip and the submount.

FIG. 21A is a top view photograph of nine interconnected light emitting devices each including a solid state light emitter flip chip supported by a substrate, following application of a lumiphoric material through a stencil window to emitting surfaces of the solid state light emitter flip chip, with the majority of each substrate being devoid of lumiphoric material.

FIG. 21B is a magnified top view photograph of one lumiphoric material-coated solid state light emitter flip chip of FIG. 21A.

FIG. 22A is a perspective view schematic illustration of an assembly of six solid state light emitter flip chips supported by a releasable tape prior to spray coating with a lumiphoric material.

FIG. 22B is a perspective view schematic illustration of the assembly of FIG. 22A following coating of the solid state light emitter flip chips and releasable tape with lumiphoric material, with the releasable tape being arranged proximate to an energy source.

FIG. 22C is a perspective view schematic illustration of the assembly of FIG. 22B following application of energy to reduce adhesion of the releasable tape, and following removal of a single lumiphoric material-coated solid state light emitter flip chip.

FIG. 23A is a top view photograph of an assembly of sixteen solid state light emitter flip chips supported by a releasable tape following spray coating with a lumiphoric material.

FIG. 23B is a magnified perspective view photograph of a portion of the assembly of FIG. 23A.

FIG. 23C is a top view photograph of a layer of lumiphoric material-coated releasable tape following removal of sixteen lumiphoric material-coated solid state light emitter flip chips.

FIG. 23D is a side perspective view photograph of a lumiphoric material-coated solid state light emitter flip chip following removal of the chip from a layer of releasable tape.

FIG. 24A is a top view photograph of multiple interconnected light emitting devices each including a lumiphoric material-coated solid state light emitter flip chip supported by a submount, following coating of each flip chip via a releasable tape coating method.

FIG. 24B is a magnified top view photograph of a portion of a single light emitting device of FIG. 24A.

FIG. 24C is a magnified perspective view photograph of a portion of a single light emitting device of FIG. 24A.

FIG. 25A is a side cross-sectional schematic view illustration of a portion of a light emitting device including a solid state light emitter flip chip mounted to a submount at a conventional height with a diffusely reflective layer disposed over the submount arranged in contact with edge emitting surfaces of the flip chip.

FIG. 25B is a side cross-sectional schematic view illustration of a portion of another light emitting device including a solid state light emitter flip chip mounted to a submount at an elevated height with a diffusely reflective layer disposed over the submount being devoid of contact with edge emitting surfaces of the flip chip.

FIG. 26 is a side cross-sectional schematic illustration of a solid state light emitter flip chip covered with a top-sprayed layer of lumiphoric material, with a drop of wicking prevention material arranged over a top surface of the lumiphoric material layer and with a reflective layer contacting side surfaces of the lumiphoric material layer.

FIG. 27 is a side cross-sectional schematic illustration of a solid state light emitter flip chip covered with a top-sprayed and angle-sprayed layer of lumiphoric material, with a drop of wicking prevention material arranged over a top surface of the lumiphoric material layer and with a reflective layer contacting side surfaces of the lumiphoric material layer.

FIG. 28 is a side cross-sectional schematic illustration of a solid state light emitter flip chip covered with a top-sprayed and angle-sprayed layer of lumiphoric material, with a light-transmissive fillet material containing a lumiphoric material layer contacting side surfaces of the lumiphoric material layer, and with a reflective layer contacting portions of the fillet material.

FIG. 29 is a side cross-sectional schematic illustration of a solid state light emitter flip chip covered with a top-sprayed and angle-sprayed layer of lumiphoric material, with a light-transmissive fillet material containing a lumiphoric material layer contacting side surfaces of the lumiphoric material layer.

FIG. 30 is a side cross-sectional schematic illustration of a solid state light emitter flip chip, with a fillet-shaped reflective layer contacting edges of the flip chip, and with a top-sprayed lumiphoric material layer covering the top surface of the flip chip and covering the reflective layer arranged over edges of the flip chip.

FIG. 31 is a side cross-sectional schematic illustration of a solid state light emitter flip chip arranged to be supported by a substrate, with the flip chip and substrate covered with a top-sprayed and angle-sprayed layer of lumiphoric material, with a drop of wicking prevention material arranged over a top surface of the lumiphoric material layer, and with a reflective layer contacting side surfaces of the lumiphoric material layer.

FIG. 32 is a side cross-sectional schematic illustration of a solid state light emitter flip chip arranged to be supported by a substrate, with the flip chip and substrate covered with a top-sprayed and angle-sprayed layer of lumiphoric material, and with a reflective material layer disposed over portions of the lumiphoric material away from side surfaces of the lumiphoric material layer.

FIG. 33 is a side cross-sectional schematic illustration of a solid state light emitter flip chip arranged to be supported by a substrate, with a fillet-shaped reflective layer portion contacting edges of the flip chip, with a top-sprayed lumiphoric material layer covering the top surface of the flip chip and covering the fillet-shaped reflective layer portion arranged over edges of the flip chip, with a drop of wicking prevention material arranged over a top surface of the lumiphoric material, and with a reflective material layer arranged in contact with the side surfaces of the lumiphoric material layer.

DETAILED DESCRIPTION

Figure 3A:
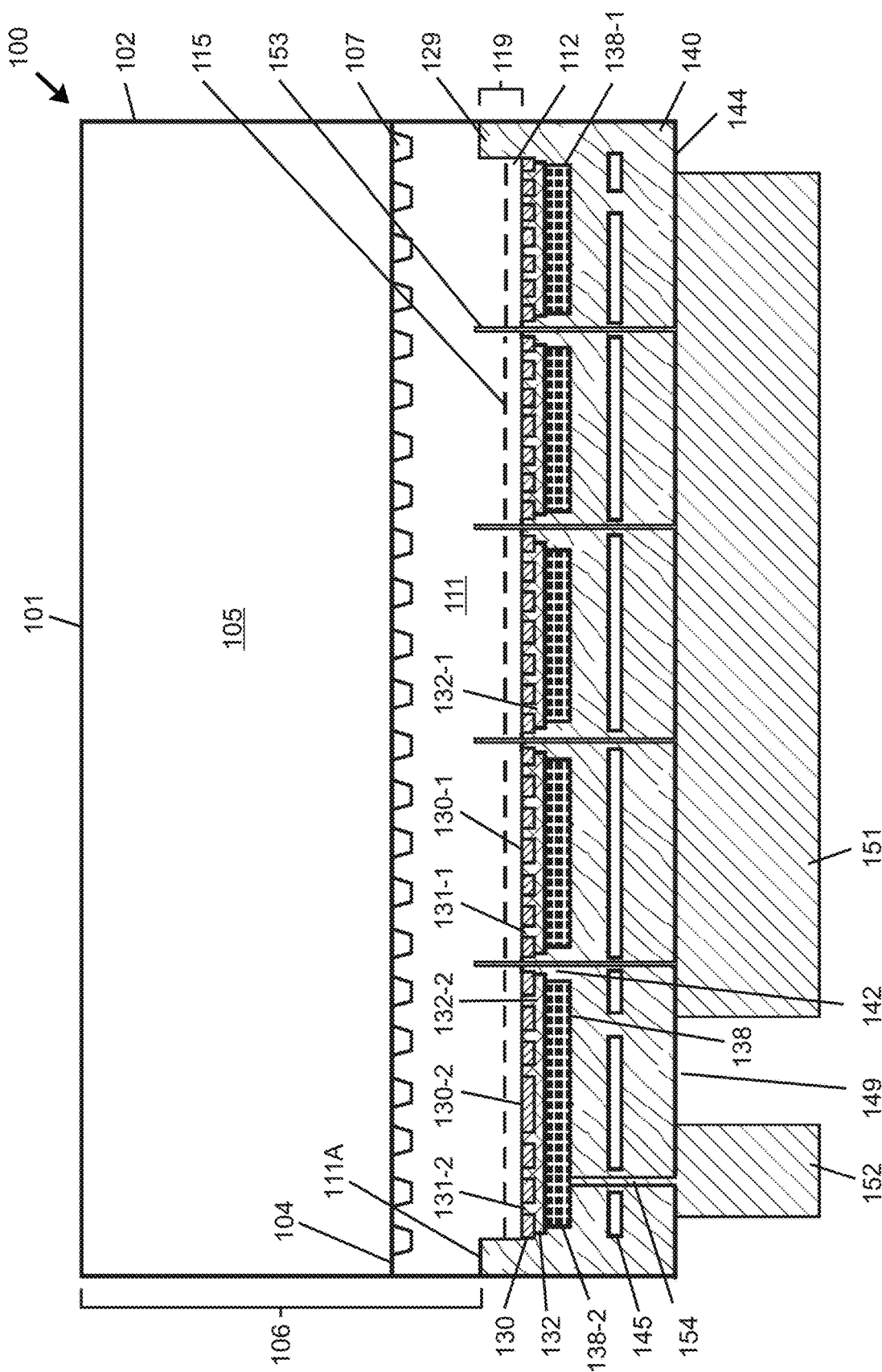
FIG. 3A is a side cross-sectional illustration of a flip chip LED including a light-transmissive surface that is patterned proximate to semiconductor layers of the LED, including a multi-layer reflector proximate to the semiconductor layers, and including a passivation layer between the multi-layer reflector and electrical contacts of the LED according to one embodiment of the present disclosure.

Various embodiments disclosed herein relate to solid state lighting devices including light emitting diodes, such as devices including low optical loss flip chip LEDs incorporating multi-layer reflectors and incorporating light transmissive substrates patterned along an internal surface adjacent to semiconductor layers. A multi-layer reflector preferably spans substantially the entire area of a light emitting active region arranged between oppositely doped semiconductor layers of a LED, or, more preferably, spans beyond the area of the active region of the LED. In additional aspects, the present disclosure relates to methods for producing lumiphor-converted solid state light emitting devices in which surfaces of one or more solid state light emitter chips are coated with lumiphoric material, such as may include angled spray coating, fillet formation prior to spray coating, stencil island coating, and releasable tape coating. In still further aspects, the present disclosure relates to a solid state light emitting device including an elevated emitter chip and/or a light transmissive fillet material proximate to edge emitting surfaces of an emitter chip, such as may be useful for ensuring adequate lumiphoric material coverage of edge emitting surfaces and/or for reducing luminous flux loss when diffusely reflective materials are present proximate to the emitter chip.

The embodiments set forth herein represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, an "active region" of a solid state light emitting device refers to the region in which majority and minority electronic carriers (e.g., holes and electrons) recombine to produce light. In general, an active region according to embodiments disclosed herein can include a double heterostructure or a well structure, such as a quantum well structure Solid state light emitting devices disclosed herein may include at least one solid state light source (e.g., a LED) and one or more lumiphoric materials (also referred to herein as lumiphors) arranged to receive emissions of the at least one solid state light source. A lumiphoric material may include one or more of a phosphor, a scintillator, a lumiphoric ink, a quantum dot material, a day glow tape, and the like. In general, a solid state light source may generate light having a first dominant wavelength. At least one lumiphor receiving at least a portion of the light generated by the solid state light source may re-emit light having a second dominant wavelength that is different from the first dominant wavelength. A solid state light source and one or more lumiphoric materials may be selected such that their combined output results in light with one or more desired characteristics such as color, color point, intensity, etc. In certain embodiments, aggregate emissions of one or more flip chip LEDs, optionally in combination with one or more lumiphoric materials, may be arranged to provide cool white, neutral white, or warm white light, such as within a color temperature range of from 2500K to 10,000K. In certain embodiments, lumiphoric materials having cyan, green, amber, yellow, orange, and/or red dominant wavelengths may be used. In certain embodiments, lumiphoric materials may be added to one or more emitting surfaces (e.g., top surface and one or more edge surfaces) by methods such as spray coating, dipping, liquid dispensation, powder coating, inkjet printing, or the like. In certain embodiments, lumiphoric material may be dispersed in an encapsulant, adhesive, or other binding medium.

As used herein, a layer or region of an LED is considered to be "transparent" when at least 90% of the radiation from the LED that impinges on the transparent layer or region emerges through the transparent region. For example, in the context of blue and/or green LEDs that are fabricated from gallium nitride-based materials, silicon dioxide can provide a transparent insulating layer (for example, at least 90% transparent), whereas indium tin oxide (ITO) can provide a transparent conductive layer (for example, at least 90% transparent) as measured by considering transmitted and reflected components on a sapphire substrate. Moreover, as used herein, a layer or region of an LED is considered to be "reflective" or embody a "reflector" when at least 90% of the angle averaged radiation emanating from a LED active region and that impinges on the layer or region is reflected back into the active region. For example, in the context of gallium nitride-based blue and/or green LEDs, silver (for example, at least 90% reflective) may be considered a reflective material. In the case of ultraviolet (UV) LEDs, appropriate materials may be selected to provide a desired, and in some embodiments high, reflectivity and/or a desired, and in some embodiments low, absorption.

As noted previously, various embodiments herein relate to solid state lighting devices including light emitting diodes, such as devices including low optical loss flip chip LEDs incorporating multi-layer reflectors and incorporating light transmissive (preferably transparent) substrates patterned along an internal surface adjacent to semiconductor layers. A flip chip LED includes spaced apart anode and cathode contacts that extend along the same face, with such face opposing a face defined by the light transmissive (preferably transparent) substrate. A flip chip LED may also be termed a horizontal structure, as opposed to a vertical structure having contacts on opposing faces of a LED chip.

In certain embodiments, a light-transmissive (preferably transparent) substrate comprises a patterned internal surface adjacent to semiconductor layers, with the patterned surface including at least one of (a) a plurality of recessed features and (b) a plurality of raised features. In certain embodiments, the substrate may include sapphire; alternatively, the substrate may include silicon, silicon carbide, a Group III-nitride material (e.g., GaN), another epitaxially compatible crystalline material, or any combination of the foregoing materials (e.g., silicon on sapphire, etc.). A substrate may be patterned by any of various methods known in the art, including (but not limited to) formation of nano-scale features by etching (e.g., photolithographic etching) using any suitable etchants, optionally in combination with one or more masks. Features of any desired number, shape, pitch, and configuration may be provided. In certain embodiments, a patterned substrate may include one or more of the following: stripes, dots, curved features, circular features, polygonal features, conical features, frustoconical features, and the like. Following patterning, the patterned surface may optionally be planarized via conventional methods (e.g., via polishing, chemical mechanical polishing, or any suitable process) and cleaned via conventional methods to render the patterned surface epitaxy-ready. Thereafter, one or more epitaxial layers may be grown thereon, including oppositely doped semiconductor layers with an active region arranged therebetween.

It is to be noted that sapphire, silicon, and silicon-on-sapphire substrate materials may be substantially less costly than higher performance silicon carbide or Group III-nitride substrates, but the use of internally patterned substrates together with multi-layer reflectors as described herein may permit flip chip LEDs incorporating lower cost (e.g., sapphire) substrates to attain performance levels comparable to flip chip LEDs produced on externally roughened silicon carbide substrates lacking patterning on internal surfaces thereof. Conventional silicon carbide substrates are thin, due primarily to the elevated material cost, and may be supported by non-native support materials. When, as described herein, a lower cost substrate (e.g., sapphire) is used for flip chip LED fabrication, a thick native substrate may be used economically without need for any non-native support materials for mechanical support. The proposed new approach may provide quicker production cycle times to produce flip chip LEDs with less capital. Additionally, the resulting flip chip LEDs may be more reliable due to the added support of a thick native (e.g., sapphire) substrate.

As noted above, following formation of patterned features on a surface of the substrate, various semiconductor layers (including oppositely doped semiconductor layers with an active region arranged therebetween) may be epitaxially grown on or over the patterned surface of the substrate. In certain embodiments, growing epitaxial layers on or over a patterned substrate may improve the epitaxial growth process by encouraging destruction of dislocation defects, thereby providing higher crystal quality. Additionally, presence of patterned features on an internal surface of the substrate provide a varying surface that increases the probability of refraction of light into the substrate as opposed to internal reflection of light into the semiconductor layer abutting the substrate. Both improved crystal quality and improved light extraction may beneficially improve light output from a flip chip LED incorporating such a substrate.

Following epitaxial growth of semiconductor layers over the patterned substrate, the various other structures (e.g., mesa-bounding recesses, multi-layer mirror, barrier layer, passivation layer, interlayer, microcontact arrays, and electrical contacts) may be formed over the semiconductor layers. As will be appreciated by one skilled in the art, a multiplicity of LED chips may be fabricated simultaneously on a single wafer (e.g., a six inch diameter wafer, or wafer of any suitable size), and such LED chips may thereafter be singulated by dicing or any other suitable technique.

Various details of at least certain layers of exemplary LED structures utilizing Group III nitride (e.g., GaN, InGaN, AlGaN) semiconductor materials are described in connection with FIGS. 2A to 4B. It is to be recognized that the disclosure is not limited to light emitting structures based on Group III nitride semiconductor materials, and that similar structures may be produced with other (e.g., arsenide, phosphide, etc.) material types.

FIG. 2A is a schematic cross-sectional representation of selected (semiconductor) layers embodying an epitaxial subassembly 10 of a flip chip LED according to certain embodiments of the present disclosure, with such layers not being to scale. The epitaxial subassembly 10 includes first and second oppositely doped semiconductor layers (e.g., n-GaN layer 11 and p-GaN layer 12) having multiple quantum well (MQW) active region 15 arranged therebetween. Optionally, one or more buffer layers (e.g., n-type AlGaN and/or unintentionally doped GaN, not shown) of constant or graded composition may be arranged between a patterned substrate and the first doped semiconductor layer 11. In certain embodiments, the first doped semiconductor layer 11 may embody an n-type layer arranged adjacent to a patterned substrate (not shown). In certain embodiments, the first doped semiconductor layer 11 may be doped with silicon, such as at a level of less than about $5 \times 10^{19}$ cm$^{-3}$, and may have any suitable thickness in a range of from tens to thousands of Angstroms.

A spacer layer 13 (e.g., undoped GaN) and/or a superlattice structure 14 (that may include alternating layers of silicon-doped GaN and/or InGaN) may optionally be provided between the first doped semiconductor layer 11 and the active region 15. If present, the superlattice structure 14 may provide a better surface for growth of the nitride (e.g., InGaN-based) active region 15, and may influence operating voltage. While not wishing to be bound by any theory of operation, it is presently believed that strain effects in the superlattice structure 14 provide a growth surface that is conducive to the growth of a high-quality InGaN-containing active region 15. Appropriate choice of thickness and composition of the superlattice structure 14 can reduce operating voltage and/or enhance optical efficiency. In certain embodiments including a superlattice structure 14, the superlattice structure 14 may include alternating layers of $In_xGa_{1-x}N$ and $In_yGa_{1-y}N$, wherein x is between 0 and 1 inclusive, and x is not equal to y. In certain embodiments, x=0, so that the superlattice structure 14 includes alternating layers of GaN and InGaN. In certain embodiments, the superlattice structure 14 may include from about 5 to about 50 periods (where one period equals one repetition of an $In_xGa_{1-x}N$ layer and an $In_yGa_{1-y}N$ layer of the repeating layers that form the superlattice structure 14).

The active region 15 includes multiple light emitting wells that include thin layers of low bandgap semiconductor material sandwiched between higher bandgap cladding or confinement layers, and that may in some embodiments be quantum wells. As is known in the art, a well layer is a very thin layer of semiconductor material (typically less than about 50 nm) surrounded by barrier or confinement layers having higher bandgaps than the quantum well layer. The barrier layers and the well layer together form a quantum well. In particular, a quantum well layer is so thin that allowable energy levels in the quantum well take on discrete values, so that a quantum well exhibits a high density of states at the lowest allowed (discrete) energy level—as compared to bulk material, which has a smooth distribution of allowable energy levels. A quantum well may generate photons by carrier recombination with improved efficiency and/or spectral purity as compared to bulk recombination/emission. Carrier recombination occurs when an electron fills a space in a crystal lattice occupied by a hole and moves to a lower energy state, releasing energy in the form of heat and/or light. In various embodiments, the wells may or may not be thin enough to be characterized as quantum wells. In certain embodiments disclosed herein, the active region 15 includes a multiple well structure that includes multiple barrier-well units (such as shown in FIG. 2B).

In certain embodiments, an optional cap layer 16 may be provided on the active region 15 and may include a layer of undoped GaN, AlGaN and/or AlInGaN. In certain embodiments, the cap layer 16 may have a thickness in a range of 1 Angstrom to 300 Angstroms. As used herein, "undoped" refers to a layer or region that is not intentionally doped with impurities, and is synonymous with "unintentionally doped." It will be appreciated that Group III nitride based materials are typically naturally n-type as grown, and therefore the cap layer 16 may be n-type as grown. In certain embodiments, the cap layer 16 may have a thickness of at least about 40 Angstroms.

The second doped semiconductor layer 12 may comprise a p-type nitride-based layer such as GaN, AlGaN, or AlInGaN doped with a p-type impurity such as magnesium. In certain embodiments, the second doped semiconductor layer 12 may have a thickness in a range of from 0 Angstroms to 300 Angstroms, and in some cases may have a thickness of about 150 Angstroms.

In certain embodiments, a P-N junction 17 may be formed at a junction between the second doped semiconductor layer 12 and the cap layer 16. The P-N junction 17 serves as a mechanism for injecting minority carriers into the active region 15, where such carriers can recombine with majority carriers to generate photons and result in light emission. In certain embodiments, the P-N junction 17 is preferably positioned at or near the active region 15, such as within a range of less than 500 Å therefrom, so that an injected minority carrier can diffuse with a high probability into the active region 15 and recombine with a majority carrier in a quantum well.

FIG. 2B illustrates barrier-well units of an exemplary active region 15 embodying a multiple quantum well structure that may provide the active region of the subassembly illustrated in FIG. 2A in certain embodiments. The active region 15 includes a multiple well structure with multiple InGaN well layers 20-1 to 20-N (where N is a variable of any suitable value) separated by intervening barrier layers 18-1 to 18-N in an alternating fashion, and covered with an additional barrier layer 18-N+1. The barrier layers 18-1 to 18-N may generally include GaN, AlGaN, InGaN, or AlInGaN; however, the indium composition of the barrier layers 18-1 to 18-N and 18-N+1 is preferably less than that of the well layers 20-1 to 20-N, so that the barrier layers 18-1 to 18-N and 18-N+1 have a higher bandgap than the well layers 20-1 to 20-N. In certain embodiments, the barrier layers 18-1 to 18-N and 18-N+1 and the well layers 20-1 to 20-N may be undoped (i.e. not intentionally doped with an impurity atom such as silicon or magnesium). In other embodiments, the barrier layers 18-1 to 18-N and 18-N+1 may be doped with silicon, particularly if ultraviolet emission is desired. Within the active region 15, each well layer 20-1 to 20-N is positioned between two barrier layers 18-1 to 18-N and 18-N+1, to form multiple quantum wells 25-1 to 25-N each including a well layer and two barrier layers. Each combination of one barrier layer 18-1 to 18-N and one adjacent well layer 20-1 to 20-N may also be referred to as included in a "barrier-well unit," with multiple barrier-well units 22-1 to 22-N being illustrated in FIG. 2B as being sequentially arranged and covered with an additional barrier layer 18-N+1 to form an active region 15 that includes multiple quantum wells 25-1 to 25-N.

As noted previously, various embodiments herein relate to devices including low optical loss flip chip LEDs incorporating multi-layer reflectors and incorporating patterned substrates. A multi-layer reflector preferably includes a dielectric reflector layer adjacent to one oppositely doped semiconductor layer, and a metal reflector layer on the dielectric reflector layer. In addition to providing light reflection utility, a multi-layer reflector may also provide electrical conduction utility and/or current spreading utility.

In certain embodiments, a dielectric reflector layer comprises a material having an index of refraction that differs from (e.g., is lower than) the oppositely doped semiconductor layers arranged adjacent to the active region. In certain embodiments, the dielectric layer may comprise an index of refraction that is smaller than an adjacent layer to promote total internal reflection. In certain embodiments, a metal reflector layer is arranged on or adjacent to the dielectric reflector layer, and is used in conjunction with the dielectric reflector layer to enhance reflection, such that any portion of light passing through the dielectric reflector layer can be reflected by the metal reflector layer back toward the active region.

Use of a multi-layer reflector within a LED can reduce optical losses that occur by light emitted by an active region in a direction toward a submount or in another undesirable direction away from a primary light emitting surface of a LED. The multi-layer reflector can be positioned to reflect this light to permit it to propagate from a LED chip in a desirable direction.

In certain embodiments, a dielectric reflector layer may be arranged directly on a doped (e.g., p-doped) semiconductor layer that is adjacent to a LED active region. In other embodiments, one or more intervening layers may be provided between a dielectric reflector layer and a doped semiconductor layer.

A dielectric reflector layer may comprise any one or more of various materials. In certain embodiments, a dielectric reflector layer may include two or more sublayers of dielectric materials having different material concentrations and/or compositions. In certain embodiments, a dielectric reflector layer comprises silicon dioxide ($SiO_2$). In other embodiments, one or more other dielectric materials may be used, such as SiN, Si, Ge, $MgO_x$, ZnO, $SiN_x$, $SiO_x$, AlN, $Al_2O_3$, and alloys and combinations of the foregoing. Other materials having refractive indices that are lower or higher than a material of a doped semiconductor layer (e.g., p-GaN) are arranged between the dielectric reflector layer and the active region. In certain embodiments, a dielectric reflector layer has a refractive index in a range of from 1% to 50% lower, or from 5% to 40% lower, or from 5% to 30% lower than a material of an adjacent doped semiconductor layer. For example, GaN and $SiO_2$ have index of refraction values of 2.4 and 1.46, respectively, representing a difference of 39% between the two materials. Thickness of a dielectric reflector layer may vary depending on material composition, but in certain embodiments a dielectric reflector layer may have a thickness of at least about 0.2 microns, of about 0.5 microns, of at least about 0.5 microns, or in a range of from about 0.2 to about 0.7 microns.

Various metals may be used for a metal reflector layer of a multi-layer reflector. In certain embodiments, a metal reflector layer may comprise Ag, Au, Al, or combinations thereof, and may comprise multiple sublayers. As mentioned previously, each reflection from a metal layer entails a loss of light, and these losses can be significant for photons (e.g., light) subject to multiple traversals and reflections within a LED. Reflection by TIR is generally lossless, so that when a greater fraction of light is reflected by TIR than by a metal reflector, optical losses are reduced. In certain embodiments, a metal reflector layer may comprise Ag in combination with at least one other metal, or in other embodiments may consist essentially of Ag.

In certain embodiments, an adhesion layer may be provided between the dielectric reflector layer and the metal reflector layer to promote adhesion between such layers. If provided, such an adhesion layer may comprise various materials such as TiO, TiON, $TiO_2$, TaO, TaON, $Ta_2O_5$, AlO, or combinations thereof, with a preferred material being TiON. In certain embodiments, an adhesion may have a thickness in a range of from a few (e.g., 3-10 Angstroms) to 1000 or more Angstroms. The thickness and material(s) of the adhesion layer should be selected to minimize absorption of light passing therethrough.

In certain embodiments, a multi-layer reflector includes a dielectric reflector layer arranged on a metal reflector layer, with a plurality of conductive vias extending through the dielectric reflector layer and arranged in contact with the metal reflector layer. In certain embodiments, at least some vias in combination with the metal reflector layer may provide a conductive path through the insulating dielectric reflector layer to permit an electric signal to be propagated (e.g., through a doped semiconductor layer, such as p-GaN) to the active region of a LED. In certain embodiments, at least some vias in combination with the metal reflector layer may enhance spreading of current into at least a portion of the active region. In certain embodiments, some vias defined through one portion of a dielectric reflector layer may be used for propagation of electric signals to or from the active region, while other vias defined through another portion of a dielectric reflector layer may be used to enhance current spreading but without necessarily being used to propagate electrical signals to or from the active region. In this regard, regions of a metal reflector layer may simultaneously provide two or more utilities of light reflection, electrical conduction, and current spreading.

A multi-layer reflector including a dielectric reflector layer defining vias, and including a metal reflector layer proximate to the dielectric reflector layer, may be formed in various ways. In one embodiment, following epitaxial growth of oppositely doped semiconductor layers with an active region arranged therebetween, a dielectric reflector material (e.g., $SiO_2$) may be deposited on a surface of a semiconductor layer distal from the substrate. Thereafter, (e.g., p via holes) holes may be defined in the dielectric reflector layer. Following formation, the holes may be filled with metal concurrent with deposition of the metal reflector layer to form conductive vias. The holes in the dielectric reflector material may be formed by a conventional etching process or a mechanical process such as microdrilling. The holes may have various shapes and sizes. In certain embodiments, holes defined in the dielectric reflector layer may have a circular cross-section with a diameter of less than 20 microns. In certain embodiments, holes with other cross-sectional shapes (e.g., square, oval, hexagonal, pentagonal, etc.) may be provided. In some embodiments, holes defined in the dielectric reflector layer may have a diameter in a range of from 1 to 8 microns. In certain embodiments, adjacent holes may be spaced apart an edge-to-edge distance in a range of 5 to 100 microns, in a range of 10 to 40 microns, or in a range of 20 to 30 microns. In certain embodiments, any one or more of size, shape, and spacing of holes may be uniform or non-uniform over part or all of the dielectric reflector layer.

Following formation of holes in the dielectric reflector layer, metal may be deposited (e.g., via sputtering or any suitable process) into the holes and onto the exposed surface of the dielectric reflector layer to form the metal reflector layer. Thereafter, a barrier layer may be formed on the metal reflector layer, with examples of suitable materials that may be used to form a barrier layer including but not limited to sputtered Ti/Pt followed by evaporated Au bulk material, or sputtered Ti/Ni followed by a evaporated Ti/Au bulk material.

In certain embodiments, a central portion of the plurality of semiconductor layers (including the light emitting active region) forms a mesa extending in a direction away from the substrate, and a peripheral portion of the plurality of semiconductor layers forms at least one recess laterally bounding the mesa. In certain embodiments, the multi-layer reflector is arranged over substantially the entirety of a major surface of the mesa (e.g., at least about 90%, at least about 92%, or at least about 95% of the major surface of the mesa), while the recess contains passivation material (e.g., SiN). The at least one recess bounding the mesa may be formed by etching the plurality of semiconductor layers. In certain embodiments, the multi-layer reflector is arranged over substantially an entire major surface of the mesa (e.g., at least about 90%, at least about 92%, or at least about 95% of the major surface of the mesa) while the multi-layer reflector further extends past the major surface of the mesa into the at least one recess (to "wrap around" the active region), and a least one portion of the passivation material further extends into the recess to peripherally surround and prevent exposure of the multi-layer reflector. The portion of the multi-layer reflector extending into the at least one recess is preferably devoid of conductive vias extending through the dielectric reflector material, so that only insulating material is arranged in contact with lateral boundaries of the light emitting active region.

In certain embodiments, a barrier layer may be provided proximate to the metal reflector layer in order to prevent migration of metal from the metal reflector layer. Examples of suitable materials that may be used to form such a barrier layer include but are not limited to sputtered Ti/Pt followed by evaporated Au bulk material, or sputtered Ti/Ni followed by a evaporated Ti/Au bulk material. Other combinations of these or other materials may be used to form a barrier layer according to certain embodiments. In certain embodiments, a barrier layer may define an array of openings containing passivation material and a laterally encapsulated array of conductive microcontacts extending therethrough, with the microcontacts providing a conductive path between an external electrical contact and one of the doped semiconductor layers of the LED for propagation of current to or from the active region.

As noted previously, in certain embodiments, a passivation layer is arranged between the metal reflector layer and (i) a first electrical contact and (ii) a second electrical contact. In certain embodiments, the passivation layer comprises a suitably robust and insulating material such as silicon nitride. Other materials may be used for the passivation layer. In certain embodiments, the passivation layer includes a metal-containing interlayer (e.g., comprising Al or another suitable metal) arranged therein. In certain embodiments, the interlayer may serve as a crack reducing feature, such as to stop the propagation of cracks in the insulating layer to a major surface of the insulating layer (e.g. proximate to external contacts of the LED). In certain embodiments, the passivation layer interlayer may define first and second arrays of openings with first and second arrays of conductive microcontacts extending therethrough, wherein the microcontacts provide conductive paths between external electrical contacts and the oppositely doped semiconductor layers of the LED for propagation of current to and from the active region. Conductive communication between the arrays of microcontacts and the interlayer may be prevented by presence of passivation material between the microcontacts and openings defined in the interlayer.

In certain embodiments, separate first and second electrical contacts are arranged on a single surface of a passivation layer of a flip chip LED. In one embodiment, a first electrical contact (e.g., n-contact or cathode) may be arranged in conductive electrical communication with a first semiconductor layer (e.g., n-GaN layer) proximate to the active region, while a second electrical contact (e.g., p-contact or anode) may be arranged in conductive electrical communication with a second semiconductor layer (e.g., p-GaN layer) proximate to the active region. In such an embodiment, conductive electrical communication between the first electrical contact and the first semiconductor layer is provided through the first array of microcontacts, which extends through the passivation layer, the metal-containing interlayer, the barrier layer, the metal reflector layer, the dielectric reflector layer, the first semiconductor layer, and the active region. Additionally, in such an embodiment, conductive electrical communication between the second electrical contact and the second semiconductor layer is provided through the metal reflector layer, vias defined in the dielectric reflector layer, and the second array of microcontacts—with the second array of microcontacts extending through the passivation layer, the metal-containing interlayer, and the barrier layer to reach the metal reflector layer.

In certain embodiments, a flip chip LED may be fabricated by various steps, including: (a) patterning a surface of a substrate; (b) epitaxially growing multiple semiconductor layers sandwiching a light emitting active region on or adjacent to the patterned surface; (c) forming at least one recess in a portion of the semiconductor layers (including the active region) to define a mesa; (d) forming a multi-layer reflector (including a via-defining dielectric reflector layer and a metal reflector layer) on or adjacent to at least one layer of the multiple semiconductor layers; (e) forming a barrier layer on or adjacent to the metal reflector layer; (f) defining openings in the barrier layer and at least a portion of the multi-layer reflector; (g) forming a first passivation layer portion on or adjacent to the barrier layer; (h) forming an interlayer on the first passivation layer portion; (i) forming a second passivation layer portion on the interlayer and the first passivation layer portion; (j) defining openings through various layers (e.g., via etching or microdrilling) for receiving first and second arrays of microcontacts; (k) filling the preceding openings with conductive material to form the first and second arrays of microcontacts; and (l) forming electrical contacts on a surface of the second passivation layer portion, with a first electrical contact in conductive communication with the first array of microcontacts, and with the second electrical contact in conductive communication with the second array of microcontacts. With respect to step (j), it is noted that defining openings through various layers in a single or sequential fashion may beneficially promote alignment of openings. In certain embodiments, one or more of the preceding steps may be omitted, and/or additional steps may be added. In certain embodiments, one or more of the preceding steps may be split into sub-parts, and/or temporal order of two more steps may be modified as desired by one skilled in the art.

FIG. 3A illustrates a flip chip LED 100 including an internal light-transmissive surface 104 that is patterned proximate to semiconductor layers of the LED 100, including a multi-layer reflector proximate to the semiconductor layers according to one embodiment. The LED 100 includes a light transmissive (preferably transparent) substrate 105 having an outer major surface 101, side surfaces 102, and patterned surface 104 having multiple recessed and/or raised features 107. Multiple semiconductor layers 111, 112 sandwiching a light emitting active region 115 are adjacent to the patterned surface 104, and may be deposited via vapor phase epitaxy or any other suitable deposition process. In one embodiment, a first semiconductor layer 111 proximate to the substrate 105 embodies an n-doped material (e.g., n-GaN), and the second semiconductor layer 112 embodies a p-doped material (e.g., p-GaN). A central portion of the multiple semiconductor layers 111, 112 including the active region 115 extends in a direction away from the substrate 105 to form a mesa 119 that is laterally bounded by at least one recess 129 containing a passivation material (e.g., silicon nitride as part of a passivation layer 140), and that is vertically bounded by surface extensions 111A of the first semiconductor layer 111.

A multi-layer reflector is arranged proximate to (e.g., on) the second semiconductor layer 112, with the multi-layer reflector consisting of a dielectric reflector layer 130 and a metal reflector layer 132. The dielectric reflector layer 130 is arranged between the metal reflector layer 132 and the second semiconductor layer 112. In certain embodiments, the dielectric reflector layer 130 comprises silicon dioxide, and the metal reflector layer 132 comprises silver. Numerous conductive vias 131-1, 131-2 are defined in the dielectric reflector layer 130 and are preferably arranged in contact between the second semiconductor layer 112 and the metal reflector layer 132. In certain embodiments, the conductive vias 131-1, 131-2 comprise substantially the same material(s) as the metal reflector layer 132. In certain embodiments, at least one of (preferably both) of the dielectric reflector layer 130 and the metal reflector layer 132 is arranged over substantially the entirety of a major surface of the mesa 119 terminated by the second semiconductor layer 112 (e.g., at least about 90%, at least about 92%, or at least about 95% of the major (e.g., lower) surface of the mesa portion of the second semiconductor layer 112).

A barrier layer 138 (including portions 138-1 and 138-2) is preferably provided between the metal reflector layer 132 and the passivation layer 140. In certain embodiments, the barrier layer 138 comprises sputtered Ti/Pt followed by evaporated Au, or comprises sputtered Ti/Ni followed by evaporated Ti/Au. In certain embodiments, the barrier layer 138 may function to prevent migration of metal from the metal reflector layer 132. The passivation layer 140 is arranged between the barrier layer 138 and (i) a first externally accessible electrical contact 151 and (ii) a second externally accessible electrical contact 152, which are both arranged along a lower surface 144 of the flip chip LED 100 separated by a gap 149. In certain embodiments, the passivation layer 140 comprises silicon nitride. The passivation layer 140 includes a metal-containing interlayer 145 arranged therein, wherein the interlayer 145 may include (or consist essentially of) Al or another suitable metal.

The LED 100 includes first and second arrays of microcontacts 153, 154 extending through the passivation layer 140, with the first array of microcontacts 153 providing conductive electrical communication between the first electrical contact 151 and the first doped (e.g., n-doped) semiconductor layer 111, and with the second array of microcontacts 154 providing conductive electrical communication between the second electrical contact 152 and the second (e.g., p-doped) semiconductor layer 112. The first array of microcontacts 153 extends from the first electrical contact 151 (e.g., n-contact) through the passivation layer 140, through openings defined in the interlayer 145, through openings 142 defined in a first portion 138-1 of the barrier layer 138, through openings defined in a first portion 132-1 of the metal reflector layer 132, through openings defined in a first portion 130-1 of the dielectric reflector layer 130, through the second semiconductor layer 112, and through the active region 115 to terminate in the first semiconductor layer 111. Within openings defined in the interlayer 145, the first portion 138-1 of the barrier layer 138, the first portion 132-1 of the metal reflector layer 132, and the first portion 130-1 of the dielectric reflector layer 130, dielectric material of the dielectric layer 130 laterally encapsulates the microcontacts 153 to prevent electrical contact between the microcontacts and the respective layers 145, 138, 132, 130. A set of vias 131-1 defined in the first portion 130-1 of the dielectric reflector layer 130 contacts the first portion 130-1 of the dielectric reflector layer 130 and the first semiconductor layer 112, which may be beneficial to promote current spreading in the active region 115. A second array of microcontacts 154 extends from the second electrical contact 152 through the passivation layer 140 and through openings defined in the interlayer 145 to at least one (i) a second portion 138-2 of the barrier layer 138, and (ii) a second portion 132-2 of the metal reflector layer 132, wherein electrical communication is established between the metal reflector layer 132 and the second semiconductor layer 112 through a set of vias 131-2 defined in a second portion of the dielectric reflector layer 130-2. Although a second array of microcontacts 154 is preferred in certain embodiments, in other embodiments, a single second microcontact may be substituted for the second array of microcontacts 154. Similarly, although it is preferred in certain embodiments to define multiple vias 131-2 in a second portion of the dielectric reflector layer 130-2, in other embodiments, a single via or other single conductive path may be substituted for the multiple vias 131-2.

Following formation of the passivation layer 140, one or more side portions 106 extending between an outer major surface 101 of the substrate 105 and surface extensions 111A of the first semiconductor layer 111 are not covered with passivation material. Such side portions 106 embody a non-passivated side surface.

Figure 3B:
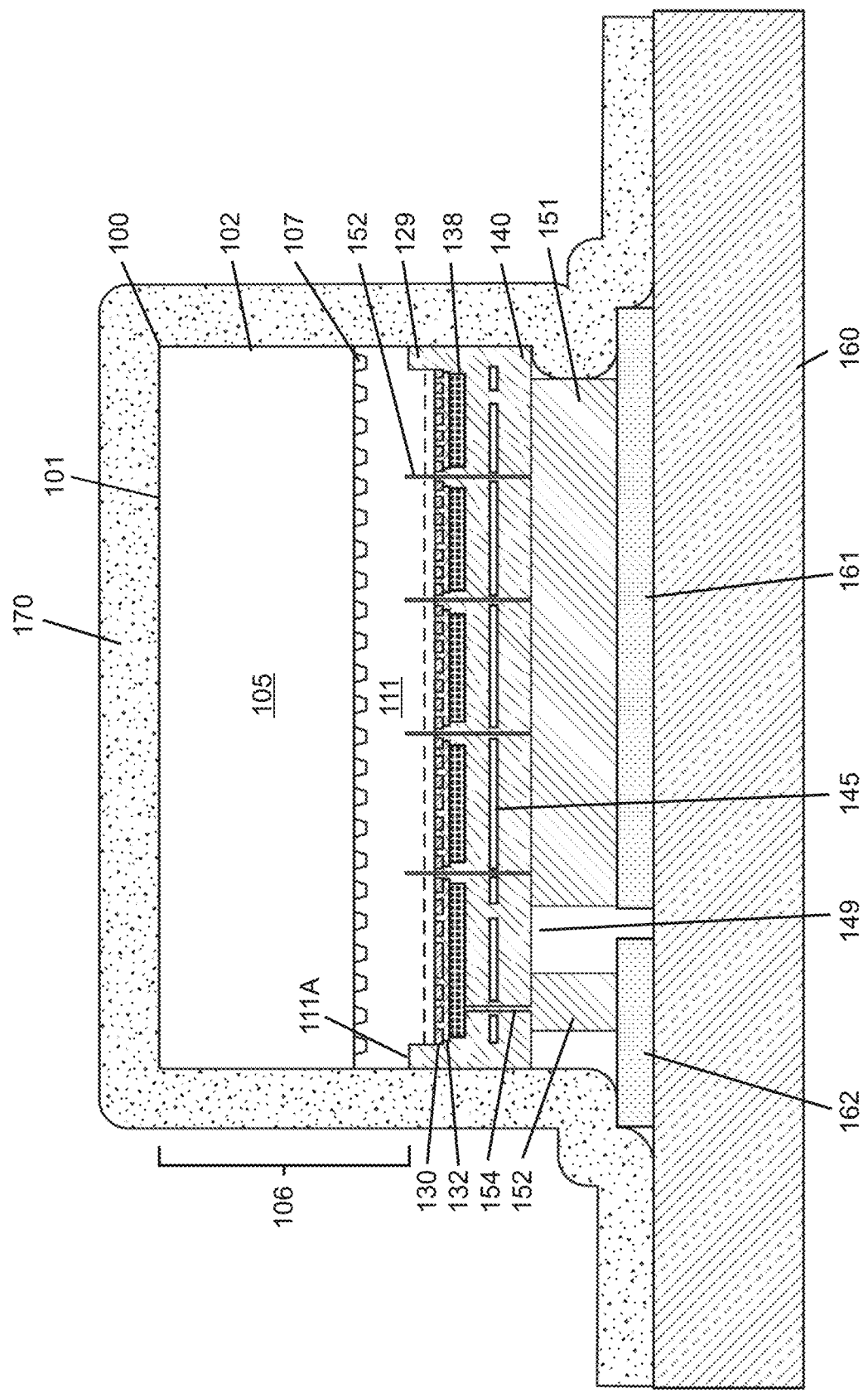
FIG. 3B is a side cross-sectional illustration of the LED of FIG. 3A mounted to a submount and covered with a layer of lumiphoric material.

FIG. 3B illustrates the flip chip LED 100 of FIG. 3A mounted to a submount 160 and covered with a layer of at least one lumiphoric material 170. The submount 160 includes first and second contact pads 161, 162 arranged proximate to the electrical contacts 151, 152, respectively. Solderless, soldered flux, or other conventional attachment means may be used to establish conductive electrical communication between the contact pads 161, 162, and the electrical contacts 151, 152, which are separated by a gap 149. As illustrated in FIG. 3B, the layer of at least one lumiphoric material 170 is arranged to cover the top surface 101, non-passivated side surfaces 106, and passivated side surfaces (i.e., side walls of passivation layer 140), as well as the submount 160.

With reference to FIGS. 3A and 3B, in operation of the flip chip LED 100, current may flow from the first electrical contact (e.g., n-contact or cathode) 151 (e.g., through contact pad 161), the first set of microcontacts 153, and the first (n-doped) semiconductor layer 111 into the active region 115 to generate light emissions. From the active region 115, current flows through the second (p-doped) semiconductor layer 112, vias 131-2, metal reflector layer portions 132-2, barrier layer portion 138-2, and the second set of microcontacts 154 to reach the second electrical contact (e.g., p-contact or anode) 152. Emissions generated by the active region 115 are initially propagated in all directions, with the reflector layers 130, 132 serving to reflect emissions in a direction generally toward the substrate 105. As emissions reach the light-transmissive patterned internal surface 104 arranged between the substrate 105 and the first semiconductor layer 111, recessed/raised features 107 arranged in or on the patterned internal surface 104 promote refraction rather than reflection at the internal surface 104, thereby increasing the opportunity for photons to pass from the first semiconductor layer 111 into the substrate 105 and thereafter exit the LED 100 through the top surfaces 101 and non-passivated side surfaces 106. When surfaces of the LED 100 are covered with one or more lumiphoric materials 170 (as shown in FIG. 3B), at least a portion of emissions emanating from the LED 100 may be up-converted or down-converted by the one or more lumiphoric materials 170.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of a LED, dispersal in an encapsulant material configured to cover one or more LEDs, and/or coating on one or more optical or support elements (e.g., by powder coating, inkjet printing, or the like). In certain embodiments, lumiphoric materials may be down-converting or up-converting, and combinations of both down-converting and up-converting materials may be provided. In certain embodiments, multiple different (e.g., compositionally different) lumiphoric materials arranged to produce different peak wavelengths may be arranged to receive emissions from one or more LED chips.

One or more lumiphoric materials may be provided on one or more portions of a flip chip LED and/or a submount in various configurations. In certain embodiments, one or more surfaces of flip chip LEDs may be conformally coated with one or more lumiphoric materials, while other surfaces of such LEDs and/or associated submounts may be devoid of lumiphoric material. In certain embodiments, a top surface of a flip chip LED may include lumiphoric material, while one or more side surfaces of a flip chip LED may be devoid of lumiphoric material. In certain embodiments, all or substantially all outer surfaces of a flip chip LED (e.g., other than contact-defining or mounting surfaces) are coated or otherwise covered with one or more lumiphoric materials. In certain embodiments, one or more lumiphoric materials may be provided arranged on or over one or more surfaces of a flip chip LED in a substantially uniform manner; in other embodiments, one or more lumiphoric materials may be provided arranged on or over one or more surfaces of a flip chip LED in a manner that is non-uniform with respect to one or more of material composition, concentration, and thickness. In certain embodiments, loading percentage of one or more lumiphoric materials may be varied on or among one or more outer surfaces of a flip chip LED. In certain embodiments, one or more lumiphoric materials may be patterned on portions of one or more surfaces of a flip chip LED to include one or more stripes, dots, curves, or polygonal shapes. In certain embodiments, multiple lumiphoric materials may be arranged in different discrete regions or discrete layers on or over a flip chip LED.

In certain embodiments, a lumiphoric material may be arranged over a light-transmissive surface of the substrate, and the substrate may comprise a thickness of at least 120 microns, at least 150 microns, at least 170 microns, at least 200 microns, at least 230 microns, at least 250 microns (with the preceding minimum thickness values optionally bounded at the upper end by any of the foregoing thickness values), or another thickness threshold specified herein. Without intending to be limited by any specific theory of operation, it is currently believed that providing a relatively thick substrate according to one or more of the preceding thickness thresholds may enhance conversion efficiency of a lumiphor-converted flip chip LED due to one or more of the following phenomena: (i) increasing physical separation (distance) between an outer major (e.g., top) surface of a substrate and the multi-layer mirror, and (ii) reducing luminous flux on lumiphoric material arranged on or over an outer surface of the substrate.

Benefits of reduced optical losses may be more pronounced and significant with larger LED die sizes (e.g., with substrate widths of at least about 1.2 mm, at least about 1.4 mm, at least about 2 mm, or larger). Larger die have a greater dependency on mirror reflectivity due to more interaction of light with an internal LED mirror before the light escapes. Benefits of reduced optical losses may also be more pronounced in producing warm white (versus cool white) emitters, since warm white emitters typically involve a greater amount of back reflection into a LED chip (e.g., due to conversion by multiple phosphor materials or material layers, such as a yellow layer and a red layer).

FIG. 4A illustrates a flip chip LED 200 according to another embodiment, the LED 200 including an internal light-transmissive surface 204 that is patterned proximate to semiconductor layers of the LED, and including a multi-layer reflector that is proximate to the semiconductor layers and "wraps around" peripheral portions of the semiconductor layers (including the active region). The LED 200 includes a light transmissive (preferably transparent) substrate 205 having an outer major surface 201, side surfaces 202, and patterned surface 204 having multiple recessed and/or raised features 207. Multiple (e.g., epitaxially deposited) semiconductor layers 211, 212 sandwiching a light emitting active region 215 are adjacent to the patterned surface 204. In one embodiment, a first semiconductor layer 211 proximate to the substrate 205 embodies an n-doped material (e.g., n-GaN), and the second semiconductor layer 212 embodies a p-doped material (e.g., p-GaN). A central portion of the multiple semiconductor layers 211, 212 including the active region 215 extends in a direction away from the substrate 205 to form a mesa 219 that is laterally bounded by at least one recess 229 containing a passivation material (e.g., silicon nitride as part of passivation layer 240), and that is vertically bounded by surface extensions 211A of the first semiconductor layer 211. The at least one recess 229 further includes peripheral "wrap-around" portions 230', 232' of a dielectric reflector layer 230 and a metal reflector layer 232, respectively.

The dielectric reflector layer 230 and metal reflector layer 232 in combination embody a multi-layer reflector. The dielectric reflector layer 230 is arranged between the metal reflector layer 232 and the second semiconductor layer 212. In certain embodiments, the dielectric reflector layer 230 comprises silicon dioxide, and the metal reflector layer 232 comprises silver. Numerous conductive vias 231-1, 231-2 are defined in the dielectric reflector layer 230 and are preferably arranged in contact between the second semiconductor layer 212 and the metal reflector layer 232. In certain embodiments, the conductive vias 231-1, 231-2 comprise substantially the same material(s) as the metal reflector layer 232. In certain embodiments, at least one of (preferably both) of the dielectric reflector layer 230 and the metal reflector layer 232 is arranged over substantially the entirety of a major surface of the mesa 219 terminated by the second semiconductor layer 212 (e.g., at least about 90%, at least about 92%, or at least about 95% of the major (e.g., lower) surface of the mesa portion of the second semiconductor layer 212).

As shown in FIG. 4A, the at least one recess 229 includes a peripheral "wrap-around" portion 230' of the dielectric reflector layer 230 that bounds peripheral portions of the second semiconductor layer 212, the active region 215, and a segment of the first semiconductor layer 211 forming the mesa 219. The "wrap-around" portion 230' of the dielectric reflector layer 230 further extends to and along a portion of surface extensions 211A of the first semiconductor layer 211. Additionally, the at least one recess 229 includes a peripheral "wrap-around" portion 232' of the metal reflector layer 232 that is arranged in contact with the "wrap-around" portion 230' of the dielectric reflector layer 230, and that extends past the active region 215, but does not contact the surface extensions 211A of the first semiconductor layer 211. Within the at least one recess 229, the "wrap-around" portions 230', 232' are peripherally bounded by passivation material of the passivation layer 240. Presence of passivation material (e.g., moisture resistant SiN) in the at least one recess 229 laterally covering the multi-layer reflector prevents exposure of any portions of the dielectric reflector layer 230 and metal reflector layer 232. If any portion of the dielectric reflector layer 230 (e.g., permeable material such as $SiO_2$) extended to an exposed edge of the LED 200, this would potentially provide a path for moisture to be drawn into contact with portions of the metal (e.g., Al-containing) reflector layer 232, which would be expected to lead to detrimental chemical interaction.

A barrier layer 238 (including portions 238-1 and 238-2) is preferably provided between the metal reflector layer 232 and the passivation layer 240. In certain embodiments, the barrier layer 238 may function to prevent migration of metal from the metal reflector layer 232, and may comprise sputtered Ti/Pt followed by evaporated Au, or comprise sputtered Ti/Ni followed by evaporated Ti/Au.

The passivation layer 240 is additionally arranged between the barrier layer 238 and (i) a first externally accessible electrical contact 251 and (ii) a second externally accessible electrical contact 252, with the contacts 251, 252 being arranged along a lower surface 244 of the flip chip LED 200 and separated by a gap 249. In certain embodiments, the passivation layer 240 comprises silicon nitride. The passivation layer 240 includes a metal-containing interlayer 245 arranged therein, wherein the interlayer 245 may include (or consist essentially of) Al or another suitable metal.

First and second arrays of microcontacts 253, 254 extend through the passivation layer 240, with the first array of microcontacts 253 providing conductive electrical communication between the first electrical contact 251 and the first doped (e.g., n-doped) semiconductor layer 211, and with the second array of microcontacts 254 providing conductive electrical communication between the second electrical contact 252 and the second (e.g., p-doped) semiconductor layer 212. The first array of microcontacts 253 extends from the first electrical contact 251 (e.g., n-contact) through the passivation layer 240, through openings defined in the interlayer 245, through openings 242 defined in a first portion 238-1 of the barrier layer 238, through openings defined in a first portion 232-1 of the metal reflector layer 232, through openings defined in a first portion 230-1 of the dielectric reflector layer 230, through the second semiconductor layer 212, and through the active region 215 to terminate in the first semiconductor layer 211. Within openings defined in the interlayer 245, the first portion 238-1 of the barrier layer 238, the first portion 232-1 of the metal reflector layer 232, and the first portion 230-1 of the dielectric reflector layer 230, dielectric material of the dielectric reflector layer 230 laterally encapsulates the microcontacts 253 to prevent electrical contact between the microcontacts and the respective layers 245, 238, 232, 230. A set of vias 231-1 defined in the first portion 230-1 of the dielectric reflector layer 230 contacts the first portion 230-1 of the dielectric reflector layer 230 and the first semiconductor layer 212, which may be beneficial to promote current spreading in the active region 215. The second array of microcontacts 254 extends from the second electrical contact 252 through the passivation layer 240 and through openings defined in the interlayer 245 to at least one (i) a second portion 238-2 of the barrier layer 238, and (ii) a second portion 232-2 of the metal reflector layer 232, wherein electrical communication is established between the metal reflector layer 232 and the second semiconductor layer 212 through a set of vias 231-2 defined in a second portion of the dielectric reflector layer 230-2.

Following formation of the passivation layer 240, one or more side portions 206 extending between an outer surface 201 of the substrate 205 and surface extensions 211A of the first semiconductor layer 211 are not covered with passivation material. Such side portions 206 embody non-passivated side surfaces.

Figure 4B:
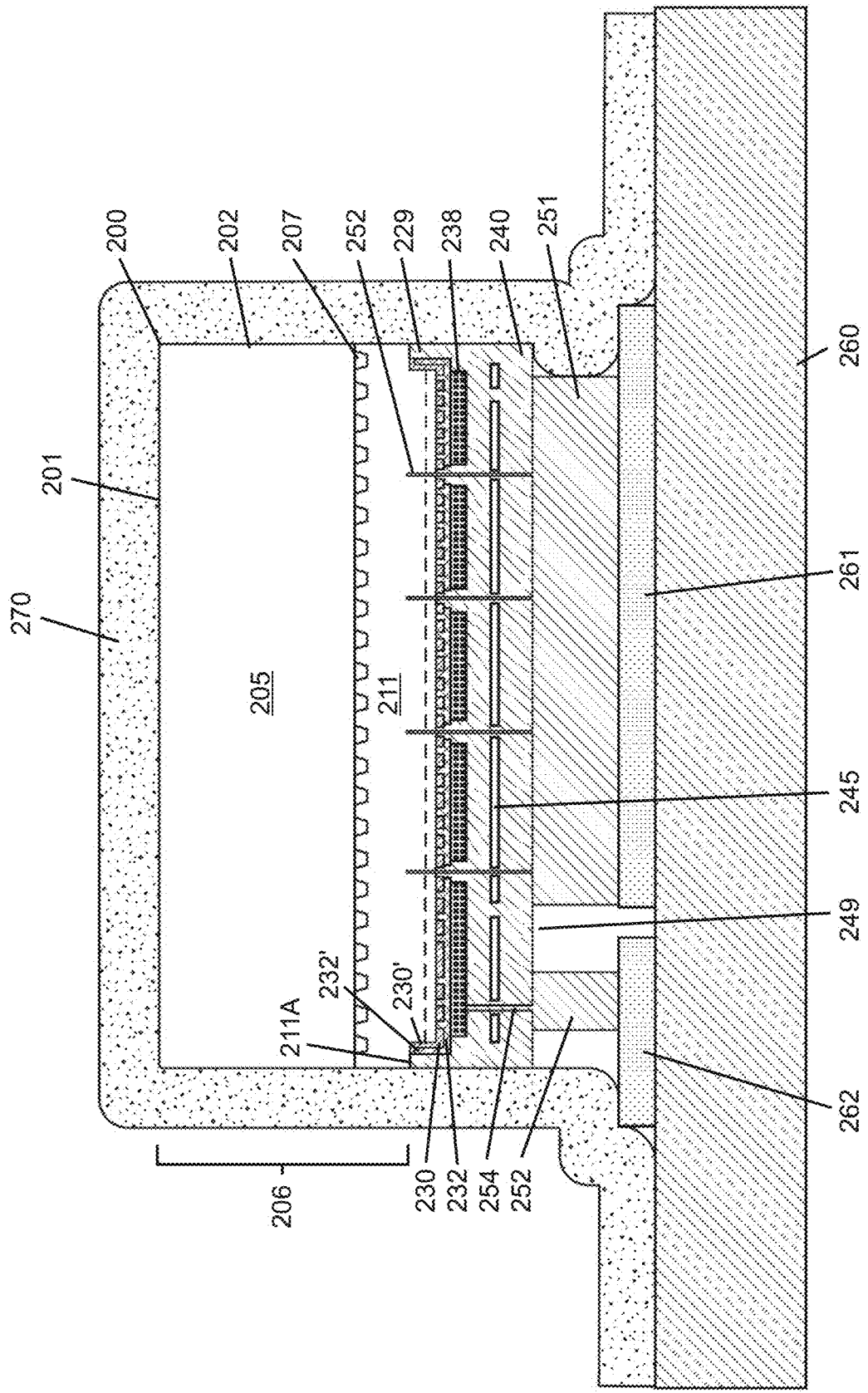
FIG. 4B is a side cross-sectional illustration of the LED of FIG. 4A mounted to a submount and covered with a layer of at least one lumiphoric material.

FIG. 4B illustrates the flip chip LED 200 of FIG. 4A mounted to a submount 260 and covered with a layer of at least one lumiphoric material 270. The submount 260 includes first and second contact pads 261, 262 arranged proximate to the electrical contacts 251, 252, respectively. Solder flux (not shown) or other conventional means may be used to establish conductive electrical communication between the contact pads 261, 262 and the electrical contacts 251, 252. As illustrated in FIG. 4B, the layer of at least one lumiphoric material 270 is arranged to cover the top surface 201, non-passivated side surfaces 206, and passivated side surfaces (i.e., side walls of passivation layer 240), as well as the submount 260.

Electrical operation of the flip chip LED 200 is substantially the same as described in connection with the LED 100 disclosed in connection with FIGS. 2A and 2B. Supplying current between the first and second electrical contacts 251, 252 results in generation of light emissions by the active region 215. Emissions generated by the active region 215 are initially propagated in all directions, with the reflector layers 230, 232 serving to reflect emissions in a direction generally toward the substrate 205. As emissions reach the internal light-transmissive patterned surface 204 arranged between the substrate 205 and the first semiconductor layer 211, recessed/raised patterned features 207 arranged in or on the internal patterned surface 204 promote refraction rather than reflection at the internal patterned surface 204, thereby increasing the opportunity for photons to pass from the first semiconductor layer 211 into the substrate 205 and thereafter exit the LED 200 through the top surfaces 201 and non-passivated side surfaces 206. When surfaces of the LED 200 are covered with one or more lumiphoric materials 270 (as shown in FIG. 4B), at least a portion of emissions emanating from the flip chip LED 200 may be up-converted or down-converted by the one or more lumiphoric materials 270. Although a substantially uniform thickness layer of lumiphoric material(s) 270 covering the entire flip chip LED 200 and the submount 260 is shown in FIG. 4B, it is to be appreciated that in certain embodiments one or more lumiphoric materials may be provided according to any suitable configuration disclosed herein.

FIG. 5 is a photograph of a magnified portion of an assembly including four flip chip LEDs (pictured in different quadrants) accordingly to FIG. 4A during manufacture thereof, viewed through top surfaces of clear substrates, prior to dicing to separate the LED chips from one another. Upper and lower portions of FIG. 5 show first and second arrays of microcontacts 253, 254, as well as a "wrap around" portion 230' of a dielectric reflector layer 230 and passivation material 240 arranged in a recess 229. A separation region 289 lacking passivation material is provided between different flip chip LEDs, with the separation region 289 being subject to elimination during a dicing operation in which the LEDs may be separated.

Although FIGS. 3A-4B illustrated flip chip LEDs having substantially flat outer major surfaces and substantially perpendicular sidewalls, in certain embodiments, a flip chip LED may include a non-flat (e.g., patterned, roughened, textured, or trench-defining) major outer surface and/or sidewalls that are non-perpendicular (sloped) relative to a major (e.g., top) outer surface. Such features may further enhance light extraction and/or beam shaping while incorporating the benefits of an internally patterned substrate and an internal multi-layer reflector as described hereinabove.

FIGS. 6A-6C illustrate top, side, and bottom views, respectively, of a flip chip LED 300 including a substrate 305 with an outer surface including sloped sidewalls 302 and a groove-defining top surface 301 (e.g., containing an X-shaped groove 303) according to one embodiment. A lumiphoric material layer is not illustrated, but it is to be appreciated that the flip chip LED 300 may include a lumiphoric material in certain embodiments. An internal light-transmissive surface 304 of the substrate 305 is square in shape (e.g., with sides that may be about 1 mm in length) and is patterned to include multiple recessed and/or raised features. The top surface 301 has a smaller area with sides that are shorter (e.g., about 642 microns in length) than sides of the internal surface 304, to define an area ratio between the outer surface and the inner surface of about 0.41. In certain embodiments, an area ratio of an outer surface to the inner surface is in a range of from about 0.3 to about 0.45. In certain embodiments, a substrate may be larger, such as a square shape having side lengths in a range of from 1.15 to 2.5 mm or greater, in a range of from 1.4 mm to 2.0 mm or greater, or another desirable range. A functional region 339 preferably includes various features as previously described herein, including semiconductor layers containing an active region, a multi-layer reflector, a barrier layer, a passivation layer, an interlayer, and first and second arrays of microcontacts, and so on; however, such regions are not shown to avoid unnecessary repetition. A bottom surface of the flip chip LED 300 includes a cathode contact 351 and an anode contact 352 separated by a gap 349, which is preferably less than about 100 microns (e.g., in a range of from 10 to 100 microns, or in a range of from 50 to 75 microns). In certain embodiments, a total attach area (i.e., a combined surface area of the contacts 351, 352) may be greater than 70%, greater than 80%, or greater than 90% of a total surface area of a lower surface 344 of the flip chip LED 300.

In certain embodiments, one or more flip chip LEDs as disclosed herein may be mounted or otherwise contained in a LED package, which may include one or more of the following features: a single submount or mounting element supporting one or more LEDs; a single leadframe arranged to conduct electrical power to one or more LEDs; a single reflector (external to one or more LEDs) arranged to reflect at least a portion of emissions received from one or more LEDs; a single lens arranged to transmit at least a portion of emissions generated by one or more LEDs; a single diffuser arranged to diffuse at least a portion of emissions generated by one or more LEDs; a single heat spreader or heat sink arranged to distribute or transfer heat generated by one or more LEDs; a single pair of LED mounting pads arranged for electrical coupling to one or more LEDs; and a single electrostatic discharge protection element arranged to provide electrostatic discharge protection for one or more LEDs.

FIGS. 7A-7B illustrate a LED package 399 according to one embodiment, including a single flip chip LED 300 according to FIGS. 6A-6C. The flip chip LED 300 includes a top surface 301 defining an X-shaped groove 303, with sloping (non-perpendicular) sidewalls 302 extending to a square-shaped base. The LED package 399 includes a generally square-shaped (e.g., alumina ceramic) submount 360 with an cathode pad 361 and an anode pad 362 separated by a gap 396. The flip chip LED 300 is mounted to bridge the gap 396 in electrical communication with the cathode pad 361 and the anode pad 362. A lens 390 is arranged over the flip chip LED 300 and the cathode and anode pads 361, 362, with the lens 390 including a hemispheric central portion and a square-shaped base portion. A bottom surface of the submount 360 has arranged thereon cathode and anode contacts 371, 372 (which are electrically coupled to the top side cathode and anode pads 361, 362, respectively, by internal vias (not shown)). A heat spreader 379 is further arranged along the bottom surface of the submount 360 between the cathode and anode contacts 371, 372.

In certain embodiments, a lighting device may include an array of multiple flip chip LEDs as disclosed herein. Such a lighting device may include a LED package, a light bulb, a light fixture, a luminaire, or the like.

FIGS. 8A-8B illustrate plan and cross-sectional views of an array of six flip chip LED die 400A-400F electrically coupled in parallel between cathode and anode pads 484, 486 of a submount 480. In certain embodiments, LEDs may be coupled in series, or in series-parallel configurations. An electrostatic discharge (ESD) protection device 494 may be electrically coupled between the cathode and anode pads 484, 486. As shown portions of an anode pad 486 may extend between opposing portions of a cathode pad 484, with the flip chip LED die bridging a gap 496 defined therebetween. Gaps 496 between cathode and anode pads 484, 486 may be filled with a reflective insulating filler material 492, thereby reducing absorption of light by the submount 480. In certain embodiments, all LED die 400A-400F may be provided under or within a single lens 490. Electrical contacts 451B, 452B, 451E, 452E may be joined to the cathode and anode pads 484, 486 with solder flux 488. As shown in FIG. 8B, the flip chip LEDs 400B, 400E each include a conformally coated lumiphoric material layer 470B, 470E (arranged solely over the upper and side wall surfaces of the LEDs); however, in other embodiments, one or more lumiphoric materials may be provided according to any suitable configuration disclosed herein (e.g., overlying all LEDs as well as portions of the cathode and anode pads 484, 486 and/or the submount 480).

In certain embodiments, one or more flip chip LEDs may be arranged in a surface mount device, wherein component layers are mounted or place directly onto the surface of printed circuit boards (PCBs) or other mounting elements without the need for intervening submounts.

To evaluate potential benefits of the disclosure, flip chip LEDs incorporating multi-layer reflectors as described herein and incorporating internally patterned 1.15 mm square sapphire substrates were constructed and compared to conventional flip chip LEDs produced by a process including bonding an assembly including a growth substrate and epitaxial layers to a carrier substrate with a reflective layer between the carrier substrate and the epitaxial layers, followed by removal of the growth substrate and top surface patterning or texturing of an exposed epitaxial layer surface, with such conventional device features being described in U.S. Patent Application Publication No. 2008/0179611 to Chitnis et al. (which is hereby incorporated by reference herein). During fabrication, the flip chip LEDs incorporating internally patterned sapphire substrates were annealed at elevated temperature after epitaxial growth for a period of at least 20 minutes in a nitrogen atmosphere. Each LED included a blue peak wavelength of 447 nm, was arranged to stimulate emissions of a yellow phosphor material, and provided aggregate emissions having a color rendering index (CRI) value of 80 at a temperature of 85° C. FIG. 9 is a plot of K-factor values (representing a ratio of white brightness (lumens) to blue brightness (lumens)) for the respective flip chip LEDs, wherein a higher K-factor represents greater white conversion efficiency. As shown in FIG. 9, a 3.6% improvement in K-factor (white conversion efficiency) was obtained with the new flip chip LED device incorporating an internally patterned sapphire substrate versus a comparison flip chip LED device produced by a process including bonding an assembly including a growth substrate and epitaxial layers to a carrier substrate with a reflective layer between the carrier substrate and the epitaxial layers, followed by removal of the growth substrate and top surface patterning or texturing of an exposed epitaxial layer surface. This improvement in K-factor means that the new flip chip LED device incorporating an internally patterned sapphire substrate exhibited measurably improved conversion of blue light to white light than the comparison flip chip LED device. It is noted that the new flip chip LED device incorporating an internally patterned sapphire substrate does not require removal of epitaxial layers from a (SiC) growth substrate followed by bonding to a carrier substrate with a reflective layer intermediately arranged between the epitaxial layers and the carrier substrate, and entails fewer manufacturing steps with lower cost. Embodiments described herein may therefore permit attainment of high performance levels at reduced cost.

FIG. 10 is a plot of normalized luminous flux at three different target color rendering (E2: 70 CRI, E5: 75 CRI, E7: 80 CRI) for a comparison flip chip LED produced by a process including removal of epitaxial layers from a growth substrate and bonding to a carrier with a reflective intermediate layer and for a flip chip LED incorporating an internally patterned sapphire substrate according to one embodiment. Different CRI values for the respective E-values were obtained by combining emitters with different phosphors or phosphor combinations. Each type of LED was normalized to its E2 brightness; thus, a value of 1 is obtained for each E2 value. As shown in FIG. 10, the novel flip chip LED incorporating an internally patterned sapphire substrate exhibited a smaller loss of luminous flux when combined with phosphors yielding a higher CRI value. This suggests that benefits of reduced optical losses associated with the novel internally patterned (e.g., sapphire) substrate in combination with a multi-layer mirror are more pronounced in producing warm white (versus cool white) emitters, since warm white emitters typically involve a greater amount of back reflection into a LED chip (e.g., due to conversion by multiple phosphor materials or material layers, such as yellow and red phosphors).

Flip chips typically include a top emitting surface and one or more edge emitting surfaces peripherally bounding the top emitting surface. As noted previously, it can be challenging to achieve one or more of the following goals when adding lumiphoric material to solid state light emitter chips (including flip chips): (a) ensuring adequate coverage of edge emitting chip surfaces and edge boundaries (thereby avoiding leakage of unconverted emissions); (b) avoiding undesirable far field light characteristics; and (c) reducing luminous flux loss when diffusely reflective materials are coated on submounts around emitter chips. With respect to issue (a), the inventors have found that conventional vertical spray coating (using a spray nozzle arranged to discharge lumiphoric material in a direction perpendicular to a top emitting surface) is not well-suited for depositing lumiphoric material on edge emitting surfaces and edge boundaries, such that portions of edge surfaces and corners may not be completely covered (or not uniformly covered) with lumiphoric material. When lumiphoric material coverage is inconsistent or incomplete, undesirable leakage of unconverted emissions may result in selected areas. With respect to issue (b), when a lumiphor-converted solid state light emitter flip chip including edge emitting chip surfaces is supported by a submount or other substrate, the presence of extraneous lumiphoric material on a surface of the submount or substrate apart from the flip chip may cause the extraneous lumiphoric material to generate additional emissions that interfere with producing desirable or consistent far field light characteristics. With respect to issue (c), the addition of diffusely reflective materials (e.g., titanium dioxide) on light emitting device surfaces proximate to edge emitting surfaces of an emitter chip may reduce overall luminous flux if the diffusely reflective materials overlie the edge emitting surfaces. Various embodiments described hereinafter address one or more of the foregoing issues.

FIG. 11 is a schematic illustration of an apparatus for perpendicular spray coating of a solid state light emitter chip supported by a substrate. A spray nozzle 509 may be used to spray a composition including lumiphoric material over a solid state light emitter chip 501 supported by a submount or substrate 500, with the emitter chip 501 including a top emitting surface 502 and edge emitting surfaces 503. When the spray nozzle 509 is conventionally oriented to spray lumiphoric material in a direction perpendicular to the top emitting surface 502, it may be difficult to ensure that the edge emitting surfaces 503 (as well as corners and transitions between the top emitting surface 502 and the edge emitting surfaces 503) are completely and/or substantially uniformly covered with lumiphoric material. As a result, undesirable leakage of unconverted emissions may result in selected areas along the edge emitting surfaces 503 and/or corners and transitions.

To overcome limitations associated with conventional perpendicular spray coating methods for adding lumiphoric materials to solid state light emitter chips (including flip chips), an angled spray coating method was developed by the inventors. According to such method, one or more spray nozzles oriented non-perpendicular to a top emitting surface of one or more solid state light emitter chips may be used to spray top and edge emitting surfaces of one or more solid state light emitter chips, preferably in conjunction with relative translation between the angled spray nozzles and the emitter chips. In certain embodiments, one or more spray nozzles may be used to spray a coating composition comprising at least one lumiphoric material in a first direction over at least some emitting surfaces of one or more solid state emitter chips, and may be used to spray a coating composition comprising at least one lumiphoric material in a second direction over at least some emitting surfaces of one or more solid state emitter chips, wherein the second direction differs from the first direction, and each of the first direction and the second direction is non-perpendicular to a top emitting surface of one or more solid state light emitter chips. In certain embodiments, each of the first direction and second direction differs from a plane defined by a top surface of the one or more solid state emitter chips by an angular range of from about 10 degrees to about 80 degrees, or from about 20 degrees to about 70 degrees, or from about 30 degrees to about 60 degrees, or from about 35 degrees to about 55 degrees, of from about 45 to 50 degrees. In certain embodiments, spray uniformity on surfaces of at least one solid state emitter chip may be controlled by modifying the incoming spray angle. In certain embodiments, relative translation may be effected between one or more angled spray nozzles and one or more emitter chips, and multiple spray passes may be used. In certain embodiments, one or more angled spray steps may be preceded, followed, or used simultaneously with one or more perpendicular or vertical spray steps. In certain embodiments, following one or more spray passes in a first direction, a workpiece or substrate carrying one or more solid state emitters and/or one or more spray nozzles, may be translated and/or rotated prior to initiation of one or more spray passes in a second direction. In certain embodiments, a mixture of different lumiphoric materials (e.g., yellow/green and orange/red lumiphors) may be contained in a single coating composition used to coat one or more solid state light emitter chips. Other combinations of lumiphors may be used.

In certain embodiments, a combination of top (vertical) and angled spray steps may include an array of offset lines for area coverage over an array of solid state light emitter flip chips. In certain embodiments, a combination of top (vertical) and angled spray steps may include at least one initial top spray pass, multiple angled spray passes with at least one rotation of a panel supporting an array of solid state light emitter flip chips, and at least one subsequent top spray pass. In certain embodiments, a combination of top (vertical) and angled spray steps may include at least two initial top spray passes, at least four angled spray passes with rotation of a panel supporting an array of solid state light emitter flip chips (e.g., during the second and third angled spray passes), and at least two subsequent top spray passes.

In certain embodiments involving spray coating of one or more lumiphoric materials over solid state light emitter chips, a heated panel spray process such as disclosed in U.S. Pat. No. 8,940,561 (which is hereby incorporated by reference herein) may be used.

FIG. 12A is a schematic illustration of an apparatus for angled spray coating of multiple solid state light emitter flip chips 511 supported by a substrate 510, wherein each flip chip 511 includes a top emitting surface 512, at least one side emitting surface 513, and bottom contacts 514. One or multiple spray nozzles 519A, 519B is arranged above the flip chips 511 and oriented non-perpendicular to the top emitting surface 512, being angled at angle "A" (preferably in a range of from 10 degrees to about 80 degrees or another range disclosed herein) relative to the top emitting surface 512. In certain embodiments, one or more perpendicular spray nozzles 519C may be used in addition to, or in place of, one of the angled spray nozzles 519A, 519B. As shown in FIG. 12A, a first spray nozzle 519A may be oriented in a first direction, and one or more second spray nozzles 519B, 519C may be oriented in a second direction, wherein the second direction differs from the first direction, and at least one of first direction and the second direction is non-perpendicular to the top emitting surface 512. In certain embodiments, both angled spray coating and perpendicular spray coating steps may be used, either simultaneously or according to different passes of spray nozzles over one or more solid state light emitter chips. In certain embodiments, the number of angled spray passes and/or the number of angled spray nozzles may be substantially the same as the number of perpendicular (top) spray passes and/or the number of perpendicular (top) spray nozzles used to coat one or more solid state light emitter chips; in other embodiments, the number of angled spray passes and/or the number of angled spray nozzles may be greater than or less than a comparable number of perpendicular spray passes and/or perpendicular spray nozzles used to coat one or more solid state emitter chips. In certain embodiments, one or multiple spray nozzles may be used, and relative movement between the spray head(s) and/or a panel or substrate supporting emitter chips may be used to permit the spray nozzle(s) to coat portions of emitter chips from different directions. FIG. 12B is a side cross-sectional schematic view of multiple solid state light emitter flip chips 511 supported by a substrate 510 following spray coating of a lumiphoric material 516 over the substrate 510 as well as the top emitting surface 512 and edge emitting surfaces 513 of each chip 511 using at least one angled spray coating step (optionally in conjunction with at least one top or perpendicular spray coating step). Use of an angled spray coating method as disclosed herein permits improved coverage of edge emitting surfaces as well as corners and transitions (between edge emitting surfaces and top emitting surfaces) with one or more lumiphoric materials.

FIG. 13 is a schematic illustration of an apparatus for angled spray coating of a solid state light emitter flip chip 541 supported by a substrate 540 with angled spray nozzles 549A, 549B directed toward different (upper) corners of the flip chip 541. Such method permits each nozzle to simultaneously coat multiple edge emitting surfaces 543 of the flip chip 541 as well as at least a portion of the top emitting surface 542. In certain embodiments, a perpendicular spray nozzle (not shown) may additionally be used to coat lumiphoric material over the top emitting surface 542. Although FIG. 13 illustrates two angled spray nozzles 549A, 549B, in certain embodiments a single angled spray nozzle may be used to coat at least one flip chip with multiple passes from opposing corners of the at least one flip chip. In such an embodiment, at least one flip chip may be rotated (e.g., by rotating a panel or substrate supporting the at least one flip chip) between angled spray passes to permit one angled spray nozzle to coat at least one flip chip from multiple directions (e.g., over different corners of the same flip chip(s)).

In certain embodiments utilizing angled spray coating, a method is provided for producing a lumiphor-converted solid state light emitting device including a solid state emitter chip comprising multiple emitting surfaces including a top emitting surface and including at least one edge emitting surface arranged along a perimeter of the top emitting surface. The method comprises utilizing at least one spray nozzle to spray a coating composition comprising at least one lumiphoric material in a first direction over at least some surfaces of the multiple emitting surfaces; and utilizing the at least one spray nozzle to spray a coating composition comprising at least one lumiphoric material in a second direction over at least some surfaces of the multiple emitting surfaces; wherein the first direction differs from the second direction, and at least one of the first direction and the second direction is non-perpendicular to the top emitting surface. In certain embodiments, the first direction is angled in a range of from 10 degrees to 80 degrees from the top emitting surface. In certain embodiments, both the first direction and the second direction are non-perpendicular to the top emitting surface. In certain embodiments, the first direction or the second direction may be perpendicular to the top emitting surface. In certain embodiments, the method further includes dispensing a light-transmissive fillet-forming material to contact the at least one edge emitting surface and to contact a substrate underlying the solid state emitter chip, thereby producing a fillet along the at least one edge emitting surface, wherein said utilizing of at least one spray nozzle to spray a coating composition comprising at least one lumiphoric material in a first direction and in a second direction includes spraying the coating composition over the fillet. In certain embodiments, the fillet comprises a maximum height proximate to the at least one edge emitting surface, the fillet comprises a minimum height distal from the at least one edge emitting surface, and the maximum height is no higher than a level of the top emitting surface. In certain embodiments, the fillet-forming material comprises silicone and/or at least one lumiphoric material. In certain embodiments, the method further includes effecting relative movement between the at least one spray nozzle and the solid state emitter chip during said utilizing of the at least one spray nozzle to spray a coating composition comprising at least one lumiphoric material in a first direction and in a second direction. In certain embodiments, the solid state emitter chip comprises a flip chip, as disclosed herein.

As an alternative or in addition to the use of an angled spray coating method, one or more light-transmissive fillets may be formed along edge emitting surfaces of one or more solid state emitter chips to improve completeness and/or uniformity of coating of edge emitting surfaces with one or more lumiphoric materials. A fillet acts as a leveling element to produce a less abrupt and more gradual transition between edge emitting surfaces of a solid state emitter chip and an adjacent top surface of a submount or substrate supporting the solid state emitter chip. Following formation of a fillet around a perimeter of a solid state emitter chip, the fillet as well as the top emitting surface of the emitter chip may be spray coated with one or more lumiphoric materials. In certain embodiments, spray coating of lumiphoric material over a fillet (and a top emitting surface) may be performed with one or more spray nozzles arranged perpendicular to a top emitting surface of a solid state emitter chip. In other embodiments, spray coating of lumiphoric material over a fillet (and a top emitter surface) may be performed with one or more spray nozzles arranged non-perpendicular to a top emitting surface of a solid state emitter chip. In certain embodiments, a fillet may be formed by dispensing a fillet-forming material such as silicone around edge emitting surfaces of a solid state emitter chip, then permitting the fillet material to wick around the perimeter of the solid state emitter and cure (harden). In certain embodiments, a fillet material includes a maximum height proximate to the at least one edge emitting surface and includes a minimum height distal from the at least one edge emitting surface, wherein the maximum height is no higher than a level of the top emitting surface. In certain embodiments, a fillet may be transparent in character. In other embodiments, a fillet may include one or more lumiphoric materials arranged to convert a wavelength of light received from a solid state light emitter chip. Whether or not a fillet contains lumiphoric material, the fillet may be overlaid with an additional coating of one or more lumiphoric materials.

FIG. 14A is a side cross-sectional schematic view of a solid state light emitter flip chip 521 (including a top emitting surface 522, edge emitting surfaces 523, and bottom contacts 524) supported by a substrate 520, with a light-transmissive transparent fillet material 525 arranged around a perimeter of the chip 521 and in contact with edge emitting surfaces 523 of the chip 521. As shown in FIG. 14A, the fillet material 525 includes a maximum height proximate to an edge emitting surface 523 and includes a minimum height distal from the edge emitting surface 523, wherein the maximum height is no higher than a level of the top emitting surface 522. FIG. 14B is a side cross-sectional schematic view of the chip 521 and fillet material 525 of FIG. 14A overlaid with a coating of a lumiphoric material 526. Presence of the fillet material 525 permits improved coverage of the emitter chip 521 with the layer 526 of one or more lumiphoric materials, thereby reducing or eliminating leakage of unconverted light (i.e., light emitted by the solid state emitter chip 521 not passing through the lumiphoric material layer 526).

In certain embodiments, a solid state lighting device comprises a submount; a solid state emitter chip supported by the submount, the solid state emitter chip comprising multiple emitting surfaces including a top emitting surface and including at least one edge emitting surface arranged along a perimeter of the top emitting surface; and a light-transmissive fillet material arranged on or above the submount around a perimeter of the solid state emitter chip, and arranged in contact with the at least one edge emitting surface. Presence of a fillet material along the at least one edge emitting surface may facilitate coating (e.g., spray coating) of a lumiphoric material (e.g., phosphor) over the at least one edge emitting surface. In certain embodiments, at least one lumiphoric material is arranged over the top emitting surface and over at least a portion of the fillet material. In certain embodiments, the fillet material comprises a maximum height proximate to the at least one edge emitting surface, the fillet material comprises a minimum height distal from the at least one edge emitting surface, and the maximum height is no higher than a level of the top emitting surface. In certain embodiments, the fillet material comprises silicone and/or at least one lumiphoric material. In certain embodiments, the solid state emitter chip comprises a flip chip, as disclosed herein.

FIG. 15A is a side cross-sectional schematic view of a solid state light emitter flip chip 531 (including a top emitting surface 532, edge emitting surfaces 533, and bottom contacts 534) supported by a substrate 530, with a light-transmissive fillet material 535 including at least one lumiphoric material arranged around a perimeter of the chip 531 and in contact with edge emitting surfaces 533 of the chip 531. As shown in FIG. 15A, the fillet 535 includes a maximum height proximate to an edge emitting surface 533 and includes a minimum height distal from the edge emitting surface 533, wherein the maximum height is no higher than a level of the top emitting surface 532. FIG. 15B is a side cross-sectional schematic view of the chip 531 and fillet 535 of FIG. 15A overlaid with a coating of a lumiphoric material 536. Presence of the fillet 535 permits improved coverage of the emitter chip 531 with lumiphoric material (including lumiphoric material contained in the fillet material 535 and lumiphoric material contained in the overlying lumiphoric material layer 536), thereby reducing or eliminating leakage of unconverted light (i.e., light emitted by the solid state emitter chip 531 not subject to interaction with lumiphoric materials contained in the fillet material 535 or the lumiphoric material layer 536. In certain embodiments, one or more of lumiphoric material composition, lumiphoric material concentration, and lumiphoric material particle size may differ between the fillet 535 and the lumiphoric material layer 536. In other embodiments, some or all of lumiphoric material composition, lumiphoric material concentration, and lumiphoric material particle size may be substantially the same in the fillet 535 and the lumiphoric material layer 536.

FIG. 16A is a top view photograph of a light emitting device including a solid state light emitter flip chip 551 and an electrostatic discharge (ESD) chip 559 mounted to a submount 550, prior to formation of a fillet. FIG. 16B is a top view photograph of a light emitting device according to FIG. 16A following formation of a light-transmissive transparent fillet 555 arranged on the submount 550 around a perimeter of the flip chip 551 and arranged in contact with edge emitting surfaces of the flip chip 551. The fillet 555 may contact the ESD chip 559. The fillet 555 acts as a leveling element to produce a less abrupt and more gradual transition between edge emitting surfaces of the flip chip 551 and the submount 550.

FIG. 17A is a top view photograph of a light emitting device including a solid state light emitter flip chip 561 following addition of a light-transmissive fillet 565 that includes a lumiphoric material arranged on the submount 560 around a perimeter of the flip chip 561 and arranged in contact with edge emitting surfaces of the flip chip 561. FIG. 17B is a top view photograph of the light emitting device of FIG. 17A following spray coating of a lumiphoric material 566 over the flip chip 561, over the fillet 565, and over the submount 560.

FIG. 18 is a top view photograph of six interconnected light emitting devices each including a hemispherical lens overlying a coating of lumiphoric material and a solid state light emitter flip chip supported by a submount, with each device being devoid of a fillet material between the flip chip and the submount. A rectangular outline of each flip chip is visible under each hemispherical lens.

FIG. 19 is a top view photograph of six interconnected light emitting devices each including a hemispherical lens overlying a coating of lumiphoric material and a solid state light emitter flip chip supported by a submount, with each device including a fillet peripherally arranged around the flip chip to contact the submount. Since each fillet acts as a leveling element to produce a less abrupt and more gradual transition between edge emitting surfaces of the flip chip and the submount, the outline of each rectangular flip chip is not visible under each hemispherical lens in FIG. 19.

In certain embodiments, a method is provided for producing a lumiphor-converted solid state light emitting device including a solid state emitter chip comprising multiple emitting surfaces including a top emitting surface and including at least one edge emitting surface arranged along a perimeter of the top emitting surface. The method comprises dispensing a fillet-forming material to contact the at least one edge emitting surface and to contact a substrate underlying the solid state emitter chip, and thereby producing a fillet along the at least one edge emitting surface; and utilizing at least one spray nozzle to spray a coating composition comprising at least one lumiphoric material over the top emitting surface and the fillet. In certain embodiments, the fillet comprises a maximum height proximate to the at least one edge emitting surface, the fillet comprises a minimum height distal from the at least one edge emitting surface, and the maximum height is below the top emitting surface. In certain embodiments, the utilizing of the at least one spray nozzle includes spraying the coating composition in a first direction over the top emitting surface and the fillet, and includes spraying the coating composition in a second direction over the top emitting surface and the fillet, wherein the first direction differs from the second direction, and each of the first direction and the second direction is non-perpendicular to the top emitting surface. In certain embodiments, the fillet-forming material comprises silicone and/or at least one lumiphoric material. In certain embodiments, the solid state emitter chip comprises a flip chip, as disclosed herein.

As noted previously, when a lumiphor-converted solid state light emitter flip chip including edge emitting chip surfaces is supported by a submount or other substrate, the presence of extraneous lumiphoric material on a surface of the submount or substrate apart from the flip chip may cause the extraneous lumiphoric material to generate additional emissions that interfere with producing desirable or consistent far field light characteristics. To address this issue, the inventors developed a method utilizing a stencil to selectively produce islands of lumiphoric material covering one or more emitting surfaces of a solid state light emitter chip (e.g., a flip chip) while preventing an adjacent surface of a submount or substrate from being coated with lumiphoric material. Such a method involves producing a stencil defining one or more windows corresponding to one or more solid state emitter chips, registering the stencil with substrate or submount supporting one or more solid state emitter chips to expose surfaces of one or more solid state emitter chips to be accessible through the windows, applying a coating of one or more lumiphoric materials to exposed surfaces of the one or more solid state emitter chips, and removing the stencil. Dimensions of the stencil (including window placement and dimensions, stencil thickness, and the like) may be used to control the areas of one or more solid state emitter chips receiving lumiphoric material. In certain embodiments, a first stencil layer with windows providing access to one or more ESD devices may be used to permit ESD devices to be selectively coated with a light-reflective material, and a second stencil layer with windows providing access to one or more solid state emitter chips (e.g., flip chips) may be used to permit the one or more solid state emitter chips to be selectively coated with one or more lumiphoric materials.

Figure 20A:
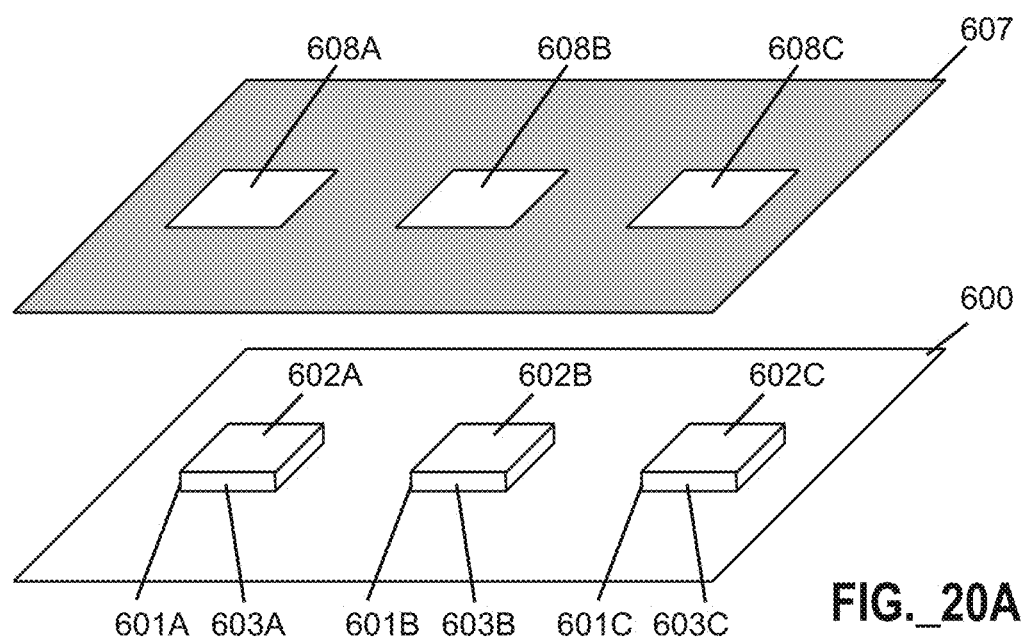
FIG. 20A is a perspective schematic assembly view of a substrate supporting three solid state light emitter chips and a stencil layer defining three windows prior to application of the stencil layer to the substrate.

FIG. 20A is a perspective schematic assembly view of a substrate 600 supporting three solid state light emitter chips 601A-601C prior to application of a stencil layer 607 over the substrate 600. The substrate 600 may include submount regions for the solid state emitter chips 601A-601C. Each solid state emitter chip 601A-601C may include a top emitting surface 602A-602C and edge emitting surfaces 603A-603C. The stencil layer 607 defines windows 608A-608C arranged to be registered with the solid state emitter chips 601A-601C.

Figure 20B:
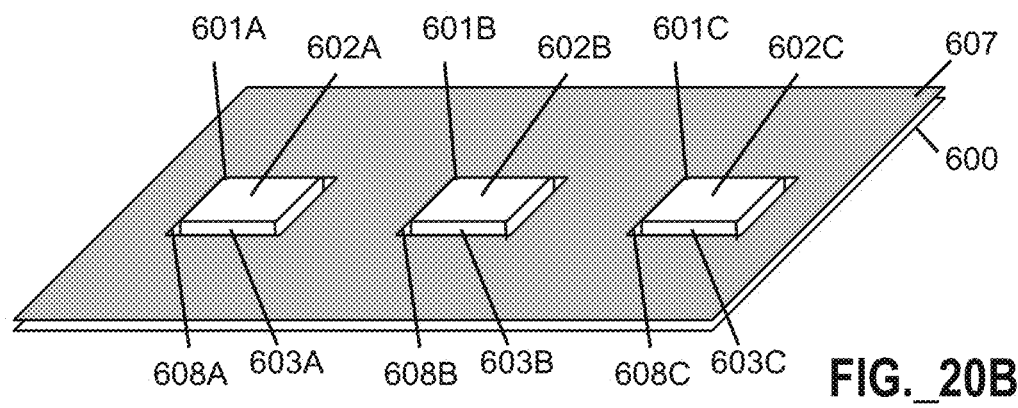
FIG. 20B is a perspective schematic view of the substrate and stencil layer of FIG. 20A following application of the stencil layer to the substrate with the windows being registered with the solid state light emitter chips.

FIG. 20B is a perspective schematic view of the substrate 600, emitter chips 601A-601C, and stencil layer 607 of FIG. 20A following application of the stencil layer 607 to the substrate 600 with the windows 608A-608C being registered with the solid state light emitter chips 601A-601C. As shown in FIG. 20B, in certain embodiments the windows 608A-608C may be slightly larger than the solid state light emitter chips 601A-601C to expose not only the top emitting surface 602A-602C but also the edge emitting surfaces 603A-603C of the solid state light emitter chips 601A-601C to receive a coating of lumiphoric material. In certain embodiments, each window 608A-608C may have an edge length that is from 10 percent to 30 percent larger than an edge length of a corresponding solid state emitter chip 601A-601C.

Figure 20C:
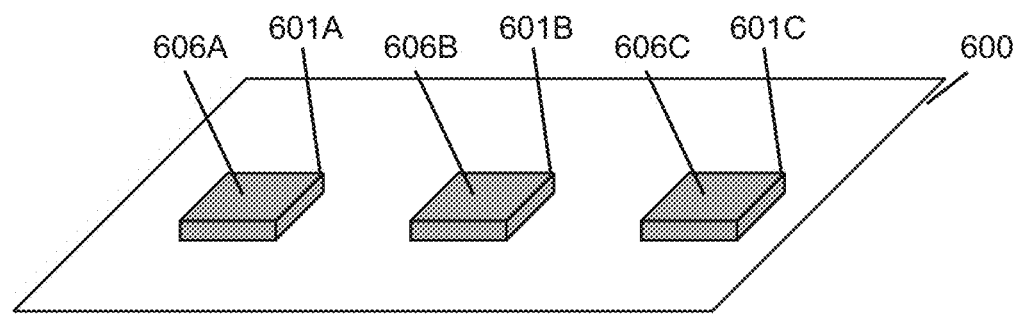
FIG. 20C is a perspective schematic view of the substrate and solid state light emitter chips of FIG. 20B following application of a lumiphoric material to emitting surfaces of the solid state light emitter chips and following removal of the stencil layer.

FIG. 20C is a perspective schematic view of the substrate 600 and solid state light emitter chips 601A-601C of FIG. 20B following application of a lumiphoric material 606A-606C to emitting surfaces (e.g., top emitting surfaces 602A-602C and edge emitting surfaces 603A-603C) of the solid state emitter chips 601A-601C, and following removal of the stencil layer 607 shown in FIG. 20B.

FIG. 21A is a top view photograph of nine interconnected light emitting devices each including a solid state light emitter flip chip 611 supported by a substrate 610, following application of a lumiphoric material 616 through a stencil window to emitting surfaces of the solid state light emitter flip chip 611, with the majority of each substrate 610 being devoid of lumiphoric material. Narrowed tab portions 618 of the substrate 610 are arranged to permit the nine light emitting devices to be cut and separated from one another if desired. The substrate 610 may be coated with a diffuse reflective material such as titanium dioxide. FIG. 21B is a magnified view of one lumiphoric material-coated solid state light emitter flip chip 611 over the substrate 610 of FIG. 21A.

In certain embodiments, a method for producing at least one lumiphor-converted solid state emitter chip comprises: positioning a stencil over a substrate supporting at least one solid state emitter chip that comprises at least one light emitting surface, the stencil comprising at least one window registered with the at least one solid state emitter chip to expose the at least one light emitting surface; and applying at least one lumiphoric material over the exposed at least one light emitting surface of the at least one solid state emitter chip, while presence of the stencil prevents at least a portion of the substrate from receiving the at least one lumiphoric material. In certain embodiments, the at least one light emitting surface comprises a top emitting surface and at least one edge emitting surface arranged along a perimeter of the top emitting surface, and wherein the exposed at least one light emitting surface comprises the top emitting surface and at least a portion of the at least one edge emitting surface. In certain embodiments, the method further includes removing the stencil from the substrate. In certain embodiments, the at least one solid state emitter chip comprises a plurality of solid state emitter chips, and the method further comprises dividing the substrate into a plurality of sections each including at least one solid state emitter chip of the plurality of solid state emitter chips. In certain embodiments, the at least one solid state emitter chip comprises a plurality of solid state emitter chips, and the at least one window comprises a plurality of windows. In certain embodiments, the solid state emitter chip comprises a flip chip, as disclosed herein.

In certain embodiments, solid state light emitter chips may be spray coated prior to placement on a submount. In certain embodiments, solid state light emitter chips may be arranged in an array on releasable tape and spray coated (e.g., using an angled spray technique disclosed herein) with a coating composition including one or more lumiphoric materials. In certain embodiments, the releasable tape may include a releasable adhesive with adhesion properties that are diminished following exposure to energy (e.g., ultraviolet or other radiation, thermal energy, etc.). Following spray coating, the releasable tape may be exposed to energy to reduce adhesion of the releasable adhesive material, and the coated solid state emitter chips may be removed from the tape and placed as desired on one or more submounts or other support structures. In certain embodiments, automated (e.g., robotic) pick-and-place equipment may be used to selectively remove coated solid state emitter chips from a releasable tape, and to place such chips on submounts of solid state emitter devices. In this manner, solid state emitter chips may be coated with one or more lumiphoric materials without causing lumiphoric material to be coated on a submount, thereby eliminating poor far field characteristics that would result if an entire submount surface was covered with lumiphoric material.

FIG. 22A is a perspective view schematic illustration of an assembly of six solid state light emitter flip chips 701 supported by a releasable tape 700 prior to spray coating with a lumiphoric material (e.g., using an angled spray nozzle 709). Each flip chip 701 includes a top emitting surface 702 and edge emitting surfaces 703. FIG. 22B is a perspective view schematic illustration of the assembly of FIG. 22A following coating of the solid state light emitter flip chips 701 and the releasable tape 700 with lumiphoric material 706, with the releasable tape 700 being arranged proximate to an energy source 711. The energy source 711 may be used to supply energy to the releasable tape 700 to reduce adhesion of the adhesive material, and thereafter permit coated solid state light emitter flip chips 701 to be removed. FIG. 22C is a perspective view schematic illustration of the assembly of FIG. 22B following application of energy to reduce adhesion of the releasable tape 700, and following removal of a single lumiphoric material-coated solid state light emitter flip chip 701. The coated flip chip 701 includes lumiphoric material 706 on the top emitting surface 702 as well as the edge emitting surfaces 703. The coated flip chip 701 of FIG. 22C may be removed and placed on a submount of a solid state emitter device with pick-and-place equipment or other suitable means.

FIG. 23A is a top view photograph of an assembly of sixteen solid state light emitter flip chips supported by a releasable tape following angled spray coating with a lumiphoric material. Each coated flip chip is elevated relative to the releasable tape. FIG. 23B is a magnified perspective view photograph of a portion of the assembly of FIG. 23A, showing that top and edge emitting surfaces of the flip chips are fully coated with lumiphoric material.

FIG. 23C is a top view photograph of a layer of lumiphoric material-coated releasable tape following removal of sixteen lumiphoric material-coated solid state light emitter flip chips, thereby exposing sixteen square regions of the releasable tape.

FIG. 23D is a side perspective view photograph of a lumiphoric material-coated solid state light emitter flip chip following removal of the chip from a layer of releasable tape. FIG. 23D shows that top and edge emitting surfaces of the flip chip are fully coated with lumiphoric material.

FIG. 24A is a top view photograph of multiple interconnected light emitting devices each including a lumiphoric material-coated solid state light emitter flip chip placed on a submount. Prior to placement on the submount, each flip chip was coated via a releasable tape coating method as described above in connection with FIGS. 22A-22C. As shown in FIG. 24A, the submount is free of lumiphoric material except the lumiphoric material coating present on each flip chip. FIG. 24B is a magnified top view photograph of a portion of a single light emitting device of FIG. 24A. FIG. 24C is a magnified perspective photograph view of a portion of a single light emitting device of FIG. 24A.

In certain embodiments, a method for producing at least one lumiphor-converted solid state light emitting device comprises: arranging a plurality of solid state emitter chips on a releasable adhesive material; coating the plurality of solid state emitter chips with at least one lumiphoric material; applying energy to the releasable adhesive material to reduce adhesion of the releasable adhesive material; and removing the coated plurality of solid state emitter chips from the releasable adhesive material. In certain embodiments, each solid state emitter chip of the plurality of solid state emitter chips comprises a flip chip. In certain embodiments, a coating step comprises use of at least one spray nozzle for spraying a coating composition including the at least one lumiphoric material over the plurality of solid state emitter chips. In certain embodiments, the spraying of the coating composition comprises spraying the coating composition in at least one direction non-perpendicular to a top emitting surface of each solid state emitter chip of the plurality of solid state emitter chips. In certain embodiments, a removing step comprises individually picking each coated solid state emitter chip of the plurality of solid state emitter chips from the releasable adhesive material, and placing each coated solid state emitter chip on at least one substrate or submount. In certain embodiments, the plurality of solid state emitter chips include a plurality of flip chips, as disclosed herein.

In certain embodiments, presence of a flip chip that is significantly elevated relative to a submount that includes a reflective material coating (e.g., titanium dioxide) may reduce or minimize the possibility that the reflective material coating may otherwise be arranged over (and reflect emissions of) the at least one edge emitting surface of the flip chip. FIG. 25A is a side cross-sectional schematic view of a portion of a light emitting device including a solid state light emitter flip chip 801 including bottom contacts 813, 814 mounted with solder material regions 815, 816 to a submount 800 at a conventional height (e.g., with a vertical distance of about 10 microns separating the edge emitting surfaces 803 (or bottom semiconductor layer 808) of the flip chip 801 and an upper surface of the submount 800). In certain embodiments, the top and edge emitting surfaces 802, 803 may be coated with one or more lumiphoric materials (not shown). A diffusely reflective layer 807 is disposed over the submount 800 and arranged in contact with edge emitting surfaces 803 of the flip chip 801. When the reflective layer 807 contacts the edge emitting surfaces 803, the reflective layer 807 tends to detrimentally reflect emissions back into the flip chip 801, thereby reducing luminous flux of the flip chip 801. When titanium dioxide material contacts edge emitting surfaces of a flip chip, the inventors have observed a luminous flux drop in a range of from 2 to 3.6 percent.

A preferred arrangement intended to reduce or eliminate luminous flux loss includes a flip chip that is significantly elevated relative to a submount, as illustrated in FIG. 25B. FIG. 25B is a side cross-sectional schematic view of a portion of another light emitting device including a solid state light emitter flip chip 821 including bottom contacts 833, 834 mounted with solder material regions 835, 836 to a submount 820 at a conventional height (e.g., with at least about 15 microns, at least about 20 microns, at least about 25 microns, at least about 30 microns, or another threshold distance specified herein separating the edge emitting surfaces 823 (or bottom semiconductor layer 828) of the flip chip 821 and an upper surface of the submount 820). In certain embodiments, any one or more of the preceding minimum heights may be bounded by an upper limit of no greater than about 70 microns, no greater than about 60 microns, no greater than about 50 microns, greater than about 40 microns, or no greater than about 30 microns. In certain embodiments, the top and edge emitting surfaces 822, 823 may be coated with one or more lumiphoric materials (not shown). A diffusely reflective layer 827 is disposed over the submount 820, but does not contact edge emitting surfaces 823 of the flip chip 821 due to elevation of the flip chip 821 relative to the submount 820. In certain embodiments, elevation of the flip chip 821 may be accomplished by increasing thickness of the contacts 833, 834, by increasing thickness of the solder material regions 835, 836, or by increasing thickness of both the contacts 833, 834 and the solder material regions 835, 836. Elevating a solid state emitter chip relative to a submount (e.g., using an increased thickness of solder material) runs counter to conventional practice, since it may inhibit heat transfer, lead to cracking, and/or lead to difficulties in leveling the solid state emitter chip relative to the submount. For this reason an upper threshold of about 70 microns for the separation distance is proposed for certain embodiments. To reduce the possibility of cracking, in certain embodiments the solder material (e.g., solder paste or solder flux) may comprise gold tin solder paste.

In certain embodiments incorporating an elevated solid state emitter chip, a solid state light emitting device comprises a submount comprising a floor and multiple electrical contact regions; a diffusely reflective material arranged over at least a portion of the submount; at least one flip chip light emitting diode including a p-electrode, an n-electrode, a top emitting surface, and at least one edge emitting surface arranged along a perimeter of the top emitting surface; and solder material arranged to establish contact between the p-electrode and at least one first contact region of the multiple electric contact regions, and arranged to establish contact between the n-electrode and at least one second contact region of the multiple electric contact regions; wherein the at least one edge emitting surface is elevated above the floor of the submount by a height of at least about 15 microns, at least about 20 microns, at least about 25 microns, or at least about 30 microns. In certain embodiments, any one or more of the preceding minimum heights may be bounded by an upper limit of no greater than about 70 microns, no greater than about 60 microns, no greater than about 50 microns, no greater than about 40 microns, or no greater than about 30 microns. Presence of a flip chip that is significantly elevated relative to a submount that includes a reflective material coating may reduce or minimize the possibility that the reflective material coating may otherwise be arranged over (and reflect emissions of) the at least one edge emitting surface of the flip chip. In certain embodiments, at least one lumiphoric material is arranged on the top emitting surface and the at least one edge emitting surface. In certain embodiments, the solder material comprises solder flux or solder paste (e.g., gold tin solder paste). In certain embodiments, a light-transmissive fillet material may be arranged to form a fillet contacting the at least one edge emitting surface and contacting either the floor or the diffusely reflective material. In certain embodiments, the fillet comprises a maximum height proximate to the at least one edge emitting surface, the fillet comprises a minimum height distal from the at least one edge emitting surface, and the maximum height is no higher than a level of the top emitting surface. In certain embodiments, the fillet material comprises silicone and/or at least one lumiphoric material. In certain embodiments, the diffusely reflective material comprises titanium dioxide.

In certain embodiments, an elevated solid state light emitter chip as disclosed herein may be supplemented with a lumiphoric material-containing peripheral fillet as disclosed herein, to reduce the possibility of unconverted light being emitted along a lower lateral perimeter of a flip chip.

Although certain embodiments described previously herein refer to the desirability of avoiding contact between reflective material and edge emitting surfaces of solid state emitter flip chips in order to extract maximum lumens, in other embodiments it may be desirable to position reflective material along or against edge emitting surfaces of solid state emitter flip chips (or against lumiphoric materials overlying edge emitting surfaces of solid state emitter flip chips) to provide desirable beam characteristics. Deciding whether to position reflective material against or along edge emitting surfaces of a solid state emitter flip chip represents a trade-off between increasing light extraction and decreasing the potential need for secondary optics. Edge emitting surfaces may be responsible for emitting around 2-3% of total lumens, whereas the majority of lumens of a solid state light emitter flip chip are emitted from a primary (e.g., top)

emitting surface. Since the majority of light generated by a solid state light emitter flip chip is emitted from a primary (e.g., top) emitting surface, it is desirable to avoid obstruction of a primary (top) emitting surface with reflective material.

One method for providing reflective material (such as titanium dioxide) against or adjacent to side surfaces of one or more solid state light emitter flip chips involves dispensing a liquid that contains reflective material, and allowing the material to wick around the flip chip(s). In certain instances, particularly when lumiphoric material is coated on surfaces of a flip chip, reflective material may tend to undesirably wick onto a primary (top) emitting surface. To avoid this possibility, in certain embodiments, a wicking prevention material may be arranged over a top surface of at least a portion of a lumiphoric material layer overlying the top emitting surface of a solid state light emitter flip chip. In certain embodiments, a wicking prevention material is applied as a droplet that may be at least partially cured via thermal means. In certain embodiments, a wicking prevention material comprises a light-transmissive binder such as silicone preferably containing fused silica (e.g., 10 micron glass beads). In certain embodiments, a wicking prevention material includes silicone and fused silica present with a weight percent ratio of from 2:1 to 1:1 to provide good control of droplet shape and location of the wicking prevention material. Although glass beads (fused silica) may tend to scatter light, glass beads with a similar refractive index tend to generate primarily small angle scattering, which tends to mix transmitted light emissions without significant attenuation of transmission. In certain embodiments, a low concentration of additional scattering material (e.g., fumed silica or titanium dioxide) may also be present in the wicking prevention material, but preferably not at a high enough concentration to significantly attenuate light transmission.

FIG. 26 is a side cross-sectional schematic illustration of a solid state light emitter flip chip 841 including a top emitting surface 842 and edge emitting surfaces 843, wherein the top emitting surface 842 and the edge emitting surfaces 843 are covered with a top portion 846A and side portions 846B, respectively, of a lumiphoric material layer 846 deposited by top spraying (i.e., spraying from a nozzle oriented perpendicular to the top emitting surface 842). Since the lumiphoric material layer 846 was deposited by top spraying, the side portions 846B are thinner than the top portion 846A. A drop of wicking prevention material 849 is arranged over the top portion 846A of the lumiphoric material layer 846, and a layer of reflective material 847 is arranged in contact with the side portions 846B of the lumiphoric material layer 846. Presence of the wicking prevention material 849 prevents the layer of reflective material 847 from wicking over the top portion 846A of the lumiphoric material layer 846.

FIG. 27 is a side cross-sectional schematic illustration of a solid state light emitter flip chip 851 including a top emitting surface 852 and edge emitting surfaces 853, wherein the top emitting surface 852 and the edge emitting surfaces 853 are covered with a top portion 856A and side portions 856B, respectively, of a lumiphoric material layer 856 deposited by both top (perpendicular) spraying and angled (non-perpendicular) spraying. Due the use of both top (perpendicular) spraying and angled (non-perpendicular) spraying, the side portions 856B and top portion 856A may have substantially the same thickness. A drop of wicking prevention material 859 is arranged over the top portion 856A of the lumiphoric material layer 856, and a layer of reflective material 857 is arranged in contact with the side portions 856B of the lumiphoric material layer 856. Presence of the wicking prevention material 859 prevents the layer of reflective material 857 from wicking over the top portion 856A of the lumiphoric material layer 856.

FIG. 28 is a side cross-sectional schematic illustration of a solid state light emitter flip chip 861 including a top emitting surface 862 and edge emitting surfaces 863, wherein the top emitting surface 862 and the edge emitting surfaces 863 are covered with a top portion 866A and side portions 866B, respectively, of a lumiphoric material layer 866 deposited by both top (perpendicular) spraying and angled (non-perpendicular) spraying. A light-transmissive fillet material 865 containing a lumiphoric material is arranged in contact with side portions 866B of the lumiphoric material layer 866, and a layer of reflective material 867 is arranged in contact with portions of the fillet material 865. The fillet material 865 is preferably smooth in character, and not conducive to wicking by the reflective material 867, which may be arranged over a substrate or submount (not shown) supporting the solid state light emitter flip chip 861.

FIG. 29 is substantially the same as FIG. 28, but without a layer of reflective material. FIG. 29 is a side cross-sectional schematic illustration of a solid state light emitter flip chip 871 including a top emitting surface 872 and edge emitting surfaces 873, wherein the top emitting surface 872 and the edge emitting surfaces 873 are covered with a top portion 876A and side portions 876B, respectively, of a lumiphoric material layer 876 deposited by both top (perpendicular) spraying and angled (non-perpendicular) spraying. A light-transmissive fillet material 875 containing a lumiphoric material is arranged in contact with side portions 876B of the lumiphoric material layer 876, FIG. 30 is a side cross-sectional schematic illustration of a solid state light emitter flip chip 881 arranged to be supported by a substrate or submount (not shown), with the flip chip 881 including a top emitting surface 882 and edge emitting surfaces 883. A fillet-shaped layer of reflective material 885 is arranged in contact with the edge emitting surfaces 883. Presence of the fillet-shaped layer of reflective material 885 enables a lumiphoric material layer 886 (including a top portion 886A and angled side portions 886B) to be deposited by top (perpendicular) spraying over the top emitting surface 882 and the fillet-shaped layer of reflective material 885, without concern of lack of uniformity of the angled side portions 886B of the lumiphoric material layer 886. The fillet-shaped layer of reflective material 885 along the edge emitting surfaces 883 prevents potential disparities in light conversion and concomitant differences in light color that might otherwise be presented in the absence of the reflective material 885.

FIG. 31 is a side cross-sectional schematic illustration of a solid state light emitter flip chip 891 arranged to be supported by a substrate or submount (not shown). The flip chip 891 includes a top emitting surface 892 and edge emitting surfaces 893 that are covered with a top portion 896A and side portions 896B, respectively, of a lumiphoric material layer 896 deposited by both top (perpendicular) spraying and angled (non-perpendicular) spraying. A base portion 896C of the lumiphoric material layer 896 is arranged to cover a substrate or submount supporting the flip chip 891. A drop of wicking prevention material 899 is arranged over the top portion 896A of the lumiphoric material layer 896, and a layer of reflective material 897 is arranged in contact with the side portions 896B of the lumiphoric material layer 896. Presence of the wicking prevention material 899 prevents the layer of reflective material 897 from wicking over the top portion 896A of the lumiphoric material layer 896.

FIG. 32 is a side cross-sectional schematic illustration of a solid state light emitter flip chip 901 arranged to be supported by a substrate or submount (not shown). The flip chip 901 includes a top emitting surface 902 and edge emitting surfaces 903 that are covered with a top portion 906A and side portions 906B, respectively, of a lumiphoric material layer 906 deposited by both top (perpendicular) spraying and angled (non-perpendicular) spraying. A base portion 906C of the lumiphoric material layer 906 is arranged to cover a substrate or submount supporting the flip chip 901. A layer of reflective material 907 is disposed over base portions 906C of the lumiphoric material 906 separated from side portions 906B of the lumiphoric material layer 906.

FIG. 33 is a side cross-sectional schematic illustration of a solid state light emitter flip chip 911 arranged to be supported by a substrate or submount (not shown), with the flip chip 911 including a top emitting surface 912 and edge emitting surfaces 913. A fillet-shaped layer of reflective material 915 is arranged in contact with the edge emitting surfaces 913. A lumiphoric material layer 916 is deposited by top (perpendicular) spraying, yielding a top portion 916A over the top emitting surface 912, yielding side portion 916B over the fillet-shaped layer of reflective material 915, and yielding a base portion 916C over the substrate or submount. A drop of wicking prevention material 919 is arranged over the top portion 916A of the lumiphoric material layer 916, and a layer of reflective material 917 is arranged in contact with the side portions 916B of the lumiphoric material layer 916. Presence of the wicking prevention material 919 prevents the layer of reflective material 917 from wicking over the top portion 916A of the lumiphoric material layer 916.

Embodiments disclosed herein may provide one or more of the following beneficial technical effects: reduced optical losses in flip chip LEDs (which may be particularly pronounced and/or beneficial with large die sizes and/or when generating warm white light); reduced fabrication cost in producing flip chip LEDs; reduced cycle times in producing flip chip LEDs; attainment of similar illumination performance with lower cost production methods; improved mechanical reliability of flip chip LEDs; simplified device fabrication; reduced leakage of unconverted emissions from lumiphor-coated LEDs; and reduced wicking of reflective material over top lumiphor layer portions overlying emitting surfaces of flip chip LEDs.

Those skilled in the art will recognize improvements and modifications to the preferred embodiments of the present disclosure. All such improvements and modifications are considered within the scope of the concepts disclosed herein and the claims that follow.

What is claimed is:

1. A light emitting device comprising a flip chip light emitting diode, the flip chip light emitting diode comprising:
    a plurality of semiconductor layers including a first semiconductor layer comprising doping of a first type and a second semiconductor layer comprising doping of a second type, wherein a light emitting active region is arranged between the first semiconductor layer and the second semiconductor layer;
    a multi-layer reflector arranged proximate to the plurality of semiconductor layers, the multi-layer reflector comprising a metal reflector layer and a dielectric reflector layer, wherein the dielectric reflector layer is arranged between the metal reflector layer and the plurality of semiconductor layers;
    a passivation layer arranged between the metal reflector layer and (i) a first electrical contact and (ii) a second electrical contact, wherein the first electrical contact is arranged in conductive electrical communication with the first semiconductor layer, and the second electrical contact is arranged in conductive electrical communication with the second semiconductor layer; and
    an adhesion layer between the metal reflector layer and the dielectric reflector layer;
    wherein the plurality of semiconductor layers forms a mesa; a peripheral portion of each of the first semiconductor layer, the light emitting active region, and the second semiconductor layer forms a sidewall of at least one recess laterally bounding the mesa; the mesa has a major surface bounded by the sidewall; the multi-layer reflector is arranged over at least 90% of the major surface of the mesa and is arranged between the mesa and the passivation layer; and the at least one recess comprises a peripheral portion of the dielectric reflector layer that bounds respective peripheral portions of the second semiconductor layer, the light emitting active region, and a segment of the first semiconductor layer.

2. The light emitting device of claim 1, further comprising:
    a first array of conductive microcontacts extending through the passivation layer and providing electrical communication between the first electrical contact and the first semiconductor layer; and
    at least one conductive path providing electrical communication between the second electrical contact and the second semiconductor layer.

3. The light emitting device of claim 2, wherein the at least one conductive path providing electrical communication between the second electrical contact and the second semiconductor layer comprises a second array of conductive microcontacts extending through the passivation layer.

4. The light emitting device of claim 1, wherein the dielectric reflector layer comprises at least one plurality of conductive vias extending through the dielectric reflector layer and arranged in contact with at least one of the first semiconductor layer and the second semiconductor layer.

5. The light emitting device of claim 1, further comprising a light-transmissive substrate that comprises sapphire, silicon carbide, silicon, or a Group III-nitride material.

6. The light emitting device of claim 5, wherein the light-transmissive substrate comprises a patterned surface including at least one of (a) a plurality of recessed features or (b) a plurality of raised features, wherein the first semiconductor layer is deposited on the patterned surface.

7. The light emitting device of claim 1, wherein the dielectric reflector layer is arranged on the second semiconductor layer.

8. The light emitting device of claim 5, wherein portions of each of the metal reflector layer and the passivation layer extend into the at least one recess.

9. The light emitting device of claim 1, wherein at least one portion of the passivation layer peripherally surrounds and prevents exposure of the multi-layer reflector.

10. The light emitting device of claim 3, further comprising a barrier layer arranged between the metal reflector layer and the passivation layer, wherein at least one of the first array and the second array of conductive microcontacts extends through the barrier layer.

11. The light emitting device of claim 10, further comprising a metal-containing interlayer arranged within the passivation layer between the barrier layer and (i) the first electrical contact and (ii) the second electrical contact.

12. The light emitting device of claim 1, comprising at least one of the following features (a) to (c): (a) the dielectric reflector layer comprises silicon dioxide; (b) the metal reflector layer comprises silver; and (c) the passivation layer comprises silicon nitride.

13. The light emitting device of claim 1, wherein the first semiconductor layer comprises an n-type material and the second semiconductor layer comprises a p-type material.

14. The light emitting device of claim 1, wherein the adhesion layer comprises a metal oxide.

15. The light emitting device of claim 1, wherein the adhesion layer comprises aluminum oxide.

16. A light emitting device comprising a flip chip light emitting diode, the flip chip light emitting diode comprising:
- a light-transmissive substrate comprising a patterned surface including at least one of (a) a plurality of recessed features and (b) a plurality of raised features;
- a plurality of semiconductor layers adjacent to the patterned surface, the plurality of semiconductor layers including a first semiconductor layer comprising doping of a first type and a second semiconductor layer comprising doping of a second type, wherein a light emitting active region is arranged between the first semiconductor layer and the second semiconductor layer;
- a dielectric reflector layer adjacent to the second semiconductor layer, the dielectric reflector layer comprising at least one plurality of conductive vias extending through the dielectric reflector layer and arranged in contact with at least one of the first semiconductor layer and the second semiconductor layer;
- a metal reflector layer arranged on the dielectric reflector layer and arranged in contact with the at least one plurality of conductive vias;
- a passivation layer arranged between the metal reflector layer and (i) a first electrical contact and (ii) a second electrical contact;
- a first array of conductive microcontacts extending through the passivation layer and providing electrical communication between the first electrical contact and the first semiconductor layer;
- at least one conductive path providing electrical communication between the second electrical contact and the second semiconductor layer;
- a barrier layer comprising a plurality of metals arranged between the metal reflector layer and the passivation layer; and
- a metal-containing interlayer arranged within the passivation layer between the barrier layer and (i) the first electrical contact and (ii) the second electrical contact.

17. The light emitting device of claim 16, wherein the at least one conductive path providing electrical communication between the second electrical contact and the second semiconductor layer comprises a second array of conductive microcontacts extending through the passivation layer; and wherein at least one of the first array of conductive microcontacts or the second array of conductive microcontacts extends through the barrier layer.

18. The light emitting device of claim 16, wherein the light-transmissive substrate comprises sapphire.

19. The light emitting device of claim 16, wherein the first semiconductor layer is deposited on the patterned surface.

20. The light emitting device of claim 16, wherein the dielectric reflector layer is arranged on the second semiconductor layer.

21. The light emitting device of claim 16, wherein a central portion of the plurality of semiconductor layers forms a mesa extending in a direction away from the light-transmissive substrate, a peripheral portion of the plurality of semiconductor layers forms at least one recess laterally bounding the mesa, and portions of each of the dielectric reflector layer, the metal reflector layer, and the passivation layer extend into the at least one recess.

22. The light emitting device of claim 21, wherein at least one portion of the passivation layer peripherally surrounds and prevents exposure of each of the dielectric reflector layer and the metal reflector layer.

23. The light emitting device of claim 16, wherein the metal-containing interlayer comprises aluminum.

24. The light emitting device of claim 16, comprising at least one of the following features (a) to (c): (a) the dielectric reflector layer comprises silicon dioxide; (b) the metal reflector layer comprises silver; and (c) the passivation layer comprises silicon nitride.

25. The light emitting device of claim 16, wherein the first semiconductor layer comprises an n-type material and the second semiconductor layer comprises a p-type material.

26. The light emitting device of claim 16, further comprising an adhesion layer between the metal reflector layer and the dielectric reflector layer.

27. The light emitting device of claim 26, wherein the adhesion layer comprises a metal oxide.

28. The light emitting device of claim 26, wherein the adhesion layer comprises aluminum oxide.

29. The light emitting device of claim 18, wherein the barrier layer comprises (i) a sputtered titanium-containing layer, and (ii) an evaporated gold-containing layer.

30. A light emitting device comprising a flip chip light emitting diode, the flip chip light emitting diode comprising:
- a plurality of semiconductor layers including a first semiconductor layer comprising doping of a first type and a second semiconductor layer comprising doping of a second type, wherein a light emitting active region is arranged between the first semiconductor layer and the second semiconductor layer;
- a multi-layer reflector arranged proximate to the plurality of semiconductor layers, the multi-layer reflector comprising a metal reflector layer and a dielectric reflector layer, wherein the dielectric reflector layer is arranged between the metal reflector layer and the plurality of semiconductor layers;
- a passivation layer arranged between the metal reflector layer and (i) a first electrical contact and (ii) a second electrical contact, wherein the first electrical contact is arranged in conductive electrical communication with the first semiconductor layer, and the second electrical contact is arranged in conductive electrical communication with the second semiconductor layer;
- a first array of conductive microcontacts extending through the passivation layer and providing electrical communication between the first electrical contact and the first semiconductor layer;
- a second array of conductive microcontacts extending through the passivation layer and providing electrical communication between the second electrical contact and the second semiconductor layer; and
- a barrier layer comprising a plurality of metals arranged between the metal reflector layer and the passivation layer, wherein at least one of the first array and the second array of conductive microcontacts extends through the barrier layer;

wherein the plurality of semiconductor layers forms a mesa; a peripheral portion of each of the first semiconductor layer, the light emitting active region, and the second semiconductor layer forms a sidewall of at least one recess laterally bounding the mesa; the mesa has a major surface bounded by the sidewall; and the multi-layer reflector is arranged over at least 90% of the major surface of the mesa and is arranged between the mesa and the passivation layer.

31. The light emitting device of claim 30, further comprising a metal-containing interlayer arranged within the passivation layer between the barrier layer and (i) the first electrical contact and (ii) the second electrical contact.

32. The light emitting device of claim 30, wherein the barrier layer comprises (i) a sputtered titanium-containing layer, and (ii) an evaporated gold-containing layer.

33. The light emitting device of claim 31, wherein the metal-containing interlayer comprises aluminum.

* * * * *